US008024676B2

(12) United States Patent
Carcasi et al.

(10) Patent No.: US 8,024,676 B2
(45) Date of Patent: Sep. 20, 2011

(54) MULTI-PITCH SCATTEROMETRY TARGETS

(75) Inventors: Michael A. Carcasi, Austin, TX (US); David Dixon, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 12/371,193

(22) Filed: Feb. 13, 2009

(65) Prior Publication Data

US 2010/0209830 A1 Aug. 19, 2010

(51) Int. Cl.
*G06F 17/50* (2006.01)
*G06F 19/00* (2006.01)
*G21K 5/00* (2006.01)
*G03F 1/00* (2006.01)
*H01L 21/00* (2006.01)

(52) U.S. Cl. .................. 716/54; 716/52; 716/55; 430/5; 378/35; 438/7; 438/16; 700/108; 700/121

(58) Field of Classification Search .................... 716/52, 716/54, 55; 430/4, 5; 378/34, 35; 700/108, 700/121; 438/7, 16
See application file for complete search history.

(56) References Cited

U.S. PATENT DOCUMENTS

| | | | |
|---|---|---|---|
| 6,545,753 B2 * | 4/2003 | Subramanian et al. ..... 356/237.5 |
| 6,561,706 B2 * | 5/2003 | Singh et al. .................... 396/611 |
| 6,583,871 B1 * | 6/2003 | Rangarajan et al. ....... 356/237.5 |
| 6,594,024 B1 * | 7/2003 | Singh et al. .................... 356/630 |
| 6,602,727 B1 * | 8/2003 | Rangarajan et al. ............ 438/14 |
| 6,629,786 B1 * | 10/2003 | Rangarajan et al. .......... 396/604 |
| 6,630,361 B1 * | 10/2003 | Singh et al. ....................... 438/7 |
| 6,641,963 B1 * | 11/2003 | Rangarajan et al. ............ 430/30 |
| 6,649,426 B2 * | 11/2003 | Rangarajan et al. ............ 438/14 |
| 6,686,270 B1 * | 2/2004 | Subramanian et al. ....... 438/629 |
| 6,778,268 B1 * | 8/2004 | Singh et al. ............... 356/237.5 |
| 6,785,638 B2 | 8/2004 | Niu et al. |
| 6,828,162 B1 * | 12/2004 | Halliyal et al. ................. 438/14 |
| 6,891,626 B2 | 5/2005 | Niu et al. |
| 6,943,900 B2 | 9/2005 | Niu et al. |
| 7,052,575 B1 * | 5/2006 | Rangarajan et al. ..... 156/345.13 |
| 7,171,284 B2 | 1/2007 | Vuong et al. |
| 7,318,214 B1 * | 1/2008 | Prasad et al. .................... 716/53 |
| 7,330,279 B2 | 2/2008 | Vuong et al. |
| 2003/0000644 A1 * | 1/2003 | Subramanian et al. .. 156/345.24 |
| 2003/0000922 A1 * | 1/2003 | Subramanian et al. ......... 216/60 |
| 2003/0002878 A1 * | 1/2003 | Singh et al. .................... 396/611 |
| 2003/0153104 A1 * | 8/2003 | Rangarajan et al. ............ 438/14 |
| 2004/0267397 A1 | 12/2004 | Doddi et al. |
| 2005/0209816 A1 | 9/2005 | Vuong et al. |
| 2008/0248598 A1 * | 10/2008 | Pal et al. ............................ 438/8 |

OTHER PUBLICATIONS

Qian et al., "Advanced Physical Models for Mask Data Verification and Impacts on Physical Layout Synthesis", Fourth International Symposium on Quality Electronic Design, Mar. 24-26, 2003, pp. 125-130.*

* cited by examiner

*Primary Examiner* — Phallaka Kik

(57) ABSTRACT

The invention can provide a method of processing a substrate using multi-pitch scatterometry targets (M-PSTs) for de-convolving lithographic process parameters during Single-Patterning (S-P), Double-Patterning (D-P) procedures, and Double-Exposure (D-E) procedures used to control transistor structures. The M-PSTs) can have critical dimension (CD) and sidewall angle (SWA) sensitivity to exposure focus variations, exposure dose variations, and post exposure bake (PEB) temperature variations. In addition, the variation can be de-convolved so that the individual measurement process variable contributor can be identified.

21 Claims, 12 Drawing Sheets

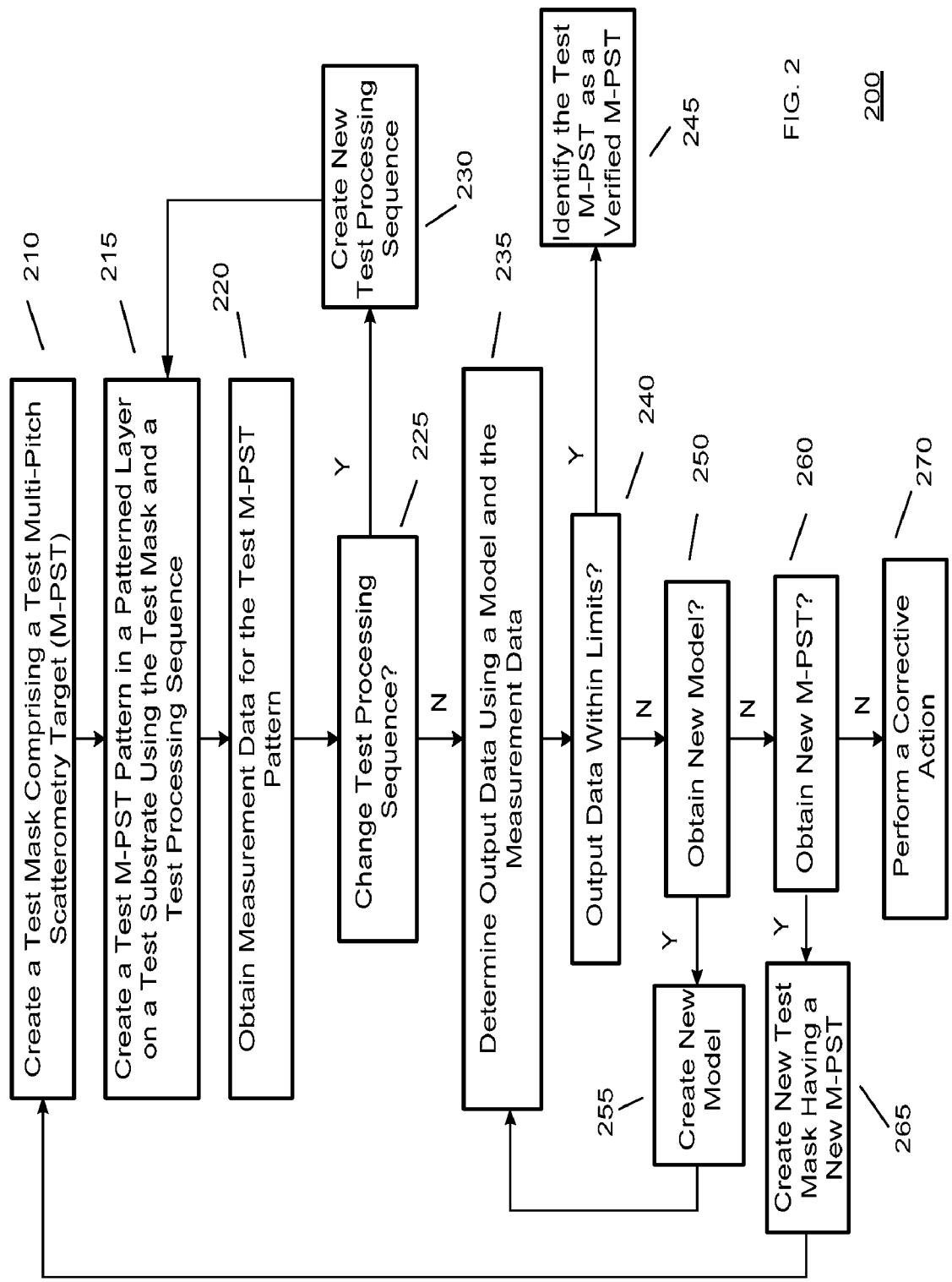

MULTI-PITCH SCATTEROMETRY TARGETS

BACKGROUND OF THE INVENTION

1. Field of the Invention

The present invention relates to substrate processing, and more particularly to improving the substrate processing by using multi-pitch scatterometry targets for de-convolving lithographic process parameters during Single-Patterning (S-P) procedures, Double-Patterning (D-P) procedures, and Double-Exposure (D-E) procedures.

2. Description of the Related Art

Many multiple patterning techniques are currently being used during semiconductor substrate processing to increase the number of features and/or structures within devices on a substrate. Multiple patterning techniques can include double exposure techniques, double patterning techniques, spacer techniques, mask techniques, and brute force techniques. In 2006, the International Technology Roadmap for Semiconductors was expanded to include double patterning as a potential solution for 32 nm (nanometer) lithography. Multiple patterning techniques are viewed by some device manufacturers as bridge solutions that can be used until Extreme Ultra-Violet (EUV) techniques become more fully developed.

As substrate geometries continue to shrink, the process window shrinks as well. The need to tightly control and understand critical dimension (CD) variations becomes more and more critical. Typically, APC control uses exposure dose alone as a single control knob for CD variation. In reality, there are other process parameters that are affecting CD, and the other process parameters can include focus and post exposure bake (PEB) temperature. Conventional metrology targets and techniques do not provide the necessary parameter sensitivity required to detect and differentiate the variation due to focus, dose, and PEB temperature

SUMMARY OF THE INVENTION

The invention can provide apparatus and methods of processing a substrate using multi-pitch scatterometry targets (M-PST) that have critical dimension (CD) and sidewall angle (SWA) sensitivity to exposure focus variations, exposure dose variations, and post exposure bake (PEB) temperature variations. In addition, the variation can be de-convolved so that the individual measurement process variable contributor can be identified. The M-PSTs can be used in Double-Patterning (D-P) procedures and Double-Exposure (D-E) procedures as well as single-patterning (S-P) procedures to control transistor structures.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 shows an exemplary flow diagram of a procedure for processing a substrate in accordance with embodiments of the invention;

DETAILED DESCRIPTION

The invention can provide apparatus and methods of processing a substrate using multi-pitch scatterometry targets (M-PSTs) that have critical dimension (CD) and sidewall angle (SWA) sensitivity to exposure focus variations, exposure dose variations, and post exposure bake (PEB) temperature variations. In addition, the CD and SWA data can be de-convolved so that the individual measurement process variable contributors can be identified. The M-PSTs can be used in Double-Patterning (D-P) processing sequences, Double-Exposure (D-E) processing sequences, or Single-Patterning (S-P) processing sequences, or any combination thereof to control transistor structures. The S-P, D-P, and/or D-E processing sequences can include one or more lithography-related procedures, one or more scanner-related procedures, one or more etch-related procedures, one or more deposition-related procedures, one or more measurement-related procedures, or one or more inspection-related procedures, or any combination thereof.

One or more M-PSTs can be provided at various sites on a substrate and CD and/or SWA data for the M-PSTs can be obtained using one or more measurement procedures. The CD and/or SWA data can be de-convolved to provide exposure focus variation data, exposure dose variation data, and Post Exposure Bake (PEB) temperature variation data. Substrates can have M-PST data associated with them, and the M-PST data can include real-time and historical data. The M-PST data can include substrate data, exposure focus data, exposure dose data, temperature data, CD data, SWA data, alignment data, overlay data, pattern data, site data, site ranking data, confidence data, and/or risk data.

As structure sizes decrease below the 65 nm node, accurate processing and/or measurement data become more important and more difficult to obtain. M-PSTs can be used to more accurately process and/or measure these ultra-small devices and structures. The data from an M-PST-related procedure can be compared with the warning and/or control limits, when a run-rule is violated, an alarm can be generated indicating a processing problem, and real-time correction procedures can be performed.

Figure 1:
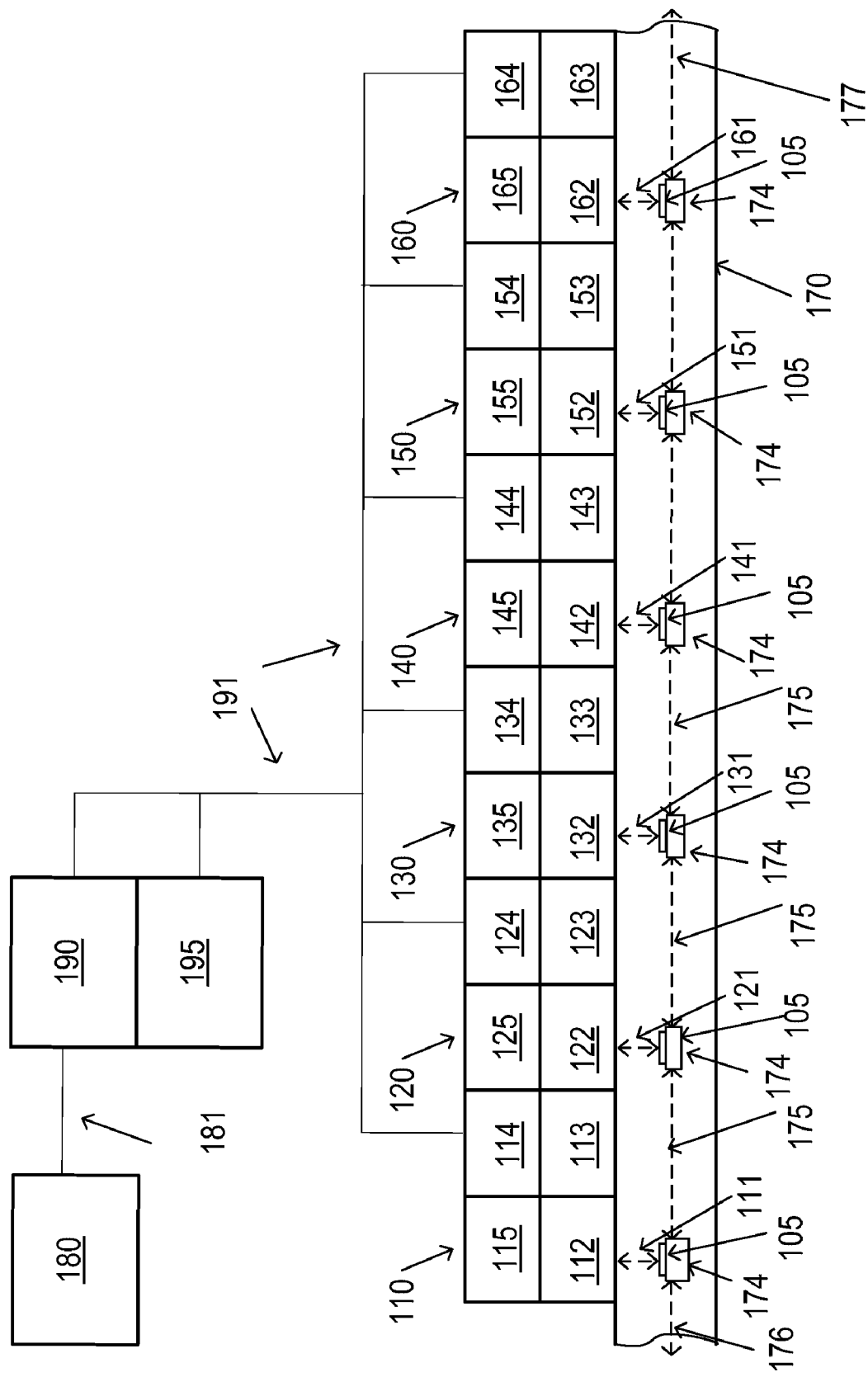
FIG. 1 shows an exemplary block diagram of a processing system in accordance with embodiments of the invention.

FIG. 1 shows an exemplary block diagram of a processing system in accordance with embodiments of the invention. In the illustrated embodiment, a processing system 100 is shown that can be used to perform M-PST related procedures, and the processing system 100 comprises a lithography subsystem 110, a scanner subsystem 120, an etch subsystem 130, a deposition subsystem 140, an inspection subsystem 150, a measurement subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used to perform one or more M-PST-related procedures.

The system controller 190 can be coupled to the lithography subsystem 110, the scanner subsystem 120, the etch subsystem 130, the deposition subsystem 140, the inspection subsystem 150, the measurement subsystem 160, and the transfer subsystem 170 using a data transfer subsystem 191. The system controller 190 can be coupled to the MES 180 using the data transfer subsystem 181. Alternatively, other configurations may be used. In some examples, the etch subsystem 130, the deposition subsystem 140, the measurement subsystem 160, and a portion of the transfer subsystem 170 can be part of a TACTRAS™ System available from Tokyo Electron Limited. In other examples, the lithography subsystem 110, the measurement subsystem 160, and a portion of the transfer subsystem 170 can be part of a LITHIUS™ System or a LITHIUS Pro System available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled to the transfer subsystem 170. The transfer subsystem 170 can be coupled to the lithography subsystem 110, and one or more substrates 105 can be transferred between the transfer subsystem 170 and the lithography subsystem 110 in real time using the transfer elements 111. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

In some embodiments, the lithography subsystem 110 can perform M-PST related procedures, such as coating procedures, thermal procedures, measurement procedures, inspection procedures, alignment procedures, and/or storage procedures on one or more substrates. For example, one or more lithography-related processes can be used to deposit one or more masking layers that can include photoresist material, and/or anti-reflective coating (ARC) material, and can be used to thermally process (bake) one or more of the masking layers. In addition, lithography subsystem 110 can be used to measure and/or inspect one or more of the masking layers and/or substrates. For example, the lithography 110 and a portion of the transfer subsystem 170 can be part of a Lithius System or a LITHIUS Pro System available from Tokyo Electron Limited.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled to the transfer subsystem 170. The transfer subsystem 170 can be coupled to the scanner subsystem 120, and one or more substrates 105 can be transferred between the transfer subsystem 170 and the scanner subsystem 120 in real time using transfer elements 121. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to one or more of the processing elements 123, and/or to one or more of the evaluation elements 125.

In some embodiments, the scanner subsystem 120 can perform M-PST related procedures, such as wet and/or dry exposure procedures, and in other cases, the scanner subsystem 120 can be used to perform extreme ultraviolet (EUV) exposure procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled to the transfer subsystem 170. The transfer subsystem 170 can be coupled to the etch subsystem 130, and one or more substrates 105 can be transferred between the transfer subsystem 170 and the etch subsystem 130 in real time using transfer elements 131. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, and cleaning procedures, or plasma or non-plasma trimming procedures. Evaluation procedures and/or inspection procedures can be used to measure and/or inspect one or more surfaces and/or layers of the substrates.

In some embodiments, the deposition subsystem 140 can perform M-PST related procedures, such as physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled to the transfer subsystem 170. The transfer subsystem 170 can be coupled to the deposition subsystem 140, and one or more substrates 105 can be transferred between the transfer subsystem 170 and the deposition subsystem 140 in real time using transfer elements 141. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to one or more of the processing elements 143, and/or to one or more of the evaluation elements 145. For example, one or more of the processing elements 143 can be used to perform M-PST related deposition procedures. Evaluation procedures and/or inspection procedures can be used to measure and/or inspect one or more surfaces of the substrates.

The inspection subsystem 150 can be used to perform M-PST related inspection procedures and can comprise one or more transfer/storage elements 152, one or more inspection elements 153, one or more controllers 154, and one or more evaluation elements 155. One or more of the transfer/storage elements 152 can be coupled to one or more of the inspection elements 153 and/or to one or more of the evaluation elements 155 and can be coupled to the transfer subsystem 170. The transfer subsystem 170 can be coupled to the inspection subsystem 150, and one or more substrates 105 can be transferred between the transfer subsystem 170 and the inspection subsystem 150 in real time using transfer elements 151. For example, the transfer subsystem 170 can be coupled to one or more of the transfer/storage elements 152, to one or more of the inspection elements 153, and/or to one or more of the evaluation elements 155. One or more of the controllers 154 can be coupled to one or more of the transfer/storage elements 152, to one or more of the inspection elements 153, and/or to one or more of the evaluation elements 155.

The measurement subsystem 160 can be used to perform M-PST related measurement procedures and can comprise one or more transfer/storage elements 162, one or more metrology elements 163, one or more controllers 164, and one or more evaluation elements 165. One or more of the transfer/storage elements 162 can be coupled to one or more of the metrology elements 163 and/or to one or more of the evaluation elements 165 and can be coupled to the transfer subsystem 170. The transfer subsystem 170 can be coupled to the measurement subsystem 160, and one or more substrates 105 can be transferred between the transfer subsystem 170 and the measurement subsystem 160 in real time using transfer elements 161. For example, the transfer subsystem 170 can be coupled to one or more of the transfer/storage elements 162, to one or more of the metrology elements 163, and/or to one or more of the evaluation elements 165. One or more of the controllers 164 can be coupled to one or more of the transfer/storage elements 162, to one or more of the metrology elements 163, and/or to one or more of the evaluation elements 165. The measurement subsystem 160 can comprise one or more evaluation elements 165 that can evaluate, measure, inspect, align, verify, and/or store one or more substrates. For example, one or more of the evaluation elements 165 can be used to perform real-time optical metrology procedures that can be used to measure M-PST patterns, features, and/or structures on the substrate.

The transfer subsystem 170 can be used to perform M-PST related transfer procedures and can comprise transfer elements (174, 175, 176, and 177) that can be used to receive substrates, transfer substrates, align substrates, store substrates, and/or delay substrates. For example, the transfer elements 174 can support two or more substrates, and transfer elements (175, 176, and 177) can be used to move the transfer elements 174 and the substrates 105 in real time. Alternatively, other transferring means may be used. The transfer subsystem 170 can load, transfer, store, and/or unload substrates based on a processing sequence, a transfer sequence, operational states, the substrate and/or processing states, the processing time, the current time, the substrate data, the number of sites on the substrate, the type of sites on the substrates, the number of required M-PST related sites, the number of completed M-PST related sites, the number of remaining M-PST related sites, risk data, or confidence data, or any combination thereof. For example, the M-PST related sites on the substrate can include evaluation sites, overlay sites, alignment sites, measurement sites, verification sites, inspection sites, or damage-assessment sites, or any combination thereof.

In some examples, transfer system 170 can use M-PST related data to determine where to transfer a substrate. In other examples, a transfer system can use S-P, D-P, and/or D-E processing sequence data to determine where to transfer a substrate.

Operational state data can be established for the subsystems (110, 120, 130, 140, 150, 160, and 170) and can be used and/or updated by M-PST procedures. In addition, operational state data can be established for the transfer/storage elements (112, 122, 132, 142, 152, and 162), processing elements (113, 123, 133, 143, and 153), and evaluation elements (115, 125, 135, 145, 155, and 165), and can be updated by M-PST procedures. For example, the operational state data for the processing elements can include availability data, matching data for the processing elements, expected processing times for some process steps and/or sites, confidence data and/or risk data for the processing elements, or confidence data and/or risk data for one or more M-PST-related models, patterns, and/or maps. Updated operational states can be obtained by querying in real-time one or more processing elements, and/or one or more subsystems. Updated loading data can be obtained by querying in real-time one or more transfer elements, and/or one or more transfer subsystems.

Confidence and/or risk data can be established for the subsystems (110, 120, 130, 140, 150, 160, and 170) and can be used to update the operational state data or can be updated by the operational state data. Confidence and/or risk data can be established and/or updated by the S-P procedures, D-P procedures, the D-E procedures, and/or the M-PST-related procedures. In addition, confidence and/or risk data can be established for the transfer/storage elements (112, 122, 132, 142, 152, and 162), processing elements (113, 123, 133, 143, and 153), and evaluation elements (115, 125, 135, 145, 155, and 165), and can be updated by M-PST-related procedures. For example, the confidence and/or risk data can include error data, warning data, threshold data, or limit data. Updated confidence and/or risk data can be obtained by querying in real-time one or more of the processing elements, one or more of the subsystems, and/or one or more of the controllers. The confidence data and/or risk data can include an assessment of each M-PST related process that was performed on the substrate.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include 8-bit, 16-bit, 32-bit, and/or 64-bit processors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time S-P, D-P, D-E, and/or M-PST-related procedures. A controller can receive real-time data to update a subsystem, processing element, process, recipe, profile, image, pattern, and/or model data. One or more of the controllers (114, 124, 134, 144, 154, 164, and 190) can be used to exchange one or more Semiconductor Equipment Communications Standard (SECS) messages with the MES 180, read and/or remove information, feed forward, and/or feedback the information, and/or send information as a SECS message. In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL). In other embodiments, external subsystems and/or tools may be included. One or more of the subsystems (110, 120, 130, 140, 150, 160, and 170) may include one or more optical metrology elements, optical inspection elements, etch elements, deposition elements, integrated-metrology (IM) elements, Atomic Layer Deposition (ALD) elements, measurement elements, ionizations elements, polishing elements, coating elements, developing elements, cleaning elements, exposure elements, and thermal treatment elements. In addition, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, 150, 160, and 170) can comprise control applications, Graphical User Interface (GUI) components, and/or database components. In addition, one or more of the subsystems (110, 120, 130, 140, 150, 160, and 170) and/or controllers (114, 124, 134, 144, 154, 164, and 190) can include Advanced Process Control (APC) applications, Advanced Equipment Control (AEC), Fault Detection and Classification (FDC), and/or Run-to-Run (R2R) applications. In some embodiments, APC applications, AEC applications, FDC applications, and/or R2R applications can be performed.

Output data and/or messages from S-P, D-P, D-E, and/or M-PST-related procedures can be used in subsequent procedures to optimize the process accuracy and precision. Data can be passed to S-P, D-P, D-E, and/or M-PST-related procedures in real-time as real-time variable parameters, overriding current model default values, and narrowing the search space for resolving accurate results. Real-time data can be used with a library-based system, regression-based system, or neural network system, or any combination thereof to optimize S-P, D-P, D-E, and/or M-PST-related procedures.

In some embodiments, the measurement subsystem 160 can include integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 150 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The measurement subsystem 160 can use polarized, non-polarized, or depolarized reflectometry, spectroscopic ellipsometry, reflectometry, or other optical measurement techniques to measure accurate device profiles, accurate CDs, and multiple layer film thickness of a substrate. The integrated metrology process (iODP) can be executed as an integrated process in an integrated group of subsystems. In addition, the integrated process eliminates the need to break the substrate for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control. An exemplary optical metrology system is described in U.S. Pat. No. 6,943,900, entitled GENERATION OF A LIBRARY OF PERIODIC GRATING DIFFRACTION SIGNAL, by Niu, et al., issued on Sep. 13, 2005, and is incorporated in its entirety herein by reference.

Simulated diffraction signals can be generated by applying Maxwell's equations and using a numerical analysis technique to solve Maxwell's equations. For example, various numerical analysis techniques, including variations of rigorous coupled wave analysis (RCWA), can be used with multi-layer structures. For a more detail description of RCWA, see U.S. Pat. No. 6,891,626, titled CACHING OF INTRA-LAYER CALCULATIONS FOR RAPID RIGOROUS COUPLED-WAVE ANALYSES, by Niu, et al. filed on Jan. 25, 2001, issued May 10, 2005, which is incorporated herein by reference in its entirety.

An additional procedure for generating a library of simulated-diffraction signals can include using a machine learning system (MLS). Prior to generating the library of simulated-diffraction signals, the MLS is trained using known input and output data. For example, the MLS may be trained with a subset of the S-P, D-P, and/or D-E library data. In one exemplary embodiment, simulated diffraction signals can be generated using a MLS employing a machine learning algorithm, such as back-propagation, radial basis function, support vector, kernel regression, and the like. For a more detailed description of machine learning systems and algorithms, see "U.S. patent application Ser. No. 10/608,300, titled OPTICAL METROLOGY OF STRUCTURES FORMED ON SEMICONDUCTOR SUBSTRATES USING MACHINE LEARNING SYSTEMS, by Doddi, et al., filed on Jun. 27, 2003, and published as US Patent Application No. 2004/0267397A1, which is incorporated herein by reference in its entirety.

For detailed description of metrology model optimization, refer to U.S. Pat. No. 7,330,279, titled "MODEL AND PARAMETER SELECTION FOR OPTICAL METROLOGY", by Vuong, et al., filed Jun. 27, 2002 and issued on Feb. 12, 2008; U.S. Pat. No. 7,171,284, entitled "OPTICAL METROLOGY MODEL OPTIMIZATION BASED ON GOALS", by Vuong, et al., filed Sep. 21, 2004 and issued on Jan. 30, 2007; and U.S. patent application Ser. No. 11/061,303, OPTICAL METROLOGY OPTIMIZATION FOR REPETITIVE STRUCTURES, by Vuong, et al., filed on Feb. 18, 2005, and published as US Patent Application No. 2005/0209816A1; all of which are incorporated herein by reference in their entireties.

When a regression-based process is used, a measured diffraction signal measured off the patterned structure can be compared to simulated diffraction signals. The simulated diffraction signals can be iteratively generated based on sets of profile parameters, to get a convergence value for the set of profile parameters that generates the closest match simulated diffraction signal compared to the measured diffraction signal. For a more detailed description of a regression-based process, see U.S. Pat. No. 6,785,638, titled METHOD AND SYSTEM OF DYNAMIC LEARNING THROUGH A REGRESSION-BASED LIBRARY GENERATION PROCESS, by Niu, et al. issued on Aug. 31, 2004, which is incorporated herein by reference in its entirety.

When a library-based process is used, an optical metrology data library can be generated and/or enhanced using S-P, D-P, and/or D-E procedures, recipes, profiles, and/or models. For example, an S-P, D-P, and/or D-E evaluation library can comprise simulated and/or measured optical signals and corresponding set of profile parameters. A detailed description of generating optical metrology data such as a library of simulated diffraction signals and corresponding set of profile parameters is described in U.S. Pat. No. 6,943,900, entitled GENERATION OF A LIBRARY OF PERIODIC GRATING DIFFRACTION SIGNAL, by Niu, et al., issued on Sep. 13, 2005, and is incorporated in its entirety herein by reference. The regression-based and/or the library-based process can include S-P, D-P, and/or D-E procedures.

One or more of the controllers (114, 124, 134, 144, 154, 164, and 190) can perform M-PST-related procedures that can be context dependent and can operate as control strategies, control plans, control models, and/or recipe managers to provide real-time processing. Control and/or analysis strategies/plans can cover multiple process steps within a substrate processing sequence, and can be used to analyze the real-time and/or collected data, and establish error conditions. An analysis procedure can be executed when a context is matched. During the execution of an analysis procedure, one or more analysis plans can be executed. A plan can create an error when a data failure occurs, an execution problem occurs, or a control problem occurs. A data collection plan and/or analysis plan can reject the data at one or more of the sites for a substrate or reject the data because a procedure fails. For example, dynamic context matching allows for custom configuration at each device and/or product.

Intervention and/or judgment rules can be defined in a strategy, plan, model, subsystem, element, or procedure and can be assigned to execute whenever a matching context is encountered. The intervention and/or judgment rules can be established for various S-P, D-P, D-E, and/or M-PST-related procedures and can be maintained in the database. S-P, D-P, D-E, and/or M-PST-related procedures can indicate a failure when a limit is exceeded, and successful procedures can create warning messages when limits are being approached. Pre-specified failure actions for procedures errors can be stored in a database, and can be retrieved from the database when an error occurs.

One or more of the formatted messages can be exchanged between subsystems. The controllers can process messages and extract new data. When new data is available, a controller can either use the new data to update an M-PST-related procedure currently being used for the substrate and/or lot. When the controller uses the new data to update M-PST-related procedure data for the substrate lot currently being processed, the controller can determine if an M-PST-related procedure can be updated before the current substrate is processed. The current substrate can be processed using the updated M-PST-related procedure when the M-PST-related procedure can be updated before the current substrate is processed. The current substrate can be processed using a non-updated M-PST-related procedure when the data cannot be updated before the current substrate is processed.

M-PST-related procedures can be used to create, modify, and/or evaluate isolated and/or dense (nested) structures and/or features at different times and/or sites. For example, pattern layer and/or substrate thickness data can be different near isolated and/or nested structures, and substrate thickness data can be different near open areas and/or trench/via array areas. A processing subsystem can use new data for isolated and/or nested structures to update and/or optimize a process recipe and/or process time.

Measurement subsystem 160 data can include measured and/or simulated signals associated with M-PST-related patterns, features, and/or structures, and the signals can be stored using processing, substrate, lot, recipe, site, or substrate location data. Measurement data can include variables associated with patterned structure profile, metrology device type and associated variables, and ranges used for the variables floated in the modeling and values of variables that were fixed in the modeling. The library data may include fixed and/or variable profile parameters (such as CD, sidewall angle, refractive index (n) data and extinction coefficient (k) data), and/or metrology device parameters (such as wavelengths, angle of incidence, and/or azimuth angle).

Measurement subsystem 160 data can include measured, calculated, and/or simulated signals associated with aligned targets, un-aligned targets, patterned overlay structures, and the signals can be stored using processing, substrate, lot, recipe, site, or substrate location data. Inspection data can include variables associated with patterned structures, targets, inspection device type and associated variables, and ranges used for the variables floated in the modeling and values of variables that were fixed in the modeling. The library data may include fixed and/or variable profile parameters.

In some embodiments, M-PST-related procedures can use measured, predicted, and/or simulated data. M-PST-related procedures may utilize context/identification information such as site ID, substrate ID, slot ID, lot ID, recipe, state, and patterned structure ID as a means for organizing and indexing data. In some examples, the library data can include verified data associated with products, devices, substrates, procedures, lots, recipes, sites, locations, M-PST patterns and/or M-PST structures.

In some examples, the MES 180 may be configured to monitor some M-PST-related and/or system processes, and factory level intervention and/or judgment rules can be used to determine which processes are monitored and which data can be used. In addition, factory level intervention and/or judgment rules can be used to determine how to manage the data when a process can be changed, paused, and/or stopped. In addition, the MES 180 can provide configuration information and update information. Data can be exchanged using SEMI Equipment Communications Standard/Generic Equipment Model (SECS/GEM) communications protocols.

The processing system 100 can be used to perform one or more M-PST-related procedures. In some embodiments, one or more substrates can be received by one or more transfer subsystems 170, and the transfer subsystems 170 can transfer one or more of the substrates to one or more of the subsystems (110, 120, 130, 140, and 150) in the processing system 100. One or more of the controllers (114, 124, 134, 144, 154, 164, and 190) can be configured for determining substrate data for each substrate, for determining one or more M-PST-related procedures using historical data and/or the real-time data, for establishing one or more M-PST-related procedures, for establishing a first number of substrates to be processed using the M-PST-related procedure, for determining operational state data for the one or more subsystems (110, 120, 130, 140, 150, 160, and 170), for determining loading data for the one or more transfer elements 174 in the one or more transfer subsystems 170.

In various examples, verified M-PST-related data can be obtained by performing the M-PST-related procedure in a "golden" processing chamber, can be historical data that is stored in a library, can be obtained by performing a verified procedure, can be obtained from the MES 180, can be simulation data, and can be predicted data. Multi-input multi-output (MIMO) models can be established and/or used to predict M-PST-related data for S-P, D-P, and/or D-E procedures. Some MIMO models can be established and/or used to predict CD data, SWA data, focus data, exposure dose data, thickness data, and/or uniformity data for one or more patterned layers.

When multiple processing elements and/or substrates are used, a first substrate can be transferred to a first processing element, and can be processed using a first M-PST-related procedure, and a second substrate can be transferred to a second processing element and can be processed using the first M-PST-related procedure or a modified version of the first M-PST-related procedure. The modified version can include changes established using chamber matching data, recipe update data, feedback data, feed forward data, or any combination thereof.

When a first S-P, D-P, or D-E processing sequence is performed, a first M-PST pattern can be created on a first layer on one or more of the substrates using a first M-PST-related procedure or an updated/modified first M-PST-related procedure. Measurement data can be obtained for the M-PST pattern on one or more of the substrates, and first correction data can be determined using the difference between reference data and the measured data. The first correction data can be used to update neural network models and/or ODP models when the correction data is less than or equal to a correction limit. When a second S-P, D-P, or D-E processing sequence is performed, a second M-PST pattern can be created on a second layer on one or more of the substrates using a second M-PST-related procedure or an updated/modified second M-PST-related procedure. Additional measurement data can be obtained for one or more of the substrates, and second correction data can be determined using the difference between reference data and the additional measured data. The second correction data can be used to update the neural network models and/or ODP when the second correction data is less than or equal to a second correction limit.

When some M-PST-related library data is created, one or more of the subsystems (110, 120, 130, 140, 150, 160, and 170) can be used to create one or more patterned layers on one or more substrates, and the one or more patterned layers can include device-related structures, measurement structures, and/or M-PST structures. For example, one or more of the patterned layers can be measured with a metrology device and/or inspection device. One or more of the controllers (114, 124, 134, 144, 154, 164, and 190) can be used to compare the obtained data to the data already in one or more M-PST-related libraries. When a matching condition is found, one or more of the M-PST-related patterns, features, and/or structures can be identified using the library data associated with a matching condition. When a matching condition is not found, one or more of the M-PST-related patterns, features, and/or structures can be identified as un-verified M-PST-related patterns, features, and/or structures and the data associated with them can be stored as un-verified data.

Substrate 105 can be, for example, a semiconductor substrate, a work piece, or a liquid crystal display (LCD).

When an M-PST-related procedure is performed, one or more of the controllers (114, 124, 134, 144, 154, 164, and 190) can be used to determine if the M-PST-related procedure is a verified procedure. In some examples, verification decisions for an M-PST-related procedure can be made using the data from a first M-PST pattern at a first site, and the first site can be selected from the number of evaluation and/or verification sites on one or more substrates. The first site can have a first M-PST pattern associated therewith that was created during an S-P, D-P, and/or D-E processing sequence. Evaluation data can be obtained from an M-PST pattern at a first site on the first substrate, and the M-PST pattern can have focus data, dose data, exposure data, developing data, and/or thermal data associated therewith. In some procedures, M-PST verification data can be established using a verified M-PST pattern for the first site on the substrate, and the first verification data can include verified data that can be obtained from an M-PST evaluation library and/or database. In other procedures, simulation data can be calculated for an M-PST pattern, and the simulation data can be used to verify one or more of the M-PST patterns on the substrate. For example, the simulation includes predicted data that can be obtained from an M-PST evaluation library and/or database.

When some M-PST procedures are being evaluated and/or verified, confidence data and/or risk data can be established for the M-PST procedures using one or more differences between the M-PST evaluation data and the M-PST verification limits. When one or more of the differences between the M-PST evaluation data and the M-PST verification limits are small, one or more of the confidence values for the M-PST procedure can be high, one or more of the risk values for the M-PST procedure can be low, and the M-PST procedure can be identified as a verified procedure. When one or more of the differences between the M-PST evaluation data and the M-PST verification limits are large, one or more of the confidence values for the M-PST procedure can be low, one or more of the risk values for the M-PST procedure can be high, and the M-PST procedure can be identified as an un-verified procedure. In other cases, the model, the data, the map, and/or the M-PST pattern associated with the verified M-PST procedure can also be verified.

In some M-PST procedures, confidence data and/or risk data can be established for the M-PST procedures using one or more differences between the M-PST evaluation data obtained from a first M-PST procedure and the M-PST evaluation data obtained from an earlier and/or later M-PST procedure. In other M-PST procedures, confidence data and/or risk data can be established for the M-PST procedures using one or more differences between the M-PST evaluation data obtained from a first site on the substrate and the M-PST evaluation data obtained from another site on the substrate.

In other examples, when an M-PST procedure is being evaluated and/or verified, additional M-PST patterns at additional sites can be used on the substrate. For example, verification decisions can be made using the data from a first site and data from one or more additional sites on the substrate. When a new site is required, a new site can be selected from the number of M-PST evaluation sites on the substrate, and the new site can have a new M-PST pattern associated therewith that was created using the M-PST procedure. Evaluation data can be obtained from the new evaluation site on the substrate, and the new site can have new focus data, new dose data, new exposure data, new developing data, and/or new thermal data associated therewith. In addition, new M-PST verification data can be established for the new site on the substrate, and the new M-PST verification data can include new verified M-PST pattern data that can be obtained from an evaluation library and/or database. New confidence data and/or risk data can be established for the new site using a new difference between the new evaluation data and the new verification data. The M-PST-related procedure can be identified as a verified procedure when a new verification limit is met, and the M-PST-related procedure can be identified as an un-verified procedure when the new verification limit is not met.

In still other examples, when a M-PST procedure is being verified, evaluated, and/or performed, M-PST patterns at other sites on additional substrates can be used. For example, verification decisions can be made using the data from sites on one or more substrates. One or more of the controllers (114, 124, 134, 144, 154, 164, and 190) can also be configured for establishing additional evaluation procedures for additional substrates.

In some embodiments, the data used to evaluate/verify an M-PST procedure and/or M-PST pattern can include intensity data, transmission data, absorption data, reflectance data, diffraction data, optical properties data, or image data, or any combination thereof. The verification data can include historical data, real-time data, optical metrology data, imaging data, particle data, CD-scanning electron microscope (CD-SEM) data, transmission electron microscope (TEM) data, and/or focused ion beam (FIB) data. The threshold limit data can include goodness of fit data, CD data, accuracy data, wavelength data, sidewall data, particle data, process data, historical data, or a combination thereof.

The substrates 105 can include one or more layers that can include semiconductor material, carbon material, dielectric material, glass material, ceramic material, metallic material, oxidized material, mask material, or planarization material, or a combination thereof.

When a new processing sequence/product is being developed, one or more evaluation libraries can be created, refined, updated, and/or used for each new processing sequence/product, and the evaluation libraries can include historical and/or real-time data. The processing system 100 can use M-PST-related procedures and/or M-PST-related evaluation procedures to create M-PST-related data for one or more evaluation libraries.

In some embodiments, M-PST-related library data can be created, refined, and/or verified using one or more "golden" subsystems and/or "golden" processing elements. In other embodiments, one or more substrates can be processed using a verified M-PST-related procedure. When a verified M-PST-related procedure is performed, verified M-PST-related data can be obtained that can be stored as M-PST-related library data. The M-PST-related library data can include goodness of fit (GOF) data, rules data, diffraction signals and/or spectra, refraction signals and/or spectra, reflection signals and/or spectra, or transmission signals and/or spectra, or any combination thereof.

When M-PST patterns, features, and/or structures are produced and/or examined, accuracy and/or tolerance limits can be used. When these limits are not correct, refinement procedures can be performed. Alternatively, other procedures can be performed, other sites can be used, or other substrates can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

In addition, M-PST-related data can include gate data, drain data, source data, capacitor data, via data, trench date, two-dimensional memory structure data, three-dimensional memory structure data, SWA data, bottom CD data, top CD data, middle CD data, polygon data, array data, periodic structure data, alignment feature data, doping data, strain data, damaged-structure data, or reference structure data, or any combination thereof.

In some cases, the sites used for the M-PSTs and the types of patterns associated with the M-PST can be specified by a semiconductor manufacturer based on data stored in a historical database. For example, a semiconductor manufacturer may have historically chosen a number of sites on the substrate when making SEM measurements and would like to correlate the measurement data, inspection data, and/or evaluation data from one system to the data measured using a SEM system, a TEM system, and/or a FIB system. In addition, the number of measurement or verification sites used in M-PST procedures can be reduced as the manufacturer becomes more confident that the process is and will continue to produce high quality spacers and/or devices.

The sites for the M-PSTs can be exposure dose-dependent, temperature-dependent, exposure focus-dependent, pattern-dependent, device-dependent, alignment-dependent, overlay-dependent, process-dependent, measurement-dependent, inspection-dependent, gate-dependent, substrate-dependent, or product-dependent, or any combination thereof. The limit data can include confidence limits, risk limits, pattern-dependent limits, target-dependent limits, alignment-dependent limits, overlay-dependent limits, gate structure limits, accuracy limits, time limits, product requirement limits, measurement limits, inspection limits, simulation limits, prediction limits, or historical limits, or any combination thereof.

FIG. 2 shows an exemplary flow diagram of a procedure for processing a substrate in accordance with embodiments of the invention. In the illustrated embodiment, an exemplary procedure 200 is shown for creating one or more M-PST patterns in a masking layer during substrate processing, obtaining measured data for one or more of the M-PST patterns, and using the measured data to determine focus data, exposure dose data, and/or PEB temperature data.

In 210, a test mask having a test multi-pitch scatterometry target (M-PST) therein can be can be created and can be provided to a scanner subsystem, and the test M-PST can be aligned in a first direction. Exemplary M-PST patterns are shown in FIG. 3A, FIG. 4A, FIG. 5A, and FIG. 6A.

In 215, a test M-PST pattern can be created in a patterned layer on a test substrate using the test mask and a test lithography-related processing sequence that can include test exposure procedures and test developing procedures. The first patterned layer can include a first developed M-PST pattern, and the first developed M-PST pattern layer can include a plurality of structure features and a plurality of space features. For example, each space feature can be located next to at least one structure feature. The structure features can include at least one isolated structure feature and at least one dense structure feature, and the space features can include at least one isolated space feature and at least one dense space feature. Exemplary developed M-PST patterns are shown in FIG. 3B, FIG. 4B, FIG. 5B, and FIG. 6B.

For example, one or more test substrates can be received by a transfer subsystem (170, FIG. 1) that can be coupled to a scanner subsystem (120, FIG. 1) and a lithography subsystem (110, FIG. 1). Alternatively, another subsystem may receive one or more of the test substrates. One or more of the controllers (114, 124, 134, 144, 154, 164, and 190) can be used to receive, determine, and/or send real-time and/or historical data associated with one or more of the test substrates. For example, the real-time and/or historical data can include M-PST related data such as profile data, diffraction signal data, CD data, SWA data, photoresist data, BARC data, focus data, exposure dose data, and temperature data.

In 220, measurement data can be obtained for the test structure using a metrology tool and an M-PST-related profile library. When one or more of the developed M-PST patterns (321, FIG. 3B), (421, FIG. 4B), (521, FIG. 5B), and (621, FIG. 6B) has been created, the developed M-PST patterns (321, FIG. 3B), (421, FIG. 4B), (521, FIG. 5B), and (621, FIG. 6B) can be measured using an optical metrology device. The optical device can perform measurement procedures at one or more wavelengths using one or more optical sources. For example, the optical metrology device and the analysis software can be obtained from Timbre Technologies Inc, a TEL company. In addition, the metrology tools can include metrology tools from Nanometrics Inc or ThermaWave-Sensys Inc. Alternatively, the metrology tools may include metrology tools from ASML Inc or KLA-Tencor Inc.

Figure 3A:
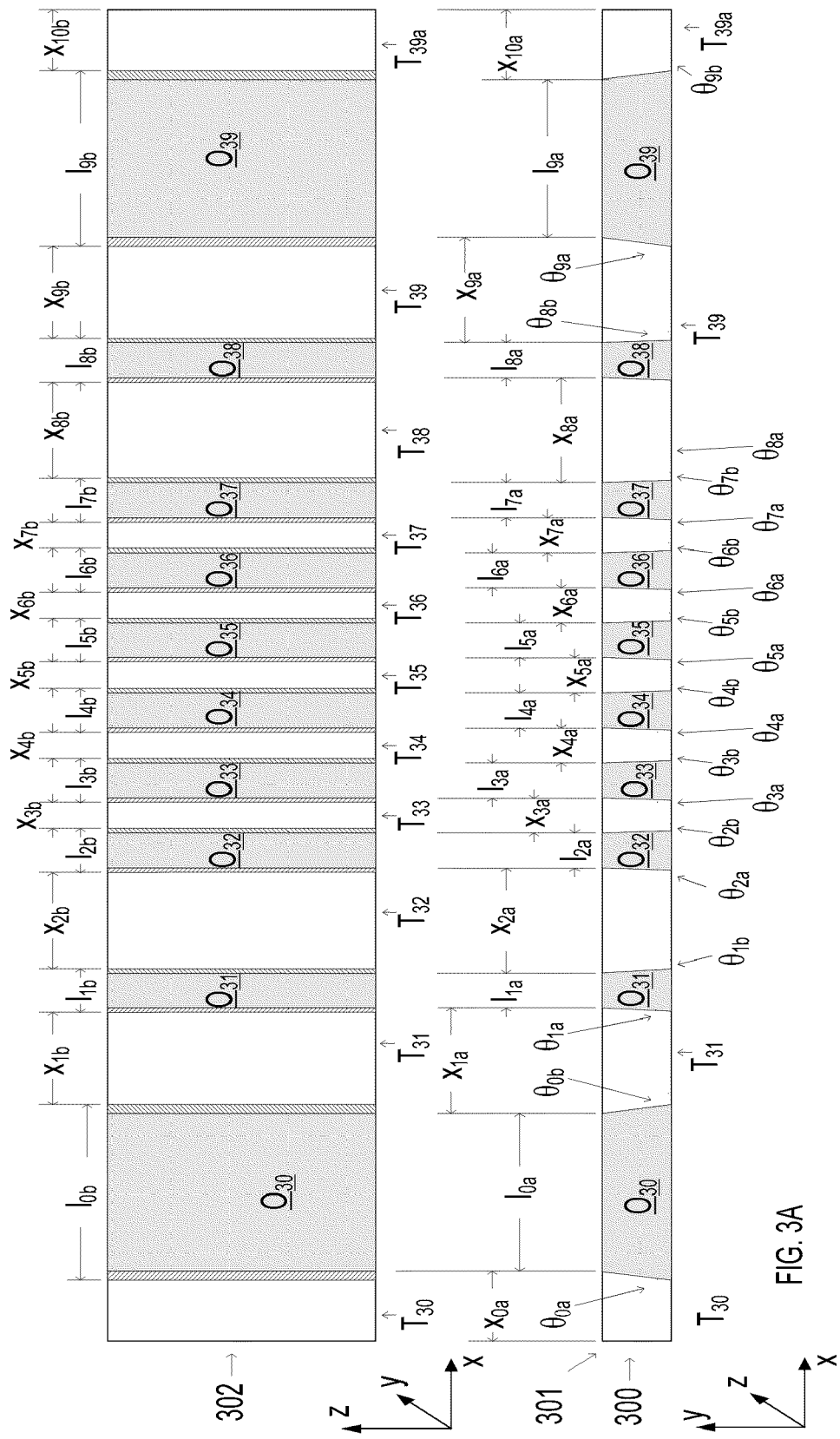
FIG. 3A illustrates a first exemplary M-PST masking pattern in accordance with embodiments of the invention.
Figure 3B:
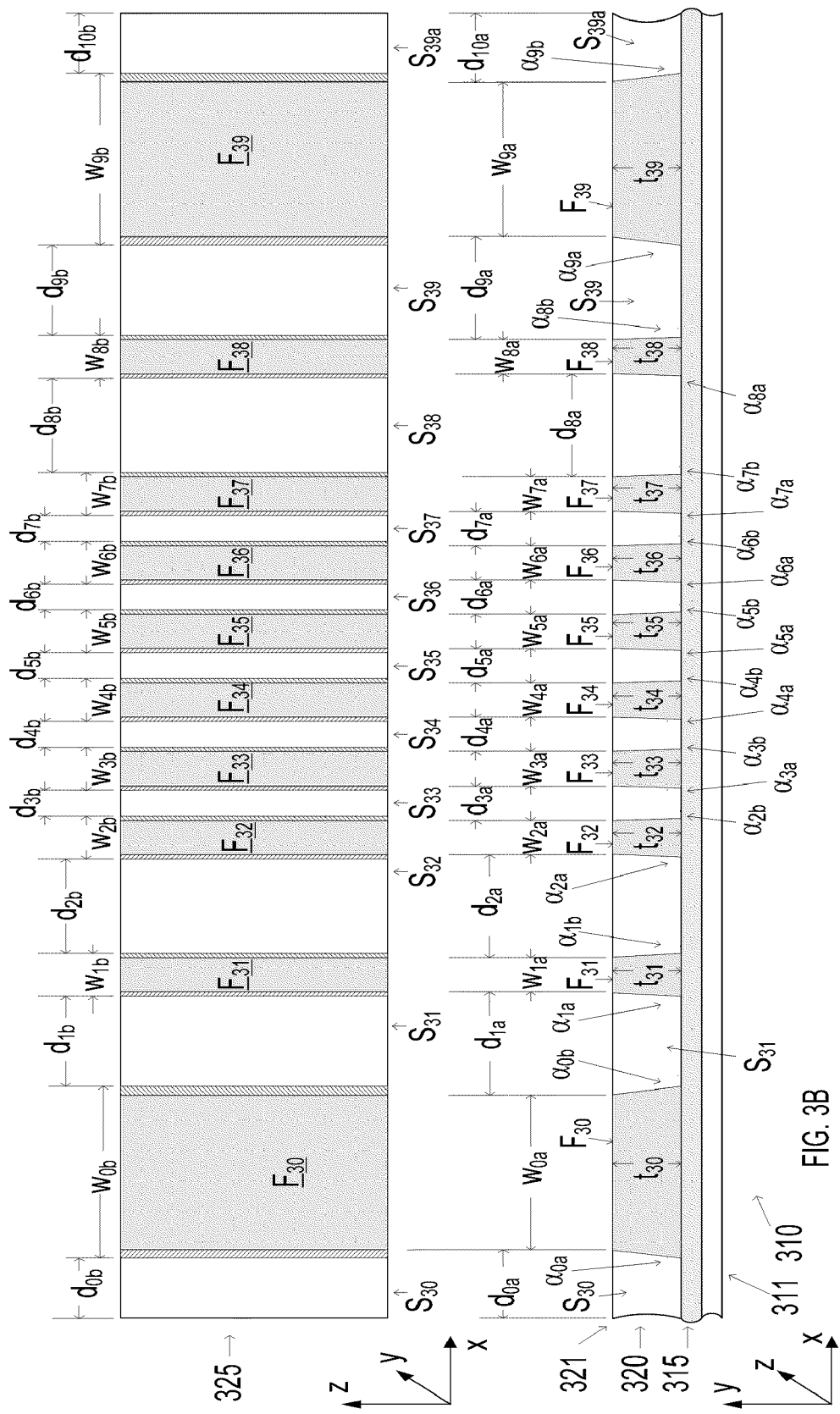
FIG. 3B illustrates a first exemplary patterned substrate comprising a first developed M-PST pattern in accordance with embodiments of the invention.

In one example, measurement data can be obtained from one or more of the developed features ($F_{30}$-$F_{39}$) and/or from one or more of the developed spaces ($S_{30}$-$S_{39a}$) in the first developed M-PST patterns (321, 325) shown in FIG. 3B, and can include one or more of the top CDs ($w_{0a}$-$w_{9a}$), one or more of the bottom CDs ($w_{0b}$-$w_{9b}$), one or more of the thicknesses ($t_{0b}$-$t_{9b}$), one or more of the first sidewall angles ($\alpha_{0a}$-$\alpha_{9a}$), one or more of the second sidewall angles ($\alpha_{0b}$-$\alpha_{9b}$), one or more of the top widths ($d_{0a}$-$d_{9a}$), or one or more of the bottom widths ($d_{0b}$-$d_{9b}$), or any combination thereof. In addition, the top CDs ($w_{0a}$-$w_{9a}$) can vary from approximately 50 nm to approximately 300 nm; the bottom CDs ($w_{0b}$-$w_{9b}$) can vary from approximately 50 nm to approximately 300 nm; the thicknesses ($t_{30}$-$t_{39}$) can vary from approximately 10 nm to approximately 220 nm; the first sidewall angles ($\alpha_{0a}$-$\alpha_{9a}$) can vary from approximately 80 degrees to approximately 100 degrees; the second sidewall angles ($\alpha_{0b}$-$\alpha_{9b}$) can vary from approximately 80 degrees to approximately 100 degrees; the top widths ($d_{0a}$-$d_{9a}$) can vary from approximately 50 nm to approximately 300 nm; and the bottom widths ($d_{0b}$-$d_{9b}$) can vary from approximately 50 nm to approximately 300 nm.

Figure 4A:
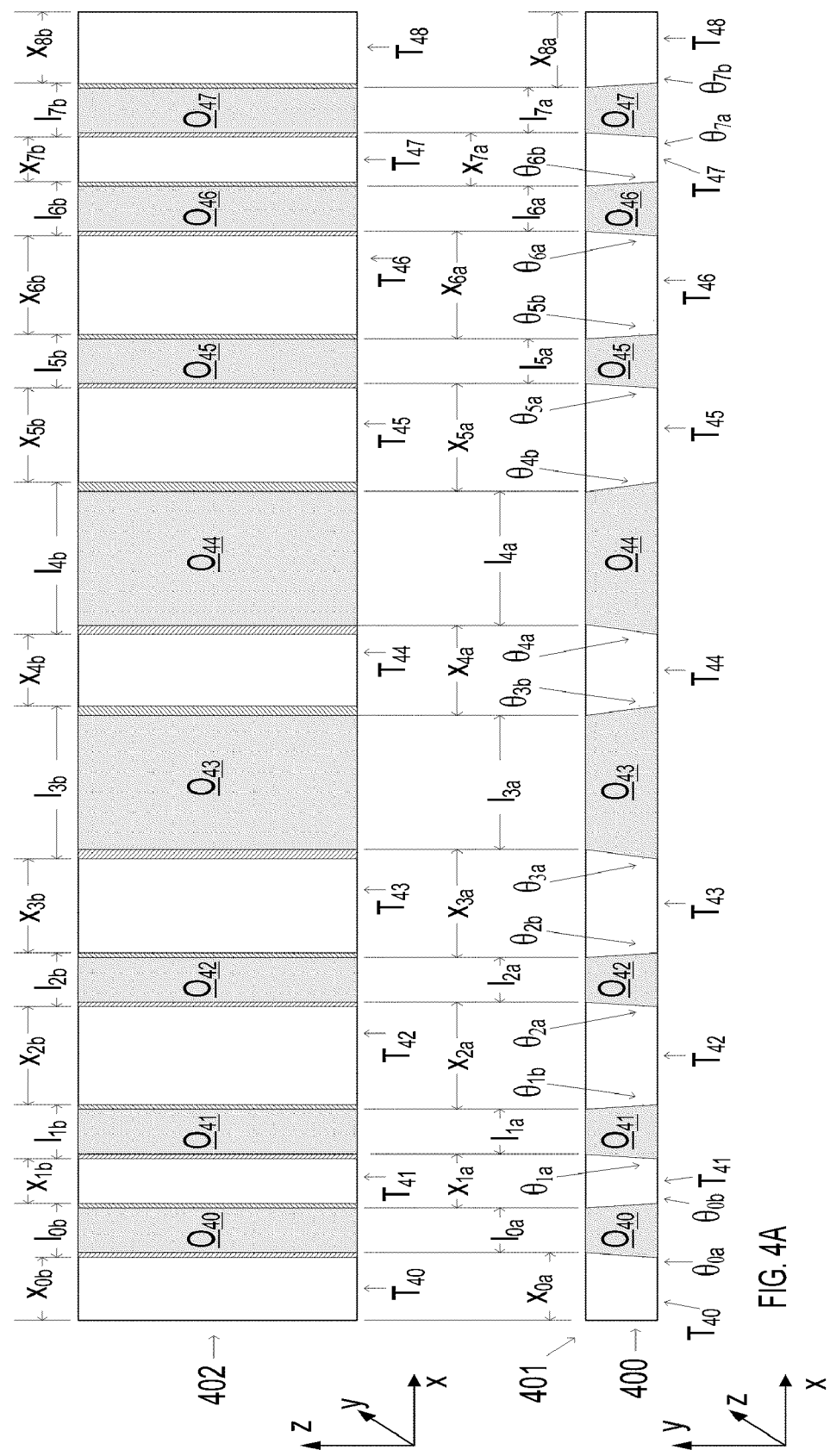
FIG. 4A illustrates a second exemplary M-PST masking pattern in accordance with embodiments of the invention.
Figure 4B:
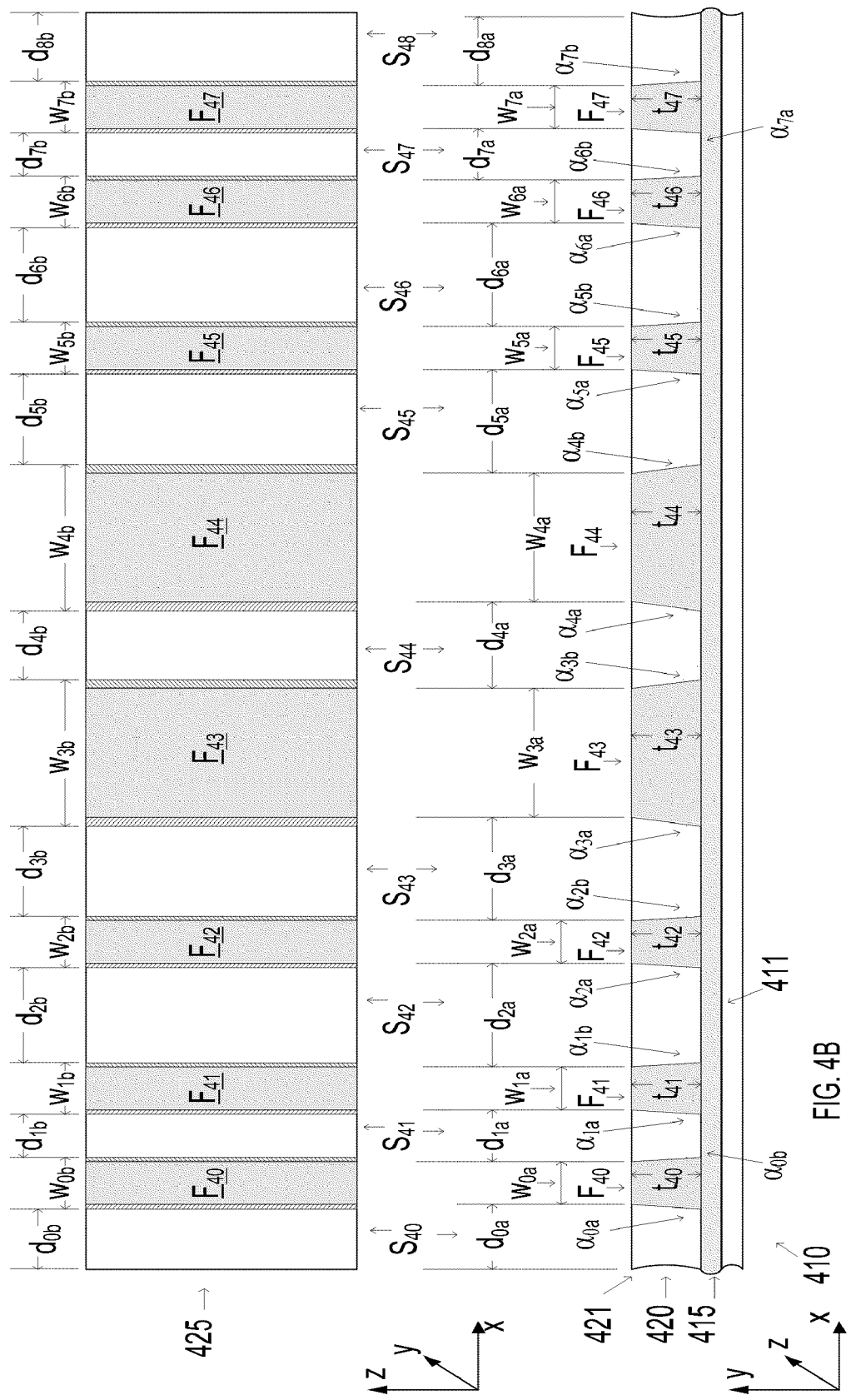
FIG. 4B illustrates a second exemplary patterned substrate comprising a first developed M-PST pattern in accordance with embodiments of the invention.

In a second example, measurement data can be obtained from one or more of the developed features ($F_{40}$-$F_{47}$) and/or from one or more of the developed spaces ($S_{40}$-$S_{47}$) in the second developed M-PST patterns (421, 425) shown in FIG. 4B, and can include one or more of the top CDs ($w_{0a}$-$w_{7a}$), one or more of the bottom CDs ($w_{0b}$-$w_{7b}$), one or more of the thicknesses ($t_{40}$-$T_{7b}$), one or more of the first sidewall angles ($\alpha_{0a}$-$\alpha_{7a}$), one or more of the second sidewall angles ($\alpha_{0b}$-$\alpha_{7b}$), one or more of the top widths ($d_{0a}$-$d_{7a}$), or one or more of the bottom widths ($d_{0b}$-$d_{7b}$), or any combination thereof. In addition, the top CDs ($w_{0a}$-$w_{7a}$) can vary from approximately 50 nm to approximately 300 nm; the bottom CDs ($w_{0b}$-$w_{7b}$) can vary from approximately 50 nm to approximately 300 nm; the thicknesses ($t_{40}$-$t_{47}$) can vary from approximately 10 nm to approximately 220 nm; the first sidewall angles ($\alpha_{0a}$-$\alpha_{7a}$) can vary from approximately 80 degrees to approximately 100 degrees; the second sidewall angles ($\alpha_{0b}$-$\alpha_{7b}$) can vary from approximately 80 degrees to approximately 100 degrees; the top widths ($d_{0a}$-$d_{7a}$) can vary from approximately 50 nm to approximately 300 nm; and the bottom widths ($d_{0b}$-$d_{7b}$) can vary from approximately 50 nm to approximately 300 nm.

Figure 5A:
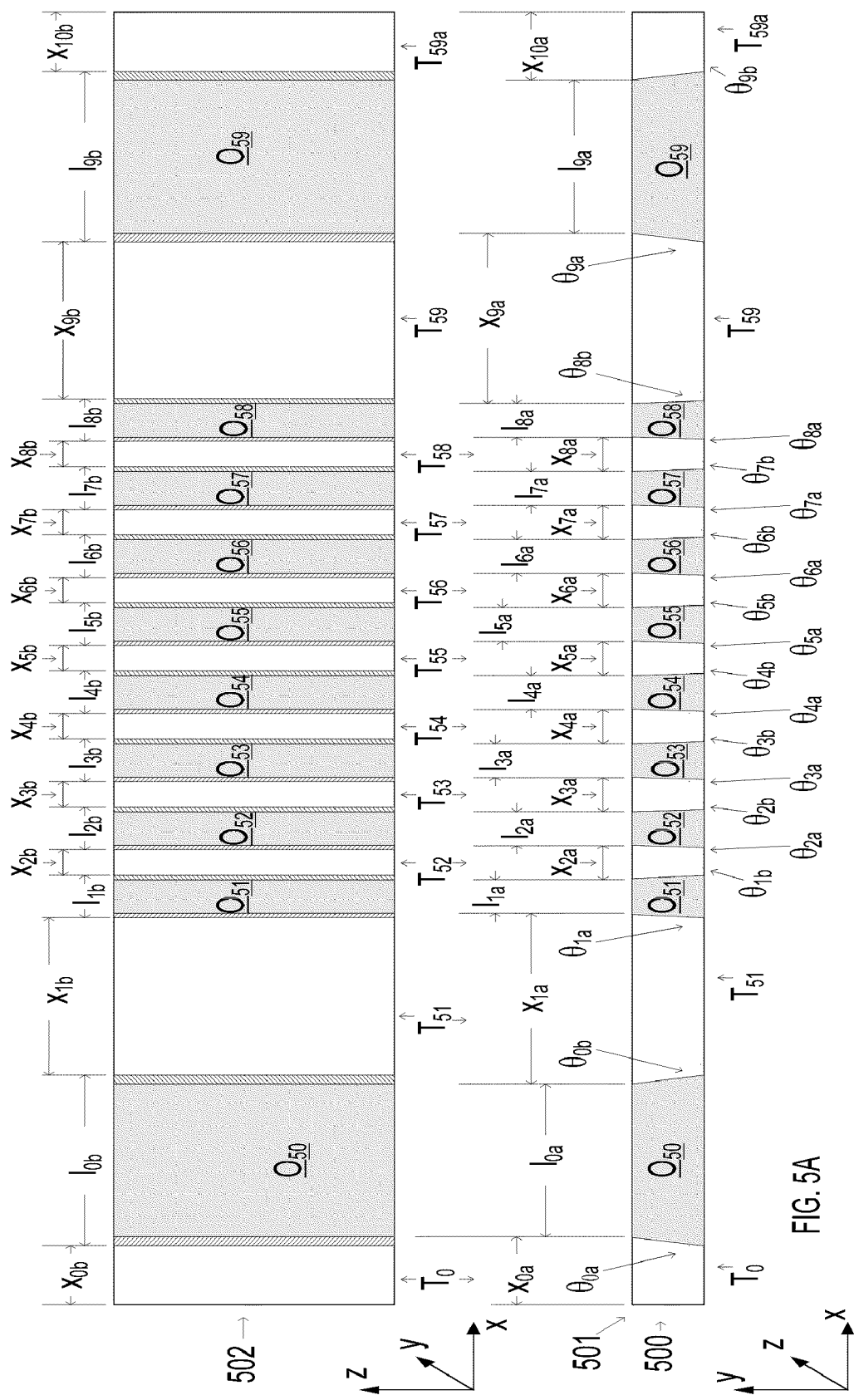
FIG. 5A illustrates a third exemplary M-PST masking pattern in accordance with embodiments of the invention.
Figure 5B:
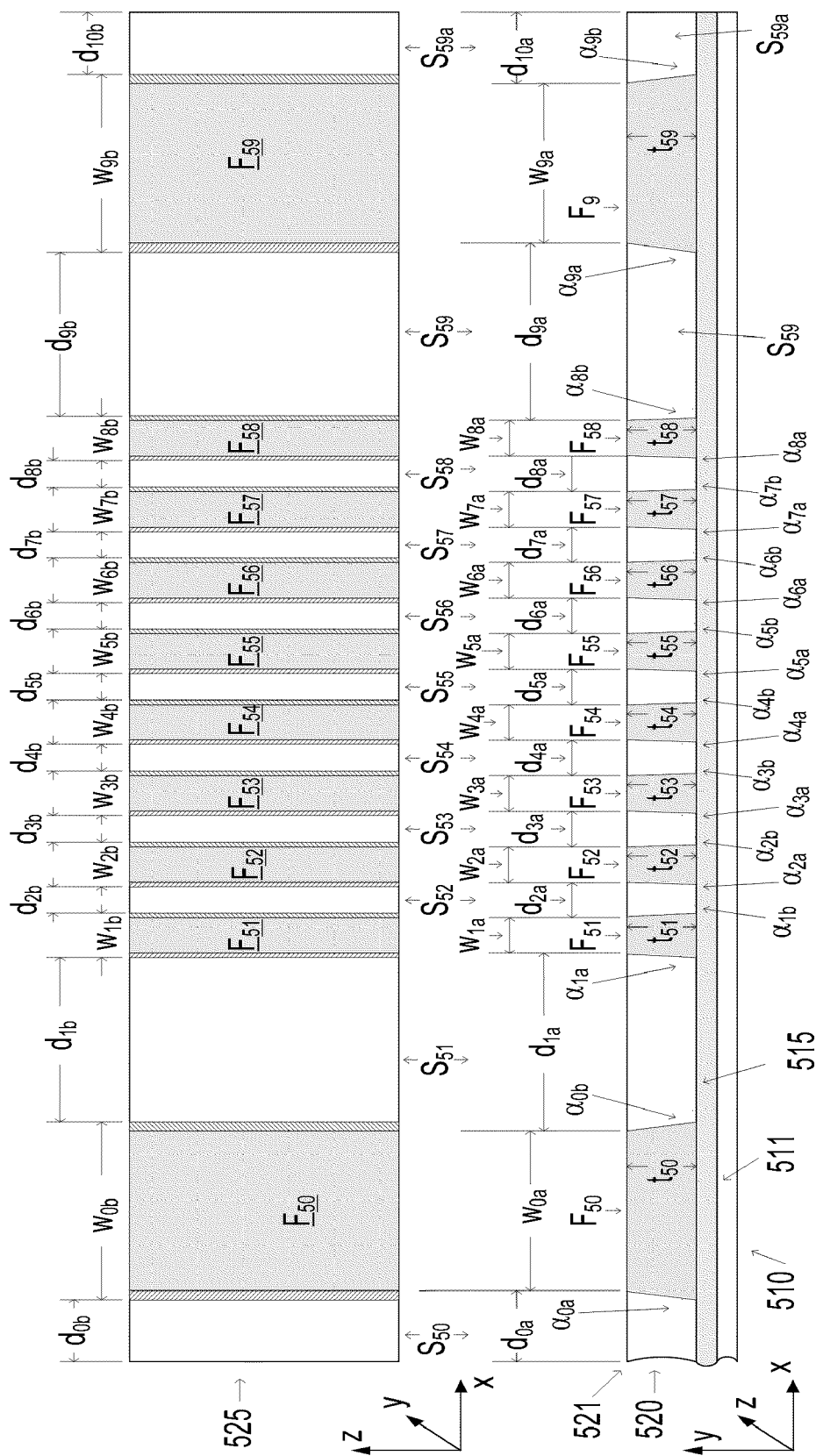
FIG. 5B illustrates a third exemplary patterned substrate comprising a first developed M-PST pattern in accordance with embodiments of the invention.

In a third example, measurement data can be obtained from one or more of the developed features ($F_{50}$-$F_{59}$) and/or from one or more of the developed spaces ($S_{50}$-$S_{59}$) in the third developed M-PST patterns (521, 525) shown in FIG. 5B, and can include one or more of the top CDs ($w_{0a}$-$w_{9a}$), one or more of the bottom CDs ($w_{0b}$-$w_{9b}$), one or more of the thicknesses ($t_{50}$-$t_{59}$), one or more of the first sidewall angles ($\alpha_{0a}$-$\alpha_{9a}$), one or more of the second sidewall angles ($\alpha_{0b}$-$\alpha_{9b}$), one or more of the top widths ($d_{0a}$-$d_{9a}$), or one or more of the bottom widths ($d_{0b}$-$d_{9b}$), or any combination thereof. In addition, the top CDs ($w_{0a}$-$w_{9a}$) can vary from approximately 50 nm to approximately 300 nm; the bottom CDs ($w_{0b}$-$w_{9b}$) can vary from approximately 50 nm to approximately 300 nm; the thicknesses ($t_{50}$-$t_{59}$) can vary from approximately 10 nm to approximately 220 nm; the first sidewall angles ($\alpha_{0a}$-$\alpha_{9a}$) can vary from approximately 80 degrees to approximately 100 degrees; the second sidewall angles ($\alpha_{0b}$-$\alpha_{9b}$) can vary from approximately 80 degrees to approximately 100 degrees; the top widths ($d_{0a}$-$d_{9a}$) can vary from approximately 50 nm to approximately 300 nm; and the bottom widths ($d_{0b}$-$d_{9b}$) can vary from approximately 50 nm to approximately 300 nm.

Figure 6A:
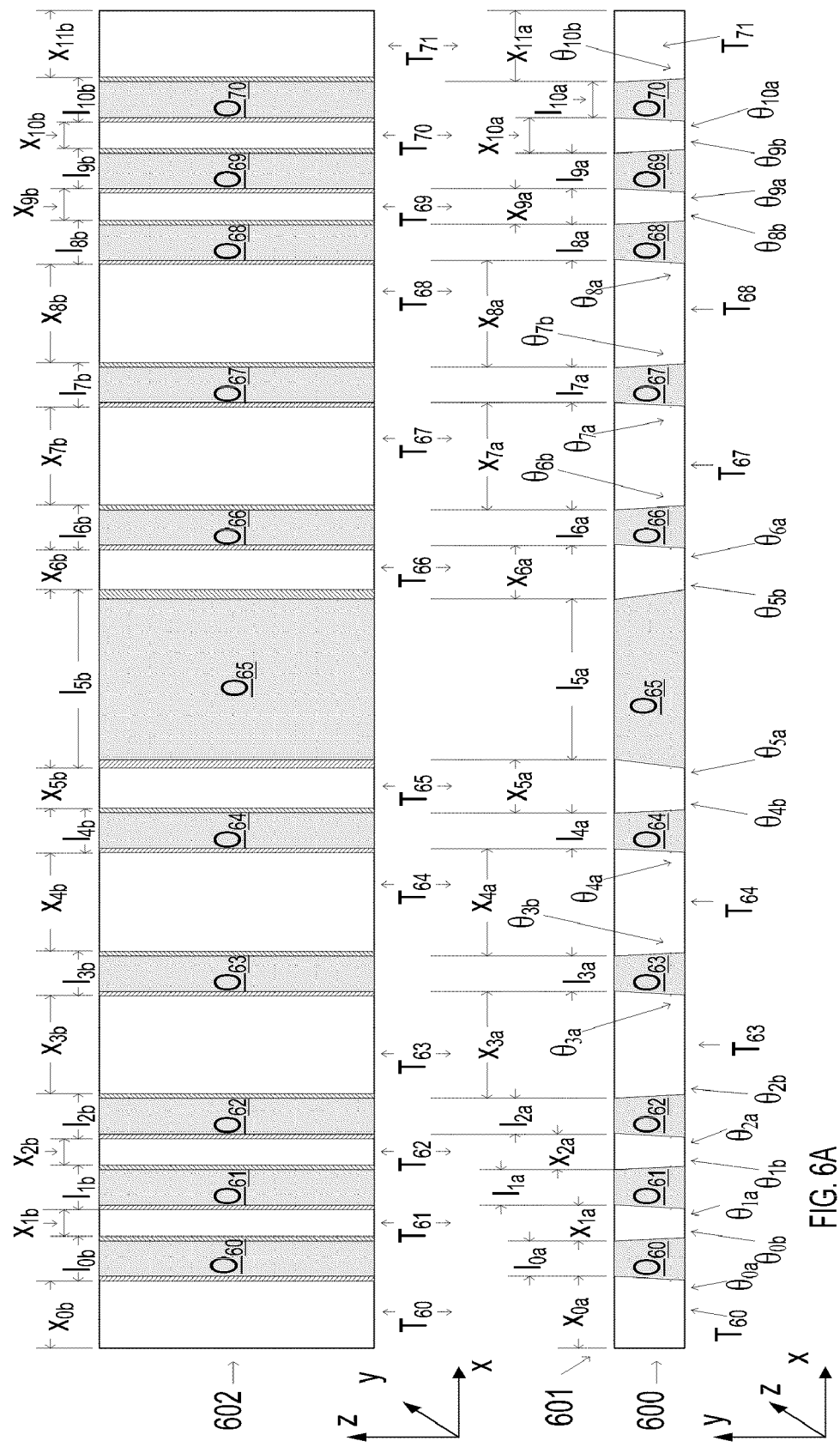
FIG. 6A illustrates a fourth exemplary M-PST masking pattern in accordance with embodiments of the invention.
Figure 6B:
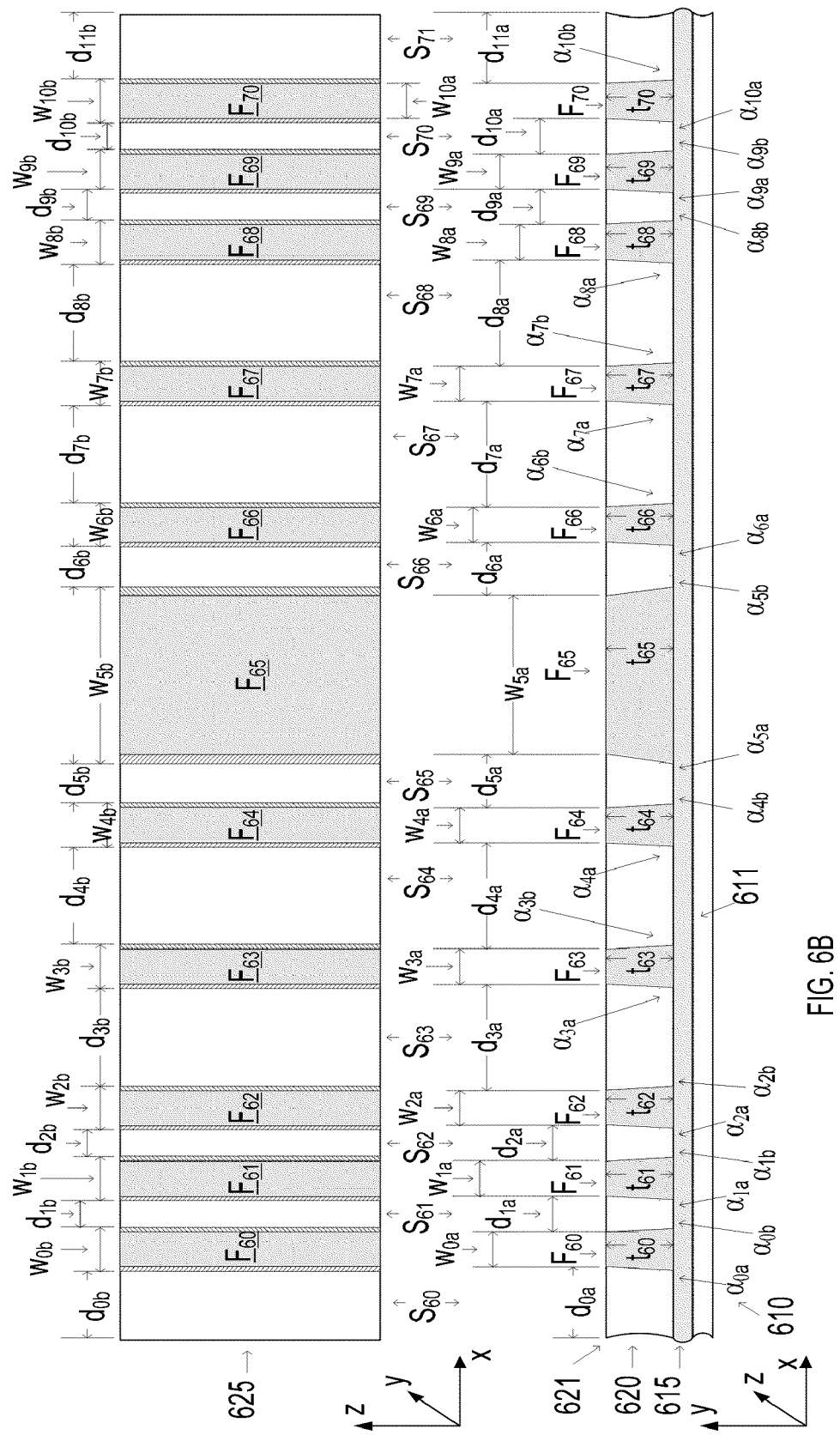
FIG. 6B illustrates a fourth exemplary patterned substrate comprising a first developed M-PST pattern in accordance with embodiments of the invention.

In a fourth example, measurement data can be obtained from one or more of the developed features ($F_{60}$-$F_{70}$) and/or from one or more of the developed spaces ($S_{60}$-$S_{71}$) in the fourth developed M-PST patterns (621, 625) shown in FIG. 6B, and can include one or more of the top CDs ($w_{0a}$-$w_{10a}$), one or more of the bottom CDs ($w_{0b}$-$w_{10b}$), one or more of the thicknesses ($t_{60}$-$t_{70}$), one or more of the first sidewall angles ($\alpha_{0a}$-$\alpha_{10a}$), one or more of the second sidewall angles ($\alpha_{0b}$-$\alpha_{10b}$), one or more of the top widths ($d_{0a}$-$d_{10a}$), or one or more of the bottom widths ($d_{0b}$-$d_{10b}$) or any combination thereof. In addition, the top CDs ($w_{0a}$-$w_{10a}$) can vary from approximately 50 nm to approximately 300 nm; the bottom CDs ($w_{0b}$-$w_{10b}$) can vary from approximately 50 nm to approximately 300 nm; the thicknesses ($t_{60}$-$t_{70}$) can vary from approximately 10 nm to approximately 220 nm; the first sidewall angles ($\alpha_{0a}$-$\alpha_{10a}$) can vary from approximately 80 degrees to approximately 100 degrees; the second sidewall angles ($\alpha_{0b}$-$\alpha_{10b}$) can vary from approximately 80 degrees to approximately 100 degrees; the top widths ($d_{0a}$-$d_{10a}$) can vary from approximately 50 nm to approximately 300 nm;

and the bottom widths ($d_{0b}$-$d_{10b}$) can vary from approximately 50 nm to approximately 300 nm.

In 225, a query can be performed to determine if the test processing sequence requires a change. Procedure 200 can branch to 230 when the test processing sequence requires a change, and procedure 200 can branch to 235 when the test processing sequence does not require a change.

In 230, a new test processing sequence can be created. For example, the new test processing sequence can include one or more new exposure procedures, one or more new developing procedures, or one or more new thermal procedures, or any combination thereof. After a new test processing sequence is created, procedure 200 can branch to step 215 and continue as shown in FIG. 2.

In 235, output data can be determined using an M-PST-related model and the measurement data. In some embodiments, the M-PST-related model can comprise a neural network model (700, FIG. 7) that comprises three sets of input parameters (710, 720, and 730, FIG. 7), a plurality of hidden nodes (740, FIG. 7), and a plurality of output parameters (760, FIG. 7). Alternatively, a different type of model may be used, a different number of input parameters may be used, a different number of hidden nodes may be used, and a different number of output parameters may be used.

In some examples, the first set of input parameters (710, FIG. 7) can be associated with the features ($F_{30}$-$F_{39}$) in the first M-PST pattern (321, FIG. 3B), the second set of input parameters (720, FIG. 7) can be associated with the features ($F_{30}$-$F_{39}$) shown in the first M-PST pattern (321, FIG. 3B), and the third set of input parameters (730, FIG. 7) can be associated with the features ($F_{30}$-$F_{39}$) shown in the first M-PST pattern (321, FIG. 3B). In addition, the first set of input parameters (710, FIG. 7) can include top CD data, bottom CD data, thickness data, SWA data, substrate thickness data, BARC thickness data, uniformity data, variation data, photoresist data, exposure data, developing data, or scanner data, or any combination thereof associated with the first M-PST pattern (321, FIG. 3B). The data can include minimum values, maximum values, difference values, average values, 1-sigma values, or 3-sigma values, or any combination thereof.

In other examples, the first set of input parameters (710, FIG. 7) can be associated with the features ($F_{40}$-$F_{47}$) shown in the second M-PST pattern (421, FIG. 4B), the second set of input parameters (720, FIG. 7) can be associated with the features ($F_{40}$-$F_{47}$) shown in the second M-PST pattern (421, FIG. 4B), and the third set of input parameters (730, FIG. 7) can be associated with the features ($F_{40}$-$F_{47}$) shown in the second M-PST pattern (421, FIG. 4B). In addition, the first set of input parameters (710, FIG. 7) can include top CD data, bottom CD data, thickness data, SWA data, substrate thickness data, BARC thickness data, uniformity data, variation data, photoresist data, exposure data, developing data, or scanner data, or any combination thereof associated with the second M-PST pattern (421, FIG. 4B). The data can include minimum values, maximum values, difference values, average values, 1-sigma values, or 3-sigma values, or any combination thereof.

In some other examples, the first set of input parameters (710, FIG. 7) can be associated with features ($F_{50}$-$F_{59}$) in the third M-PST pattern (521, FIG. 5B), the second set of input parameters (720, FIG. 7) can be associated with the features ($F_{50}$-$F_{59}$) in the third M-PST pattern (521, FIG. 5B), and the third set of input parameters (730, FIG. 7) can be associated with the features ($F_{50}$-$F_{59}$) in the third M-PST pattern (521, FIG. 5B). In addition, the first set of input parameters (710, FIG. 7) can include top CD data, bottom CD data, thickness data, SWA data, substrate thickness data, BARC thickness data, uniformity data, variation data, photoresist data, exposure data, developing data, or scanner data, or any combination thereof associated with the third M-PST pattern (521, FIG. 5B). The data can include minimum values, maximum values, difference values, average values, 1-sigma values, or 3-sigma values, or any combination thereof.

In still other examples, the first set of input parameters (710, FIG. 7) can be associated with the features ($F_{60}$-$F_{70}$) in the fourth M-PST pattern (621, FIG. 6B), the second set of input parameters (720, FIG. 7) can be associated with the features ($F_{60}$-$F_{70}$) in the fourth M-PST pattern (621, FIG. 6B), and the third set of input parameters (730, FIG. 7) can be associated with the features ($F_{60}$-$F_{70}$) in the fourth M-PST pattern (621, FIG. 6B). In addition, the first set of input parameters (710, FIG. 7) can include top CD data, bottom CD data, thickness data, SWA data, substrate thickness data, BARC thickness data, uniformity data, variation data, photoresist data, exposure data, developing data, or scanner data, or any combination thereof associated with the fourth M-PST pattern (621, FIG. 6B). The data can include minimum values, maximum values, difference values, average values, 1-sigma values, or 3-sigma values, or any combination thereof.

In additional embodiments, the first set of input parameters (710, FIG. 7) can be associated with a first feature in the first M-PST pattern 321 shown in FIG. 3B, or can be associated with a first feature in the second M-PST pattern 421 shown in FIG. 4B or can be associated with a first feature in the third M-PST pattern 521 shown in FIG. 5B, or can be associated with a first feature in the fourth M-PST pattern 621 shown in FIG. 6B. The second set of input parameters (720, FIG. 7) can be associated with a second feature in the first M-PST pattern 321 shown in FIG. 3B, or can be associated with a second feature in the second M-PST pattern 421 shown in FIG. 4B or can be associated with a second feature in the third M-PST pattern 521 shown in FIG. 5B, or can be associated with a second feature in the fourth M-PST pattern 621 shown in FIG. 6B. The third set of input parameters (720, FIG. 7) can be associated with a third feature in the first M-PST pattern 321 shown in FIG. 3B, or can be associated with a third feature in the second M-PST pattern 421 shown in FIG. 4B or can be associated with a third feature in the third M-PST pattern 521 shown in FIG. 5B, or can be associated with a third feature in the fourth M-PST pattern 621 shown in FIG. 6B.

Figure 7:
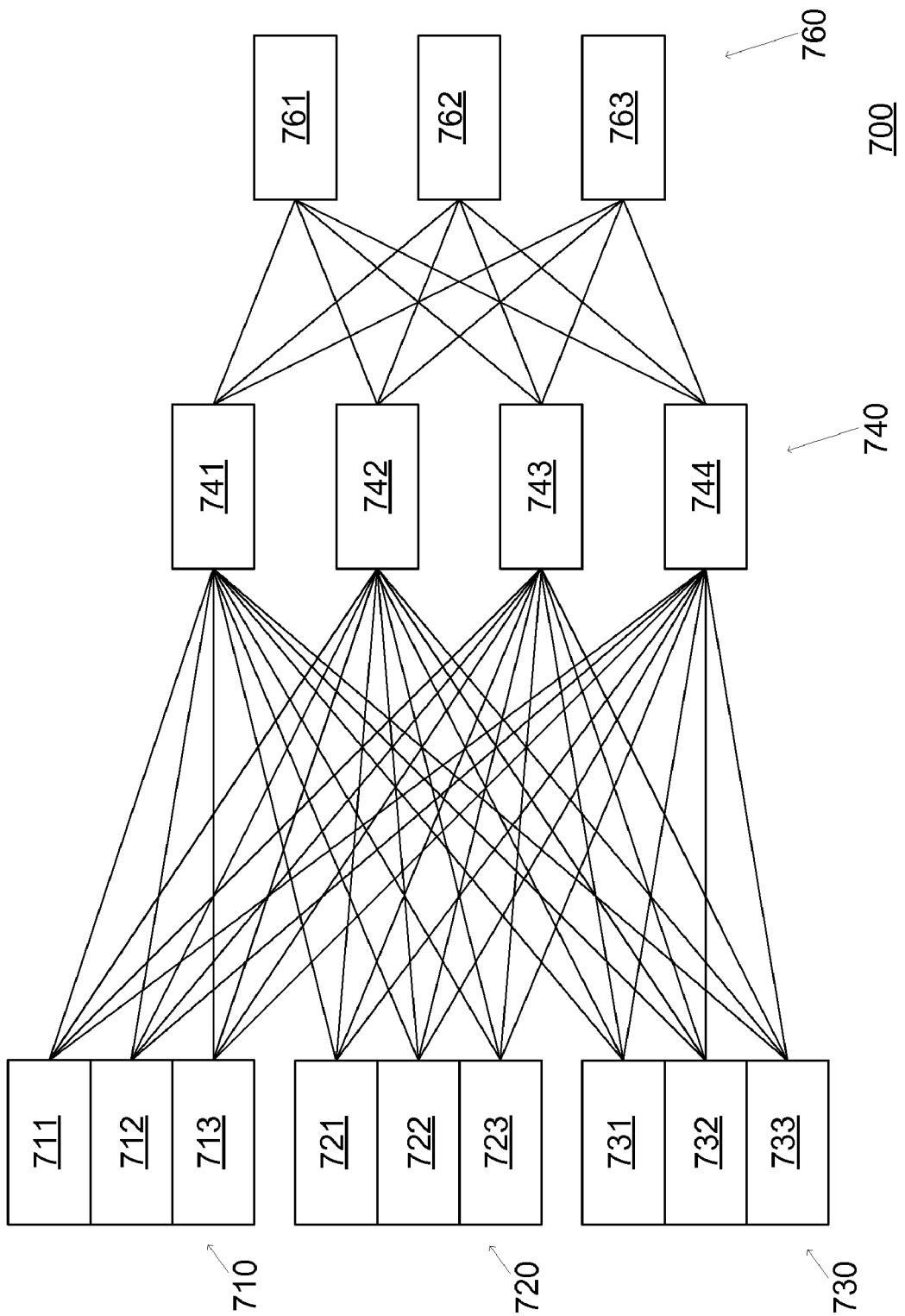
FIG. 7 illustrates an exemplary neural network model in accordance with embodiments of the invention.

In some embodiments, there can be three output parameters (761, 762, and 763) configured as shown in FIG. 7, and the output parameters can include exposure focus data, exposure dose data, and PEB temperature data. Alternatively, a different number of output parameters may be used that can be configured differently.

In 240, a query can be performed to determine if the output data is within the required limits for the output data. In some embodiments, the required limits can be control limits, and/or library boundary limits. Procedure 200 can branch to 245 when the output data is within the required limits for the output data, and procedure 200 can branch to 250 when the output data is not within one or more of the required limits for the output data. In other embodiments, the required limits can be dependent on the features used and/or the feature spacing used. For example, PROLITH™ simulations can be performed to determine the features and/or feature spacing to use to create the M_PST based on the conditions in the lithography process being examined.

In 245, the test M-PST can be identified as a verified M-PST when the output data created using the test M-PST is within the required limits for the output data. For example, a first set of output limits can be met by the exposure focus data, a second set of output limits can be met by the exposure dose data, and a third set of output limits can be met by the PEB temperature data. When a verified M-PST is identified, the verified data associated with M-PST can be store in a library or a database.

In 250, a query can be performed to determine if a new model should be obtained. Procedure 200 can branch to 255 when a new model is required, and procedure 200 can branch to 260 when a new model is not required.

In 255, a new model can be created. When the neural network model (700, FIG. 7) is used, a new model can be created by changing the number of input parameters (710, 720, and 730), the number of hidden nodes (741, 742, 743, and 744), and the number of output parameters (761, 762, and 763). In addition, a new ODP model can be created. Alternatively, a different type of model may be used that can be configured differently. After a new model is created, procedure 200 can branch to step 235 and continue as shown in FIG. 2.

In 260, a query can be performed to determine if a new M-PST is required. Procedure 200 can branch to 265 when a new M-PST is required, and procedure 200 can branch to 270 when a new M-PST is not required.

In 265, a new M-PST having a new pattern can be created. In some embodiments, new simulations can be performed using the new pattern, new lithography procedures, and/or new exposure procedures. After a new M-PST having a new pattern is created, procedure 200 can branch to step 210 and continue as shown in FIG. 2.

In 270, one or more corrective actions can be performed. In some examples, corrective actions can include stopping the processing, pausing the processing, re-evaluating one or more of the substrates, re-measuring one or more of the substrates, re-inspecting one or more of the substrates, re-working one or more of the substrates, storing one or more of the substrates, cleaning one or more of the substrates, delaying one or more of the substrates, or stripping one or more of the substrates, or any combination thereof.

Corrective actions can include calculating new and/or updated models, maps, data, M-PST patterns, and/or M-PST procedures. In addition, corrective actions can include increasing the number of required measurement sites by one or more the confidence data is greater than the first confidence threshold; and decreasing the number of required measurement sites by one or more the confidence data is not greater than the first confidence threshold. In addition, confidence and/or risk data can be determined using one or more models, one or more of the output parameters, and/or one or more of the input parameters. For example, the developed M-PST patterns can be identified as verified patterns when the confidence data is greater than one or more confidence thresholds or the risk data is less than one or more risk thresholds. In addition, verified data, a verified model, a verified map, a verified M-PST pattern, or a verified M-PST procedure, or a combination thereof can be identified when the confidence data is greater than one or more confidence thresholds or the risk data is less than one or more risk thresholds. For example, when there are unprocessed substrates waiting for a verification decision, the unprocessed substrates can be processed when the confidence data is than one or more confidence thresholds or the risk data is less than one or more risk thresholds.

FIG. 3A illustrates a first exemplary M-PST masking pattern in a first reticle/mask in accordance with embodiments of the invention. The first mask/reticle 300 can have a first M-PST masking pattern (301, FIG. 3A) integrated therein that can be illustrated using a plurality of opaque (dark) regions ($O_{30}$-$O_{39}$) and a plurality of transparent (light) regions ($T_{30}$-$T_{39a}$) that can be used to create an exposure image. A top view pattern 302 for the mask/reticle 300 is also shown in FIG. 3A. In addition, the mask/reticle 300 may include one or more layout patterns (not shown) that can be used to create device structures, and one or more periodic patterns (not shown) that can be used to create periodic measurement structures. In alternate embodiments, the mask/reticle 300 may include one or more target patterns (not shown) that can be used during alignment procedures in S-P, D-P, and D-E procedures.

The first exemplary M-PST masking pattern (301, FIG. 3A) can be oriented relative to the X-axis and can include:

1a) a first isolated transparent region ($T_{30}$, FIG. 3A) that can be located at the leftmost position of the first M-PST masking pattern (301, FIG. 3A);

2a) a first isolated opaque region ($O_{30}$, FIG. 3A) that can be located on the right-hand side of the first isolated transparent region ($T_{30}$, FIG. 3A);

3a) a second isolated transparent region ($T_{31}$, FIG. 3A) that can be located on the right-hand side of the first isolated opaque region ($O_{30}$, FIG. 3A);

4a) a first dense opaque region ($O_{31}$, FIG. 3A) that can be located on the right-hand side of the second isolated transparent region ($T_{31}$, FIG. 3A);

5a) a third isolated transparent region ($T_{32}$, FIG. 3A) that can be located on the right-hand side of the first dense opaque region ($O_{31}$, FIG. 3A);

6a) a second dense opaque region ($O_{32}$, FIG. 3A) that can be located on the right-hand side of the third isolated transparent region ($T_{32}$, FIG. 3A);

7a) a first dense transparent region ($T_{33}$, FIG. 3A) that can be located on the right-hand side of the second dense opaque region ($O_{32}$, FIG. 3A);

8a) a third dense opaque region ($O_{33}$, FIG. 3A) that can be located on the right-hand side of the first dense transparent region ($T_{33}$, FIG. 3A);

9a) a second dense transparent region ($T_{34}$, FIG. 3A) that can be located on the right-hand side of the fourth dense opaque region ($O_{33}$, FIG. 3A);

10a) a fourth dense opaque region ($O_{34}$, FIG. 3A) that can be located on the right-hand side of the second dense transparent region ($T_{34}$, FIG. 3A);

11a) a third dense transparent region ($T_{35}$, FIG. 3A) that can be located on the right-hand side of the fourth dense opaque region ($O_{34}$, FIG. 3A);

12a) a fifth dense opaque region ($O_{35}$, FIG. 3A) that can be located on the right-hand side of the third dense transparent region ($T_{35}$, FIG. 3A);

13a) a fourth dense transparent region ($T_{36}$, FIG. 3A) that can be located on the right-hand side of the fifth dense opaque region ($O_{35}$, FIG. 3A);

14a) a sixth dense opaque region ($O_{36}$, FIG. 3A) that can be located on the right-hand side of the fourth dense transparent region ($T_{36}$, FIG. 3A);

15a) a fifth dense transparent region ($T_{37}$, FIG. 3A) that can be located on the right-hand side of the sixth dense opaque region ($O_{36}$, FIG. 3A);

16a) a seventh dense opaque region ($O_{37}$, FIG. 3A) that can be located on the right-hand side of the fifth dense transparent region ($T_{37}$, FIG. 3A);

17a) a fourth isolated transparent region ($T_{38}$, FIG. 3A) that can be located on the right-hand side of the seventh dense opaque region ($O_{37}$, FIG. 3A);

18a) an eighth dense opaque region ($O_{38}$, FIG. 3A) that can be located on the right-hand side of the fourth isolated transparent region ($T_{38}$, FIG. 3A);

19a) a fifth isolated transparent region ($T_{39}$, FIG. 3A) that can be located on the right-hand side of the eighth dense opaque region ($O_{38}$, FIG. 3A);

20a) a second isolated opaque region ($O_{39}$, FIG. 3A) that can be located on the right-hand side of the fifth isolated transparent region ($T_{39}$, FIG. 3A); and 21a) a sixth isolated transparent region ($T_{39a}$, FIG. 3A) that can be located on the right-hand side of the second isolated opaque region ($O_{39}$, FIG. 3A).

The first isolated transparent region ($T_{30}$, FIG. 3A) can have a top CD ($x_{0a}$), a bottom CD ($x_{0b}$); the second isolated transparent region ($T_{31}$, FIG. 3A) can have a top CD ($x_{1a}$) and a bottom CD ($x_{1b}$); the third isolated transparent region ($T_{32}$, FIG. 3A) can have a top CD ($x_{2a}$) and a bottom CD ($x_{2b}$); the first dense transparent region ($T_{33}$, FIG. 3A) can have a top CD ($x_{3a}$) and a bottom CD ($x_{3b}$); the second dense transparent region ($T_{34}$, FIG. 3A) can have a top CD ($x_{4a}$) and a bottom CD ($x_{4b}$); the third dense transparent region ($T_{35}$, FIG. 3A) can have a top CD ($x_{5a}$) and a bottom CD ($x_{5b}$); the fourth dense transparent region ($T_{36}$, FIG. 3A) can have a top CD ($x_{6a}$) and a bottom CD ($x_{6b}$); the fifth dense transparent region ($T_{37}$, FIG. 3A) can have a top CD ($x_{7a}$) and a bottom CD ($x_{7b}$); the fourth isolated transparent region ($T_{38}$, FIG. 3A) can have a top CD ($x_{8a}$) and a bottom CD ($x_{8b}$); the fifth isolated transparent region ($T_{39}$, FIG. 3A) can have a top CD ($x_{9a}$) and a bottom CD ($x_{9b}$); and the sixth isolated transparent region ($T_{39a}$, FIG. 3A) can have a top CD ($x_{10a}$) and a bottom CD ($x_{10b}$).

The top CD ($x_{0a}$) can range from approximately 10 nm to approximately 400 nm, and the bottom CD ($x_{0b}$) can range from approximately 5 nm to approximately 400 nm; the top CD ($x_{1a}$) can range from approximately 10 nm to approximately 400 nm, and the bottom CD ($x_{1b}$) can range from approximately 5 nm to approximately 400 nm; the top CD ($x_{2a}$) can range from approximately 10 nm to approximately 400 nm, and the bottom CD ($x_{2b}$) can range from approximately 5 nm to approximately 400 nm; the top CD ($x_{3a}$) can range from approximately 10 nm to approximately 100 nm, and the bottom CD ($x_{3b}$) can range from approximately 5 nm to approximately 100 nm; the top CD ($x_{4a}$) can range from approximately 10 nm to approximately 100 nm, and the bottom CD ($x_{4b}$) can range from approximately 5 nm to approximately 100 nm; the top CD ($x_{5a}$) can range from approximately 10 nm to approximately 100 nm, and the bottom CD ($x_{5b}$) can range from approximately 5 nm to approximately 100 nm; the top CD ($x_{6a}$) can range from approximately 10 nm to approximately 100 nm, and the bottom CD ($x_{6b}$) can range from approximately 5 nm to approximately 100 nm; the top CD ($x_{7a}$) can range from approximately 10 nm to approximately 100 nm, and the bottom CD ($x_{7b}$) can range from approximately 5 nm to approximately 100 nm; the top CD ($x_{8a}$) can range from approximately 10 nm to approximately 400 nm, and the bottom CD ($x_{8b}$) can range from approximately 5 nm to approximately 400 nm; the top CD ($x_{9a}$) can range from approximately 10 nm to approximately 400 nm, and the bottom CD ($x_{9b}$) can range from approximately 5 nm to approximately 400 nm; and the top CD ($x_{10a}$) can range from approximately 10 nm to approximately 400 nm, and the bottom CD ($x_{10b}$) can range from approximately 5 nm to approximately 400 nm.

The first isolated opaque region ($O_{30}$, FIG. 3A) can have a top CD ($I_{0a}$), a bottom CD ($I_{0b}$), a first SWA ($\theta_{0a}$), and a second SWA ($\theta_{0b}$); the first dense opaque region ($O_{31}$, FIG. 3A) can have a top CD ($I_{1a}$), a bottom CD ($I_{1b}$), a first SWA ($\theta_{1a}$), and a second SWA ($\theta_{1b}$); the second dense opaque region ($O_{32}$, FIG. 3A) can have a top CD ($I_{2a}$), a bottom CD ($I_{2b}$), a first SWA ($\theta_{2a}$), and a second SWA ($\theta_{2b}$); the third dense opaque region ($O_{33}$, FIG. 3A) can have a top CD ($I_{3a}$), a bottom CD ($I_{3b}$), a first SWA ($\theta_{3a}$), and a second SWA ($\theta_{3b}$); the fourth dense opaque region ($O_{34}$, FIG. 3A) can have a top CD ($I_{4a}$), a bottom CD ($I_{4b}$), a first SWA ($\theta_{4a}$), and a second SWA ($\theta_{4b}$); the fifth dense opaque region ($O_{35}$, FIG. 3A) can have a top CD ($I_{5a}$), a bottom CD ($I_{5b}$), a first SWA ($\theta_{5a}$), and a second SWA ($\theta_{5b}$); the sixth dense opaque region ($O_{36}$, FIG. 3A) can have a top CD ($I_{6a}$), a bottom CD ($I_{6b}$), a first SWA ($\theta_{6a}$), and a second SWA ($\theta_{6b}$); the seventh dense opaque region ($O_{37}$, FIG. 3A) can have a top CD ($I_{7a}$), a bottom CD ($I_{7b}$), a first SWA ($\theta_{7a}$), and a second SWA ($\theta_{7b}$); the eighth dense opaque region ($O_{38}$, FIG. 3A) can have a top CD ($I_{8a}$), a bottom CD ($I_{8b}$), a first SWA ($\theta_{8a}$), and a second SWA ($\theta_{8b}$); and the second isolated opaque region ($O_{39}$, FIG. 3A) can have a top CD ($I_{9a}$), a bottom CD ($I_{9b}$), a first SWA ($\theta_{9a}$), and a second SWA ($\theta_{9b}$);

The top CD ($I_{0a}$) can range from approximately 5 nm to approximately 500 nm, and the bottom CD ($I_{0b}$) can range from approximately 10 nm to approximately 500 nm; the top CD ($I_{1a}$) can range from approximately 5 nm to approximately 200 nm, and the bottom CD ($I_{1b}$) can range from approximately 10 nm to approximately 200 nm; the top CD ($I_{2a}$) can range from approximately 5 nm to approximately 200 nm, and the bottom CD ($I_{2b}$) can range from approximately 10 nm to approximately 200 nm; the top CD ($I_{3a}$) can range from approximately 5 nm to approximately 200 nm, and the bottom CD ($I_{3b}$) can range from approximately 10 nm to approximately 200 nm; the top CD ($I_{4a}$) can range from approximately 5 nm to approximately 200 nm, and the bottom CD ($I_{4b}$) can range from approximately 10 nm to approximately 200 nm; the top CD ($I_{5a}$) can range from approximately 5 nm to approximately 200 nm, and the bottom CD ($I_{5b}$) can range from approximately 10 nm to approximately 200 nm; the top CD ($I_{6a}$) can range from approximately 5 nm to approximately 200 nm, and the bottom CD ($I_{6b}$) can range from approximately 10 nm to approximately 200 nm; the top CD ($I_{7a}$) can range from approximately 5 nm to approximately 200 nm, and the bottom CD ($I_{7b}$) can range from approximately 10 nm to approximately 200 nm; the top CD ($I_{8a}$) can range from approximately 5 nm to approximately 200 nm, and the bottom CD ($I_{8b}$) can range from approximately 10 nm to approximately 200 nm; and the top CD ($I_{9a}$) can range from approximately 5 nm to approximately 500 nm, and the bottom CD ($I_{9b}$) can range from approximately 10 nm to approximately 500 nm.

Still referring to FIG. 3A, the first SWA ($\theta_{0a}$) can range from approximately 80 degrees to approximately 99 degrees, and the second SWA ($\theta_{0b}$) can range from approximately 88 degrees to approximately 92 degrees; the first SWA ($\theta_{1a}$) can range from approximately 85 degrees to approximately 95 degrees, and the second SWA ($\theta_{1b}$) can range from approximately 85 degrees to approximately 95 degrees; the first SWA ($\theta_{2a}$) can range from approximately 85 degrees to approximately 95 degrees, and the second SWA ($\theta_{2b}$) can range from approximately 85 degrees to approximately 95 degrees; the first SWA ($\theta_{3a}$) can range from approximately 85 degrees to approximately 95 degrees, and the second SWA ($\theta_{3b}$) can range from approximately 85 degrees to approximately 95 degrees; the first SWA ($\theta_{4a}$) can range from approximately 85 degrees to approximately 95 degrees, and the second SWA ($\theta_{4b}$) can range from approximately 85 degrees to approximately 95 degrees; the first SWA ($\theta_{5a}$) can range from approximately 85 degrees to approximately 95 degrees, and the second SWA ($\theta_{5b}$) can range from approximately 85 degrees to approximately 95 degrees; the first SWA ($\theta_{6a}$) can range from approximately 85 degrees to approximately 95 degrees, and the second SWA ($\theta_{6b}$) can range from approximately 85 degrees to approximately 95 degrees; the first SWA ($\theta_{7a}$) can range from approximately 85 degrees to approximately 95 degrees, and the second SWA ($\theta_{7b}$) can range from approximately 85 degrees to approximately 95 degrees; the first SWA ($\theta_{8a}$) can range from approximately 85 degrees to approximately 95 degrees, and the second SWA ($\theta_{8b}$) can range from approximately 85 degrees to approximately 95 degrees; and the first SWA ($\theta_{9a}$) can range from approximately 80 degrees to approximately 99 degrees, and the second SWA ($\theta_{9b}$) can range from approximately 80 degrees to approximately 99 degrees.

FIG. 3B illustrates a first exemplary patterned substrate comprising a first developed M-PST pattern in accordance with embodiments of the invention. When one or more substrates are processed using the first M-PST masking pattern (301, FIG. 3A), one or more patterned substrates (310, FIG. 3B) can be created. The patterned substrate (310, FIG. 3B) can include one or more previously created layers (311, FIG. 3B), one or more BARC layers (315, FIG. 3B), and one or more patterned (developed) layers (320, FIG. 3B) that can include a side view pattern (321, FIG. 3B) and a top view pattern (325, FIG. 3B). The BARC layers (315, FIG. 3B) can include photoresist material, anti-reflective coating (ARC) material, or bottom anti-reflective coating (BARC) material, or any combination thereof.

The previously created layers (311, FIG. 3B) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof.

The patterned (developed) layers (320, FIG. 3B) can be oriented relative to the X-axis and can include:

1b) a first isolated space feature ($S_{30}$, FIG. 3B) that can be located at the leftmost position of the first Developed M-PST pattern (321, FIG. 3B);

2b) a first isolated structure feature ($F_{30}$, FIG. 3B) that can be located on the right-hand side of the first isolated space feature ($S_{30}$, FIG. 3B);

3b) a second isolated space feature ($S_{31}$, FIG. 3B) that can be located on the right-hand side of the first isolated structure feature ($F_{30}$, FIG. 3B);

4b) a first dense structure feature ($F_{31}$, FIG. 3B) that can be located on the right-hand side of the second isolated space feature ($S_{31}$, FIG. 3B);

5b) a third isolated space feature ($S_{32}$, FIG. 3B) that can be located on the right-hand side of the first dense structure feature ($F_{31}$, FIG. 3B);

6b) a second dense structure feature ($F_{32}$, FIG. 3B) that can be located on the right-hand side of the third isolated space feature ($S_{32}$, FIG. 3B);

7b) a first dense space feature ($S_{33}$, FIG. 3B) that can be located on the right-hand side of the second dense structure feature ($F_{32}$, FIG. 3B);

8b) a third dense structure feature ($F_{33}$, FIG. 3B) that can be located on the right-hand side of the first dense space feature ($S_{33}$, FIG. 3B);

9b) a second dense space feature ($S_{34}$, FIG. 3B) that can be located on the right-hand side of the third dense structure feature ($F_{33}$, FIG. 3B);

10b) a fourth dense structure feature ($F_{34}$, FIG. 3B) that can be located on the right-hand side of the second dense space feature ($S_{34}$, FIG. 3B);

11b) a third dense space feature ($S_{35}$, FIG. 3B) that can be located on the right-hand side of the fourth dense structure feature ($F_{34}$, FIG. 3B);

12b) a fifth dense structure feature ($F_{35}$, FIG. 3B) that can be located on the right-hand side of the third dense space feature ($S_{35}$, FIG. 3B);

13b) a fourth dense space feature ($S_{36}$, FIG. 3B) that can be located on the right-hand side of the fifth dense structure feature ($F_{35}$, FIG. 3B);

14b) a sixth dense structure feature ($F_{36}$, FIG. 3B) that can be located on the right-hand side of the fourth dense space feature ($S_{36}$, FIG. 3B);

15b) a fifth dense space feature ($S_{37}$, FIG. 3B) that can be located on the right-hand side of the sixth dense structure feature ($F_{36}$, FIG. 3B);

16b) a seventh dense structure feature ($F_{37}$, FIG. 3B) that can be located on the right-hand side of the fifth dense space feature ($S_{37}$, FIG. 3B);

17b) a fourth isolated space feature ($S_{38}$, FIG. 3B) that can be located on the right-hand side of the seventh dense structure feature ($F_{37}$, FIG. 3B);

18b) an eighth dense structure feature ($F_{38}$, FIG. 3B) that can be located on the right-hand side of the fourth isolated space feature ($S_{38}$, FIG. 3B);

19b) a fifth isolated space feature ($S_{39}$, FIG. 3B) that can be located on the right-hand side of the eighth dense structure feature ($F_{38}$, FIG. 3B);

20b) a second isolated structure feature ($F_{39}$, FIG. 3B) that can be located on the right-hand side of the fifth isolated space feature ($S_{39}$, FIG. 3B); and 21b) a sixth isolated space feature ($S_{39a}$, FIG. 3B) that can be located on the right-hand side of the second isolated structure feature ($F_{39}$, FIG. 3B).

The first isolated space feature ($S_{30}$, FIG. 3B) can have a top CD ($d_{0a}$) and a bottom CD ($d_{0b}$); the second isolated space feature ($S_{31}$, FIG. 3B) can have a top CD ($d_{1a}$) and a bottom CD ($d_{1b}$); the third isolated space feature ($S_{32}$, FIG. 3B) can have a top CD ($d_{2a}$) and a bottom CD ($d_{2b}$); the first dense space feature ($S_{33}$, FIG. 3B) can have a top CD ($d_{3a}$) and a bottom CD ($d_{3b}$); the second dense space feature ($S_{34}$, FIG. 3B) can have a top CD ($d_{4a}$) and a bottom CD ($d_{4b}$); the third dense space feature ($S_{35}$, FIG. 3B) can have a top CD ($d_{5a}$) and a bottom CD ($d_{5b}$); the fourth dense space feature ($S_{36}$, FIG. 3B) can have a top CD ($d_{6a}$) and a bottom CD ($d_{6b}$); the fifth dense space feature ($S_{37}$, FIG. 3B) can have a top CD ($d_{7a}$) and a bottom CD ($d_{7b}$); the fourth isolated space feature ($S_{38}$, FIG. 3B) can have a top CD ($d_{8a}$) and a bottom CD ($d_{8b}$); the fifth isolated space feature ($S_{39}$, FIG. 3B) can have a top CD ($d_{9a}$) and a bottom CD ($d_{9b}$); and the sixth isolated space feature ($S_{39a}$, FIG. 3B) can have a top CD ($d_{10a}$) and a bottom CD ($d_{10b}$).

The top CD ($d_{0a}$) can range from approximately 10 nm to approximately 400 nm, and the bottom CD ($d_{0b}$) can range from approximately 5 nm to approximately 400 nm; the top CD ($d_{1a}$) can range from approximately 10 nm to approximately 400 nm, and the bottom CD ($d_{1b}$) can range from approximately 5 nm to approximately 400 nm; the top CD ($d_{2a}$) can range from approximately 10 nm to approximately 400 nm, and the bottom CD ($d_{2a}$) can range from approximately 5 nm to approximately 400 nm; the top CD ($d_{3a}$) can range from approximately 10 nm to approximately 100 nm, and the bottom CD ($d_{3b}$) can range from approximately 5 nm to approximately 100 nm; the top CD ($d_{4a}$) can range from approximately 10 nm to approximately 100 nm, and the bottom CD ($d_{4b}$) can range from approximately 5 nm to approximately 100 nm; the top CD ($d_{5a}$) can range from approximately 10 nm to approximately 100 nm, and the bottom CD ($d_{5b}$) can range from approximately 5 nm to approximately 100 nm; the top CD ($d_{6a}$) can range from approximately 10 nm to approximately 100 nm, and the bottom CD ($d_{6b}$) can range from approximately 5 nm to approximately 100 nm; the top CD ($d_{7a}$) can range from approximately 10 nm to approximately 100 nm, and the bottom CD ($d_{7b}$) can range from approximately 5 nm to approximately 100 nm; the top CD ($d_{8a}$) can range from approximately 10 nm to approximately 400 nm, and the bottom CD ($d_{8b}$) can range from approximately 5 nm to approximately 400 nm; the top CD ($d_{9a}$) can range from approximately 10 nm to approximately 400 nm, and the bottom CD ($d_{9b}$) can range from approximately 5 nm to approximately 400 nm; and the top CD ($d_{10a}$) can range from approximately 10 nm to approximately 400 nm, and the bottom CD ($d_{10b}$) can range from approximately 5 nm to approximately 400 nm.

The first isolated structure feature ($F_{30}$, FIG. 3B) can have a top CD ($w_{0a}$), a bottom CD ($w_{0b}$), a first SWA ($\alpha_{0a}$), and a second SWA ($\alpha_{0b}$); the first dense structure feature ($F_{31}$, FIG. 3B) can have a top CD ($w_{1a}$), a bottom CD ($w_{1b}$), a first SWA ($\alpha_{1a}$), and a second SWA ($\alpha_{1b}$); the second dense structure feature ($F_{32}$, FIG. 3B) can have a top CD ($w_{2a}$), a bottom CD ($w_{2b}$), a first SWA ($\alpha_{2a}$), and a second SWA ($\alpha_{2b}$); the third dense structure feature ($F_{33}$, FIG. 3B) can have a top CD ($w_{3a}$), a bottom CD ($w_{3b}$), a first SWA ($\alpha_{3a}$) and a second SWA ($\alpha_{3b}$); the fourth dense structure feature ($F_{34}$, FIG. 3B) can have a top CD ($w_{4a}$), a bottom CD ($w_{4b}$), a first SWA ($\alpha_{4a}$) and a second SWA ($\alpha_{4b}$); the fifth dense structure feature ($F_{35}$, FIG. 3B) can have a top CD ($w_{5a}$), a bottom CD ($w_{5b}$), a first SWA ($\alpha_{5a}$), and a second SWA ($\alpha_{5b}$); the sixth dense structure feature ($F_{36}$, FIG. 3B) can have a top CD ($w_{6a}$), a bottom CD ($w_{6b}$), a first SWA ($\alpha_{6a}$), and a second SWA ($\alpha_{6b}$); the seventh dense structure feature ($F_{37}$, FIG. 3B) can have a top CD ($w_{7a}$), a bottom CD ($w_{7b}$), a first SWA ($\alpha_{7a}$) and a second SWA ($\alpha_{7b}$); the eighth dense structure feature ($F_{38}$, FIG. 3B) can have a top CD ($w_{8a}$), a bottom CD ($w_{8b}$), a first SWA ($\alpha_{8a}$), and a second SWA ($\alpha_{8b}$); and the second isolated structure feature ($F_{39}$, FIG. 3B) can have a top CD ($w_{9a}$), a bottom CD ($w_{9b}$), a first SWA ($\alpha_{9a}$) and a second SWA ($\alpha_{9b}$).

The top CD ($w_{0a}$) can range from approximately 5 nm to approximately 500 nm, and the bottom CD ($w_{0b}$) can range from approximately 10 nm to approximately 500 nm; the top CD ($w_{1a}$) can range from approximately 5 nm to approximately 200 nm, and the bottom CD ($w_{1b}$) can range from approximately 10 nm to approximately 200 nm; the top CD ($w_{2a}$) can range from approximately 5 nm to approximately 200 nm, and the bottom CD ($w_{2b}$) can range from approximately 10 nm to approximately 200 nm; the top CD ($w_{3a}$) can range from approximately 5 nm to approximately 200 nm, and the bottom CD ($w_{3b}$) can range from approximately 10 nm to approximately 200 nm; the top CD ($w_{4a}$) can range from approximately 5 nm to approximately 200 nm, and the bottom CD ($w_{4b}$) can range from approximately 10 nm to approximately 200 nm; the top CD ($w_{5a}$) can range from approximately 5 nm to approximately 200 nm, and the bottom CD ($w_{5b}$) can range from approximately 10 nm to approximately 200 nm; the top CD ($w_{6a}$) can range from approximately 5 nm to approximately 200 nm, and the bottom CD ($w_{6b}$) can range from approximately 10 nm to approximately 200 nm; the top CD ($w_{7a}$) can range from approximately 5 nm to approximately 200 nm, and the bottom CD ($w_{7b}$) can range from approximately 10 nm to approximately 200 nm; the top CD ($w_{8a}$) can range from approximately 5 nm to approximately 200 nm, and the bottom CD ($w_{8b}$) can range from approximately 10 nm to approximately 200 nm; and the top CD ($w_{9a}$) can range from approximately 5 nm to approximately 500 nm, and the bottom CD ($w_{9b}$) can range from approximately 10 nm to approximately 500 nm.

Still referring to FIG. 3B, the first SWA ($\alpha_{0a}$) can range from approximately 80 degrees to approximately 99 degrees, and the second SWA ($\alpha_{0b}$) can range from approximately 88 degrees to approximately 92 degrees; the first SWA ($\alpha_{1a}$) can range from approximately 85 degrees to approximately 95 degrees, and the second SWA ($\alpha_{1b}$) can range from approximately 85 degrees to approximately 95 degrees; the first SWA ($\alpha_{2a}$) can range from approximately 85 degrees to approximately 95 degrees, and the second SWA ($\alpha_{2b}$) can range from approximately 85 degrees to approximately 95 degrees; the first SWA ($\alpha_{3a}$) can range from approximately 85 degrees to approximately 95 degrees, and the second SWA ($\alpha_{3b}$) can range from approximately 85 degrees to approximately 95 degrees; the first SWA ($\alpha_{4a}$) can range from approximately 85 degrees to approximately 95 degrees, and the second SWA ($\alpha_{4b}$) can range from approximately 85 degrees to approximately 95 degrees; the first SWA ($\alpha_{5a}$) can range from approximately 85 degrees to approximately 95 degrees, and the second SWA ($\alpha_{5b}$) can range from approximately 85 degrees to approximately 95 degrees; the first SWA ($\alpha_{6a}$) can range from approximately 85 degrees to approximately 95 degrees, and the second SWA ($\alpha_{6b}$) can range from approximately 85 degrees to approximately 95 degrees; the first SWA ($\alpha_{7a}$) can range from approximately 85 degrees to approximately 95 degrees, and the second SWA ($\alpha_{7b}$) can range from approximately 85 degrees to approximately 95 degrees; the first SWA ($\alpha_{8a}$) can range from approximately 85 degrees to approximately 95 degrees, and the second SWA ($\alpha_{8b}$) can range from approximately 85 degrees to approximately 95 degrees; and the first SWA ($\alpha_{9a}$) can range from approximately 80 degrees to approximately 99 degrees, and the second SWA ($\alpha_{9b}$) can range from approximately 80 degrees to approximately 99 degrees.

The thickness ($t_{30}$) of the first isolated structure feature ($F_{30}$) can range from approximately 10 nm to approximately 150 nm; the thickness ($t_{31}$) of the first dense structure feature ($F_{31}$) can range from approximately 10 nm to approximately 150 nm; the thickness ($t_{32}$) of the second dense structure feature ($F_{32}$,) can range from approximately 10 nm to approximately 150 nm; the thickness ($t_{33}$) of the third dense structure feature ($F_{33}$) can range from approximately 10 nm to approximately 150 nm; the thickness ($t_{34}$) of the fourth dense structure feature ($F_{34}$) can range from approximately 10 nm to approximately 150 nm; the thickness ($t_{35}$) of the fifth dense structure feature ($F_{35}$) can range from approximately 10 nm to approximately 150 nm; the thickness ($t_{36}$) of the sixth dense structure feature ($F_{36}$) can range from approximately 10 nm to approximately 150 nm; the thickness ($t_{37}$) of the seventh dense structure feature ($F_{37}$) can range from approximately 10 nm to approximately 150 nm; the thickness ($t_{38}$) of the eighth dense structure feature ($F_{38}$) can range from approximately 10 nm to approximately 150 nm; and the thickness ($t_{39}$) of the second isolated structure feature ($F_{39}$) can range from approximately 10 nm to approximately 150 nm.

FIG. 4A illustrates a second exemplary M-PST masking pattern in a second reticle/mask in accordance with embodiments of the invention. The second mask/reticle 400 can have a second M-PST pattern (401, FIG. 4A) integrated therein that can be illustrated using a plurality of opaque (dark) regions ($O_{47}$-$O_{48}$) and a plurality of transparent (light) regions ($T_{40}$-$T_{47}$) that can be used to create an exposure image. A top view pattern 402 for the second mask/reticle 400 is also shown in FIG. 4A. In addition, the second mask/reticle 400 may include one or more layout patterns (not shown) that can be used to create device structures, and one or more periodic patterns (not shown) that can be used to create periodic measurement structures. In alternate embodiments, the second mask/reticle 400 may include one or more target patterns (not shown) that can be used during alignment procedures in S-P, D-P, and D-E procedures.

The second exemplary M-PST masking pattern (401, FIG. 4A) can be oriented relative to the X-axis and can include:

1c) a first isolated transparent region ($T_{40}$, FIG. 4A) that can be located at the leftmost position of the second M-PST masking pattern (401, FIG. 4A);

2c) a first dense opaque region ($O_{40}$, FIG. 4A) that can be located on the right-hand side of the first isolated transparent region ($T_{40}$, FIG. 4A);

3c) a first dense transparent region ($T_{41}$, FIG. 4A) that can be located on the right-hand side of the first dense opaque region ($O_{40}$, FIG. 4A);

4c) a second dense opaque region ($O_{41}$, FIG. 4A) that can be located on the right-hand side of the first dense transparent region ($T_{41}$, FIG. 4A);

5c) a second isolated transparent region ($T_{42}$, FIG. 4A) that can be located on the right-hand side of the second dense opaque region ($O_{41}$, FIG. 4A);

6c) a third dense opaque region ($O_{42}$, FIG. 4A) that can be located on the right-hand side of the second isolated transparent region ($T_{42}$, FIG. 4A);

7c) a third isolated transparent region ($T_3$, FIG. 4A) that can be located on the right-hand side of the third dense opaque region ($O_{42}$, FIG. 4A);

8c) a first isolated opaque region ($O_{43}$, FIG. 4A) that can be located on the right-hand side of the third isolated transparent region ($T_{43}$, FIG. 4A);

9c) a fourth isolated transparent region ($T_{44}$, FIG. 4A) that can be located on the right-hand side of the fourth isolated opaque region ($O_{43}$, FIG. 4A);

10c) a second isolated opaque region ($O_{44}$, FIG. 4A) that can be located on the right-hand side of the second dense transparent region ($T_{44}$, FIG. 4A);

11a fifth isolated transparent region ($T_5$, FIG. 4A) that can be located on the right-hand side of the second isolated opaque region ($O_{44}$, FIG. 4A);

12c) a fourth dense opaque region ($O_5$, FIG. 4A) that can be located on the right-hand side of the fifth isolated transparent region ($T_{45}$, FIG. 4A);

13c) a sixth isolated transparent region ($T_{46}$, FIG. 4A) that can be located on the right-hand side of the fourth dense opaque region ($O_{45}$, FIG. 4A);

14c) a fifth dense opaque region ($O_{46}$, FIG. 4A) that can be located on the right-hand side of the sixth isolated transparent region ($T_{46}$, FIG. 4A);

15c) a second dense transparent region ($T_{47}$, FIG. 4A) that can be located on the right-hand side of the fifth dense opaque region ($O_{46}$, FIG. 4A);

16c) a sixth dense opaque region ($O_{47}$, FIG. 4A) that can be located on the right-hand side of the second dense transparent region ($T_{47}$, FIG. 4A); and 17c) a seventh isolated transparent region ($T_8$, FIG. 4A) that can be located on the right-hand side of the sixth dense opaque region ($O_{47}$, FIG. 4A).

The first isolated transparent region ($T_{40}$, FIG. 4A) can have a top CD ($x_{0a}$) and a bottom CD ($x_{0b}$); the first dense transparent region ($T_{41}$, FIG. 4A) can have a top CD ($x_{1a}$) and a bottom CD ($x_{1b}$); the second isolated transparent region ($T_{42}$, FIG. 4A) can have a top CD ($x_{2a}$) and a bottom CD ($x_{2b}$); the third isolated transparent region ($T_{43}$, FIG. 4A) can have a top CD ($x_{3a}$) and a bottom CD ($x_{3b}$); the second dense transparent region ($T_{44}$, FIG. 4A) can have a top CD ($x_{4a}$) and a bottom CD ($x_{4b}$); the fifth isolated transparent region ($T_{45}$, FIG. 4A) can have a top CD ($x_{5a}$) and a bottom CD ($x_{5b}$); the sixth isolated transparent region ($T_{46}$, FIG. 4A) can have a top CD ($x_{6a}$) and a bottom CD ($x_{6b}$); the second dense transparent region ($T_{47}$, FIG. 4A) can have a top CD ($x_{7a}$) and a bottom CD ($x_{7b}$); and the seventh isolated transparent region ($T_{48}$, FIG. 4A) can have a top CD ($x_{8a}$) and a bottom CD ($x_{8b}$).

The top CD ($x_{0a}$) can range from approximately 10 nm to approximately 400 nm, and the bottom CD ($x_{0b}$) can range from approximately 5 nm to approximately 400 nm; the top CD ($x_{1a}$) can range from approximately 10 nm to approximately 100 nm, and the bottom CD ($x_{1b}$) can range from approximately 5 nm to approximately 100 nm; the top CD ($x_{2a}$) can range from approximately 10 nm to approximately 400 nm, and the bottom CD ($x_{2b}$) can range from approximately 5 nm to approximately 400 nm; the top CD ($x_{3a}$) can range from approximately 10 nm to approximately 400 nm, and the bottom CD ($x_{3b}$) can range from approximately 5 nm to approximately 400 nm; the top CD ($x_{4a}$) can range from approximately 10 nm to approximately 100 nm, and the bottom CD ($x_{4b}$) can range from approximately 10 nm to approximately 400 nm; the top CD ($x_{5a}$) can range from approximately 10 nm to approximately 400 nm, and the bottom CD ($x_{5b}$) can range from approximately 5 nm to approximately 400 nm; the top CD ($x_{6a}$) can range from approximately 10 nm to approximately 100 nm, and the bottom CD ($x_{6b}$) can range from approximately 10 nm to approximately 400 nm; the top CD ($x_{7a}$) can range from approximately 10 nm to approximately 100 nm, and the bottom CD ($x_{7b}$) can range from approximately 5 nm to approximately 400 nm; and the top CD ($x_{8a}$) can range from approximately 10 nm to approximately 400 nm, and the bottom CD ($x_{8b}$) can range from approximately 5 nm to approximately 400 nm.

The first dense opaque region ($O_{40}$, FIG. 4A) can have a top CD ($I_{0a}$), a bottom CD ($I_{0b}$) a first SWA ($\theta_{0a}$), and a second SWA ($\theta_{0b}$); the second dense opaque region ($O_{41}$, FIG. 4A) can have a top CD ($I_{1a}$), a bottom CD ($I_{1b}$), a first SWA ($\theta_{1a}$), and a second SWA ($\theta_{1b}$); the third dense opaque region ($O_{42}$, FIG. 4A) can have a top CD ($I_{2a}$), a bottom CD ($I_{2b}$), a first SWA ($\theta_{2a}$), and a second SWA ($\theta_{2b}$); the first isolated opaque region ($O_{43}$, FIG. 4A) can have a top CD ($I_{3a}$), a bottom CD ($I_{3b}$), a first SWA ($\theta_{3a}$), and a second SWA ($\theta_{3b}$); the second isolated opaque region ($O_{44}$, FIG. 4A) can have a top CD ($I_{4a}$), a bottom CD ($I_{4b}$), a first SWA ($\theta_{4a}$), and a second SWA ($\theta_{4b}$); the fourth dense opaque region ($O_{45}$, FIG. 4A) can have a top CD ($I_{5a}$), a bottom CD ($I_{5b}$), a first SWA ($\theta_{5a}$), and a second SWA ($\theta_{5b}$); the fifth dense opaque region ($O_{46}$, FIG. 4A) can have a top CD ($I_{6a}$), a bottom CD ($I_{6b}$), a first SWA ($\theta_{6a}$), and a second SWA ($\theta_{6b}$); and the sixth dense opaque region ($O_{47}$, FIG. 4A) can have a top CD ($I_{7a}$), a bottom CD ($I_{7b}$), a first SWA ($\theta_{7a}$), and a second SWA ($\theta_{7b}$).

The top CD ($I_{0a}$) can range from approximately 5 nm to approximately 200 nm, and the bottom CD ($I_{0b}$) can range from approximately 10 nm to approximately 250 nm; the top CD ($I_{1a}$) can range from approximately 5 nm to approximately 200 nm, and the bottom CD ($I_{1b}$) can range from approximately 10 nm to approximately 250 nm; the top CD ($I_{2a}$) can range from approximately 5 nm to approximately 200 nm, and the bottom CD ($I_{2b}$) can range from approximately 10 nm to approximately 250 nm; the top CD ($I_{3a}$) can range from approximately 10 nm to approximately 500 nm, and the bottom CD ($I_{3b}$) can range from approximately 10 nm to approximately 550 nm; the top CD ($I_{4a}$) can range from approximately 10 nm to approximately 500 nm, and the bottom CD ($I_{4b}$) can range from approximately 10 nm to approximately 550 nm; the top CD ($l_{5a}$) can range from approximately 5 nm to approximately 200 nm, and the bottom CD ($l_{5b}$) can range from approximately 10 nm to approximately 250 nm; the top CD ($l_{6a}$) can range from approximately 5 nm to approximately 200 nm, and the bottom CD ($l_{6b}$) can range from approximately 10 nm to approximately 250 nm; and the top CD ($l_{7a}$) can range from approximately 5 nm to approximately 200 nm, and the bottom CD ($l_{7b}$) can range from approximately 10 nm to approximately 250 nm.

Still referring to FIG. 4A, the first SWA ($\theta_{0a}$) can range from approximately 80 degrees to approximately 99 degrees, and the second SWA ($\theta_{0b}$) can range from approximately 88 degrees to approximately 92 degrees; the first SWA ($\theta_{1a}$) can range from approximately 85 degrees to approximately 95 degrees, and the second SWA ($\theta_{1b}$) can range from approximately 85 degrees to approximately 95 degrees; the first SWA ($\theta_{2a}$) can range from approximately 85 degrees to approximately 95 degrees, and the second SWA ($\theta_{2b}$) can range from approximately 85 degrees to approximately 95 degrees; the first SWA ($\theta_{3a}$) can range from approximately 85 degrees to approximately 95 degrees, and the second SWA ($\theta_{3b}$) can range from approximately 85 degrees to approximately 95 degrees; the first SWA ($\theta_{4a}$) can range from approximately 85 degrees to approximately 95 degrees, and the second SWA ($\theta_{4b}$) can range from approximately 85 degrees to approximately 95 degrees; the first SWA ($\theta_{5a}$) can range from approximately 85 degrees to approximately 95 degrees, and the second SWA ($\theta_{5b}$) can range from approximately 85 degrees to approximately 95 degrees; the first SWA ($\theta_{6a}$) can range from approximately 85 degrees to approximately 95 degrees, and the second SWA ($\theta_{6b}$) can range from approximately 85 degrees to approximately 95 degrees; the first SWA ($\theta_{7a}$) can range from approximately 85 degrees to approximately 95 degrees, and the second SWA ($\theta_{7b}$) can range from approximately 85 degrees to approximately 95 degrees.

FIG. 4B illustrates a second exemplary patterned substrate comprising a second developed M-PST pattern in accordance with embodiments of the invention. When one or more substrates are processed using the second M-PST masking pattern (401, FIG. 4A), one or more patterned substrates (410, FIG. 4B) can be created. The patterned substrate (410, FIG. 4B) can include one or more previously created layers (411, FIG. 4B), one or more BARC layers (415, FIG. 4B), and one or more patterned (developed) layers (420, FIG. 4B) that can include a side view pattern (421, FIG. 4B) and a top view pattern (425, FIG. 4B). The BARC layers (415, FIG. 4B) can include photoresist material, anti-reflective coating (ARC) material, or bottom anti-reflective coating (BARC) material, or any combination thereof.

The previously created layers (411, FIG. 4B) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof.

The patterned (developed) layers (420, FIG. 4B) can be oriented relative to the X-axis and can include:

1d) a first isolated space feature ($S_{40}$, FIG. 4B) that can be located at the leftmost position of the second M-PST masking pattern (401, FIG. 4B);

2d) a first dense structure feature ($F_{40}$, FIG. 4B) that can be located on the right-hand side of the first isolated space feature ($S_{40}$, FIG. 4B);

3d) a first dense space feature ($S_{41}$, FIG. 4B) that can be located on the right-hand side of the first dense structure feature ($F_{40}$, FIG. 4B);

4d) a second dense structure feature ($F_{41}$, FIG. 4B) that can be located on the right-hand side of the first dense space feature ($S_{41}$, FIG. 4B);

5d) a second isolated space feature ($S_{42}$, FIG. 4B) that can be located on the right-hand side of the second dense structure feature ($F_{41}$, FIG. 4B);

6d) a third dense structure feature ($F_{42}$, FIG. 4B) that can be located on the right-hand side of the second isolated space feature ($S_{42}$, FIG. 4B);

7d) a third isolated space feature ($S_3$, FIG. 4B) that can be located on the right-hand side of the third dense structure feature ($F_{42}$, FIG. 4B);

8d) a first isolated structure feature ($F_{43}$, FIG. 4B) that can be located on the right-hand side of the third isolated space feature ($S_{43}$, FIG. 4B);

9d) a fourth isolated space feature ($S_4$, FIG. 4B) that can be located on the right-hand side of the fourth isolated structure feature ($F_{43}$, FIG. 4B);

10d) a second isolated structure feature ($F_{44}$, FIG. 4B) that can be located on the right-hand side of the second dense space feature ($S_{44}$, FIG. 4B);

11d) a fifth isolated space feature ($S_{45}$, FIG. 4B) that can be located on the right-hand side of the second isolated structure feature ($F_{44}$, FIG. 4B);

12d) a fourth dense structure feature ($F_{45}$, FIG. 4B) that can be located on the right-hand side of the fifth isolated space feature ($S_{45}$, FIG. 4B);

13d) a sixth isolated space feature ($S_{46}$, FIG. 4B) that can be located on the right-hand side of the fourth dense structure feature ($F_{45}$, FIG. 4B);

14d) a fifth dense structure feature ($F_{46}$, FIG. 4B) that can be located on the right-hand side of the sixth isolated space feature ($S_{46}$, FIG. 4B);

15d) a second dense space feature ($S_{47}$, FIG. 4B) that can be located on the right-hand side of the fifth dense structure feature ($F_{46}$, FIG. 4B);

16d) a sixth dense structure feature ($F_{47}$, FIG. 4B) that can be located on the right-hand side of the second dense space feature ($S_{47}$, FIG. 4B); and 17d) a seventh isolated space feature ($S_{48}$, FIG. 4B) that can be located on the right-hand side of the sixth dense structure feature ($F_{47}$, FIG. 4B).

The first isolated space feature ($S_{40}$, FIG. 4B) can have a top CD ($d_{0a}$) and a bottom CD ($d_{0b}$); the first dense space feature ($S_{41}$, FIG. 4B) can have a top CD ($d_{1a}$) and a bottom CD ($d_{1b}$); the second isolated space feature ($S_{42}$, FIG. 4B) can have a top CD ($d_{2a}$) and a bottom CD ($d_{2b}$); the third isolated space feature ($S_{43}$, FIG. 4B) can have a top CD ($d_{3a}$) and a bottom CD ($d_{3b}$); the second dense space feature ($S_{44}$, FIG. 4B) can have a top CD ($d_{4a}$) and a bottom CD ($d_{4b}$); the fifth isolated space feature ($S_{45}$, FIG. 4B) can have a top CD ($d_{5a}$) and a bottom CD ($d_{5b}$); the sixth isolated space feature ($S_{46}$, FIG. 4B) can have a top CD ($d_{6a}$) and a bottom CD ($d_{6b}$); the second dense space feature ($S_{47}$, FIG. 4B) can have a top CD ($d_{7a}$) and a bottom CD ($d_{7b}$); and the seventh isolated space feature ($S_{48}$, FIG. 4B) can have a top CD ($d_{8a}$) and a bottom CD ($d_{8b}$).

The top CD ($d_{0a}$) can range from approximately 10 nm to approximately 400 nm, and the bottom CD ($d_{0b}$) can range from approximately 5 nm to approximately 400 nm; the top CD ($d_{1a}$) can range from approximately 10 nm to approximately 100 nm, and the bottom CD ($d_{1b}$) can range from approximately 5 nm to approximately 100 nm; the top CD ($d_{2a}$) can range from approximately 10 nm to approximately 400 nm, and the bottom CD ($d_{2b}$) can range from approximately 5 nm to approximately 400 nm; the top CD ($d_{3a}$) can range from approximately 10 nm to approximately 400 nm, and the bottom CD ($d_{3b}$) can range from approximately 5 nm to approximately 400 nm; the top CD ($d_{4a}$) can range from approximately 10 nm to approximately 100 nm, and the bottom CD ($d_{4b}$) can range from approximately 10 nm to approximately 400 nm; the top CD ($d_{5a}$) can range from approximately 10 nm to approximately 400 nm, and the bottom CD ($d_{5b}$) can range from approximately 5 nm to approximately 400 nm; the top CD ($d_{6a}$) can range from approximately 10 nm to approximately 100 nm, and the bottom CD ($d_{6b}$) can range from approximately 10 nm to approximately 400 nm; the top CD ($d_{7a}$) can range from approximately 10 nm to approximately 100 nm, and the bottom CD ($d_{7b}$) can range from approximately 5 nm to approximately 400 nm; and the top CD ($d_{8a}$) can range from approximately 10 nm to approximately 400 nm, and the bottom CD ($d_{8b}$) can range from approximately 5 nm to approximately 400 nm.

The first dense structure feature ($F_{40}$, FIG. 4B) can have a top CD ($w_{0a}$), a bottom CD ($w_{0b}$), a first SWA ($\alpha_{0a}$), and a second SWA ($\alpha_{0b}$); the second dense structure feature ($F_{41}$, FIG. 4B) can have a top CD ($w_{1a}$), a bottom CD ($w_{1b}$), a first SWA ($\alpha_{1a}$), and a second SWA ($\alpha_{1b}$); the third dense structure feature ($F_{42}$, FIG. 4B) can have a top CD ($w_{2a}$), a bottom CD ($w_{2b}$), a first SWA ($\alpha_{2a}$), and a second SWA ($\alpha_{2b}$); the first isolated structure feature ($F_{43}$, FIG. 4B) can have a top CD ($w_{3a}$), a bottom CD ($w_{3b}$), a first SWA ($\alpha_{3a}$) and a second SWA ($\alpha_{3b}$); the second isolated structure feature ($F_{44}$, FIG. 4B) can have a top CD ($w_{4a}$), a bottom CD ($w_{4b}$), a first SWA ($\alpha_{4a}$) and a second SWA ($\alpha_{4b}$); the fourth dense structure feature ($F_{45}$, FIG. 4B) can have a top CD ($w_{5a}$), a bottom CD ($w_{5b}$), a first SWA ($\alpha_{5a}$) and a second SWA ($\alpha_{5b}$); the fifth dense structure feature ($F_{46}$, FIG. 4B) can have a top CD ($w_{6a}$), a bottom CD ($w_{6b}$), a first SWA ($\alpha_{6a}$), and a second SWA ($\alpha_{6b}$); and the sixth dense structure feature ($F_{47}$, FIG. 4B) can have a top CD ($w_{7a}$), a bottom CD ($w_{7b}$), a first SWA ($\alpha_{7a}$) and a second SWA ($\alpha_{7b}$).

The top CD ($w_{0a}$) can range from approximately 5 nm to approximately 200 nm, and the bottom CD ($w_{0b}$) can range from approximately 10 nm to approximately 250 nm; the top CD ($w_{1a}$) can range from approximately 5 nm to approximately 200 nm, and the bottom CD ($w_{1b}$) can range from approximately 10 nm to approximately 250 nm; the top CD ($w_{2a}$) can range from approximately 5 nm to approximately 200 nm, and the bottom CD ($w_{2b}$) can range from approximately 10 nm to approximately 250 nm; the top CD ($w_{3a}$) can range from approximately 10 nm to approximately 500 nm, and the bottom CD ($w_{3b}$) can range from approximately 10 nm to approximately 550 nm; the top CD ($w_{4a}$) can range from approximately 10 nm to approximately 500 nm, and the bottom CD ($w_{4b}$) can range from approximately 10 nm to approximately 550 nm; the top CD ($w_{5a}$) can range from approximately 5 nm to approximately 200 nm, and the bottom CD ($w_{5b}$) can range from approximately 10 nm to approximately 250 nm; the top CD ($w_{6a}$) can range from approximately 5 nm to approximately 200 nm, and the bottom CD ($w_{6b}$) can range from approximately 10 nm to approximately 250 nm; and the top CD ($w_{7a}$) can range from approximately 5 nm to approximately 200 nm, and the bottom CD ($w_{7b}$) can range from approximately 10 nm to approximately 250 nm.

Still referring to FIG. 4B, the first SWA ($\alpha_{0a}$) can range from approximately 80 degrees to approximately 99 degrees, and the second SWA ($\alpha_{0b}$) can range from approximately 88 degrees to approximately 92 degrees; the first SWA ($\alpha_{1a}$) can range from approximately 85 degrees to approximately 95 degrees, and the second SWA ($\alpha_{1b}$) can range from approximately 85 degrees to approximately 95 degrees; the first SWA ($\alpha_{2a}$) can range from approximately 85 degrees to approximately 95 degrees, and the second SWA ($\alpha_{2b}$) can range from approximately 85 degrees to approximately 95 degrees; the first SWA ($\alpha_{3a}$) can range from approximately 85 degrees to approximately 95 degrees, and the second SWA ($\alpha_{3b}$) can range from approximately 85 degrees to approximately 95 degrees; the first SWA ($\alpha_{4a}$) can range from approximately 85 degrees to approximately 95 degrees, and the second SWA ($\alpha_{4b}$) can range from approximately 85 degrees to approximately 95 degrees; the first SWA ($\alpha_{5a}$) can range from approximately 85 degrees to approximately 95 degrees, and the second SWA ($\alpha_{5b}$) can range from approximately 85 degrees to approximately 95 degrees; the first SWA ($\alpha_{6a}$) can range from approximately 85 degrees to approximately 95 degrees, and the second SWA ($\alpha_{6b}$) can range from approximately 85 degrees to approximately 95 degrees; the first SWA ($\alpha_{7a}$) can range from approximately 85 degrees to approximately 95 degrees, and the second SWA ($\alpha_{7b}$) can range from approximately 85 degrees to approximately 95 degrees.

Still referring to FIG. 4B, the thickness ($t_{40}$) of the first dense structure feature ($F_{40}$) can range from approximately 10 nm to approximately 150 nm; the thickness ($t_{41}$) of the second dense structure feature ($F_{41}$) can range from approximately 10 nm to approximately 150 nm; the thickness ($t_{42}$) of the third dense structure feature ($F_{42}$) can range from approximately 10 nm to approximately 150 nm; the thickness ($t_{43}$) of the first isolated structure feature ($F_{43}$) can range from approximately 10 nm to approximately 150 nm; the thickness ($t_{44}$) of the second isolated structure feature ($F_{44}$) can range from approximately 10 nm to approximately 150 nm; the thickness ($t_{45}$) of the fourth dense structure feature ($F_{45}$) can range from approximately 10 nm to approximately 150 nm; the thickness ($t_{46}$) of the fifth dense structure feature ($F_{46}$) can range from approximately 10 nm to approximately 150 nm; and the thickness ($t_{47}$) of the sixth dense structure feature ($F_{47}$) can range from approximately 10 nm to approximately 150 nm.

FIG. 5A illustrates a third exemplary M-PST masking pattern in a third reticle/mask in accordance with embodiments of the invention. The third mask/reticle 500 can have a third M-PST pattern (501, FIG. 5A) integrated therein that can be illustrated using a plurality of opaque (dark) regions ($O_{50}$-$O_{59}$) and a plurality of transparent (light) regions ($T_{50}$-$T_{59a}$) that can be used to create an exposure image. A top view pattern 502 for the third mask/reticle 500 is also shown in FIG. 5A. In addition, the third mask/reticle 500 may include one or more layout patterns (not shown) that can be used to create device structures, and one or more periodic patterns (not shown) that can be used to create periodic measurement structures. In alternate embodiments, the third mask/reticle 500 may include one or more target patterns (not shown) that can be used during alignment procedures in S-P, D-P, and D-E procedures.

The third exemplary M-PST masking pattern (501, FIG. 5A) can be oriented relative to the X-axis and can include:

1e) a first isolated transparent region ($T_{50}$, FIG. 5A) that can be located at the leftmost position of the third M-PST masking pattern (501, FIG. 5A);

2e) a first isolated opaque region ($O_{50}$, FIG. 5A) that can be located on the right-hand side of the first isolated transparent region ($T_{50}$, FIG. 5A);

3e) a second isolated transparent region ($T_{51}$, FIG. 5A) that can be located on the right-hand side of the first isolated opaque region ($O_{50}$, FIG. 5A);

4e) a first dense opaque region ($O_{51}$, FIG. 5A) that can be located on the right-hand side of the second isolated transparent region ($T_{51}$, FIG. 5A);

5e) a first dense transparent region ($T_{52}$, FIG. 5A) that can be located on the right-hand side of the first dense opaque region ($O_{51}$, FIG. 5A);

6e) a second dense opaque region ($O_{52}$, FIG. 5A) that can be located on the right-hand side of the first dense transparent region ($T_{52}$, FIG. 5A);

7e) a second dense transparent region ($T_{53}$, FIG. 5A) that can be located on the right-hand side of the second dense opaque region ($O_{52}$, FIG. 5A);

8e) a third dense opaque region ($O_{53}$, FIG. 5A) that can be located on the right-hand side of the second dense transparent region ($T_{53}$, FIG. 5A);

9e) a third dense transparent region ($T_{54}$, FIG. 5A) that can be located on the right-hand side of the third dense opaque region ($O_{53}$, FIG. 5A);

10e) a fourth dense opaque region ($O_{54}$, FIG. 5A) that can be located on the right-hand side of the third dense transparent region ($T_{54}$, FIG. 5A);

11e) a fourth dense transparent region ($T_{55}$, FIG. 5A) that can be located on the right-hand side of the fourth dense opaque region ($O_{54}$, FIG. 5A);

12e) a fifth dense opaque region ($O_{55}$, FIG. 5A) that can be located on the right-hand side of the fourth dense transparent region ($T_{55}$, FIG. 5A);

13e) a fifth dense transparent region ($T_{56}$, FIG. 5A) that can be located on the right-hand side of the fifth dense opaque region ($O_{55}$, FIG. 5A);

14e) a sixth dense opaque region ($O_{56}$, FIG. 5A) that can be located on the right-hand side of the fifth dense transparent region ($T_{56}$, FIG. 5A);

15e) a sixth dense transparent region ($T_{57}$, FIG. 5A) that can be located on the right-hand side of the sixth dense opaque region ($O_{56}$, FIG. 5A);

16e) a seventh dense opaque region ($O_{57}$, FIG. 5A) that can be located on the right-hand side of the sixth dense transparent region ($T_{57}$, FIG. 5A);

17e) a seventh dense transparent region ($T_{58}$, FIG. 5A) that can be located on the right-hand side of the seventh dense opaque region ($O_{57}$, FIG. 5A);

18e) an eighth dense opaque region ($O_{58}$, FIG. 5A) that can be located on the right-hand side of the seventh dense transparent region ($T_{58}$, FIG. 5A);

19e) a third isolated transparent region ($T_{59}$, FIG. 5A) that can be located on the right-hand side of the eighth dense opaque region ($O_{58}$, FIG. 5A);

20e) a second isolated opaque region ($O_{59}$, FIG. 5A) that can be located on the right-hand side of the fifth isolated transparent region ($T_{59}$, FIG. 5A); and 21e) a fourth isolated transparent region ($T_{59a}$, FIG. 5A) that can be located on the right-hand side of the second isolated opaque region ($O_{59}$, FIG. 5A).

The first isolated transparent region ($T_{50}$, FIG. 5A) can have a top CD ($x_{0a}$) and a bottom CD ($x_{0b}$); the second isolated transparent region ($T_{51}$, FIG. 5A) can have a top CD ($x_{1a}$) and a bottom CD ($x_{1b}$); the first dense transparent region ($T_{52}$, FIG. 5A) can have a top CD ($x_{2a}$) and a bottom CD ($x_{2b}$); the second dense transparent region ($T_{53}$, FIG. 5A) can have a top CD ($x_{3a}$) and a bottom CD ($x_{3b}$); the third dense transparent region ($T_{54}$, FIG. 5A) can have a top CD ($x_{4a}$) and a bottom CD ($x_{4b}$); the fourth dense transparent region ($T_{55}$, FIG. 5A) can have a top CD ($x_{5a}$) and a bottom CD ($x_{5b}$); the fifth dense transparent region ($T_{56}$, FIG. 5A) can have a top CD ($x_{6a}$) and a bottom CD ($x_{6b}$); the sixth dense transparent region ($T_{57}$, FIG. 5A) can have a top CD ($x_{7a}$) and a bottom CD ($x_{7b}$); the seventh dense transparent region ($T_{58}$, FIG. 5A) can have a top CD ($x_{8a}$) and a bottom CD ($x_{8b}$); the third isolated transparent region ($T_{59}$, FIG. 5A) can have a top CD ($x_{9a}$) and a bottom CD ($x_{9b}$); and the fourth isolated transparent region ($T_{59a}$, FIG. 5A) can have a top CD ($x_{10a}$) and a bottom CD ($x_{10b}$).

The top CD ($x_{0a}$) can range from approximately 10 nm to approximately 400 nm, and the bottom CD ($x_{0b}$) can range from approximately 5 nm to approximately 400 nm; the top CD ($x_{1a}$) can range from approximately 10 nm to approximately 200 nm, and the bottom CD ($x_{1b}$) can range from approximately 5 nm to approximately 200 nm; the top CD ($x_{2a}$) can range from approximately 10 nm to approximately 200 nm, and the bottom CD ($x_{2b}$) can range from approximately 5 nm to approximately 200 nm; the top CD ($x_{3a}$) can range from approximately 10 nm to approximately 200 nm, and the bottom CD ($x_{3b}$) can range from approximately 5 nm to approximately 200 nm; the top CD ($x_{4a}$) can range from approximately 10 nm to approximately 200 nm, and the bottom CD ($x_{4b}$) can range from approximately 5 nm to approximately 200 nm; the top CD ($x_{5a}$) can range from approximately 10 nm to approximately 200 nm, and the bottom CD ($x_{5b}$) can range from approximately 5 nm to approximately 200 nm; the top CD ($x_{6a}$) can range from approximately 10 nm to approximately 200 nm, and the bottom CD ($x_{6b}$) can range from approximately 5 nm to approximately 200 nm; the top CD ($x_{7a}$) can range from approximately 10 nm to approximately 200 nm, and the bottom CD ($x_{7b}$) can range from approximately 5 nm to approximately 200 nm; the top CD ($x_{8a}$) can range from approximately 10 nm to approximately 200 nm, and the bottom CD ($x_{8b}$) can range from approximately 5 nm to approximately 200 nm; the top CD ($x_{9a}$) can range from approximately 10 nm to approximately 400 nm, and the bottom CD ($x_{9b}$) can range from approximately 5 nm to approximately 400 nm; and the top CD ($x_{10a}$) can range from approximately 10 nm to approximately 400 nm, and the bottom CD ($x_{10b}$) can range from approximately 5 nm to approximately 400 nm.

The first isolated opaque region ($O_{50}$, FIG. 5A) can have a top CD ($I_{0a}$), a bottom CD ($I_{0b}$), a first SWA ($\theta_{0a}$), and a second SWA ($\theta_{0b}$); the first dense opaque region ($O_{51}$, FIG. 5A) can have a top CD ($I_{1a}$), a bottom CD ($I_{1b}$), a first SWA ($\theta_{1a}$), and a second SWA ($\theta_{1b}$); the second dense opaque region ($O_{52}$, FIG. 5A) can have a top CD ($I_{2a}$), a bottom CD ($I_{2b}$), a first SWA ($\theta_{2a}$), and a second SWA ($\theta_{2b}$); the third dense opaque region ($O_{53}$, FIG. 5A) can have a top CD ($I_{3a}$), a bottom CD ($I_{3b}$), a first SWA ($\theta_{3a}$), and a second SWA ($\theta_{3b}$); the fourth dense opaque region ($O_{54}$, FIG. 5A) can have a top CD ($I_{4a}$), a bottom CD ($I_{4b}$), a first SWA ($\theta_{4a}$), and a second SWA ($\theta_{4b}$); the fifth dense opaque region ($O_{55}$, FIG. 5A) can have a top CD ($I_{5a}$), a bottom CD ($I_{5b}$), a first SWA ($\theta_{5a}$), and a second SWA ($\theta_{5b}$); the sixth dense opaque region ($O_{56}$, FIG. 5A) can have a top CD ($I_{6a}$), a bottom CD ($I_{6b}$) a first SWA ($\theta_{6a}$), and a second SWA ($\theta_{6b}$); the seventh dense opaque region ($O_{57}$, FIG. 5A) can have a top CD ($I_{7a}$), a bottom CD ($I_{7b}$), a first SWA ($\theta_{7a}$), and a second SWA ($\theta_{7b}$); the eighth dense opaque region ($O_{58}$, FIG. 5A) can have a top CD ($I_{8a}$), a bottom CD ($I_{8b}$), a first SWA ($\theta_{8a}$), and a second SWA ($\theta_{8b}$); and the second isolated opaque region ($O_{59}$, FIG. 5A) can have a top CD ($I_{9a}$), a bottom CD ($I_{9b}$), a first SWA ($\theta_{9a}$), and a second SWA ($\theta_{9b}$);

The top CD ($I_{0a}$) can range from approximately 5 nm to approximately 500 nm, and the bottom CD ($I_{0b}$) can range from approximately 10 nm to approximately 550 nm; the top CD ($I_{1a}$) can range from approximately 5 nm to approximately 200 nm, and the bottom CD ($I_{1b}$) can range from approximately 10 nm to approximately 250 nm; the top CD ($I_{2a}$) can range from approximately 5 nm to approximately 200 nm, and the bottom CD ($I_{2b}$) can range from approximately 10 nm to approximately 250 nm; the top CD ($I_{3a}$) can range from approximately 5 nm to approximately 200 nm, and the bottom CD ($I_{3b}$) can range from approximately 10 nm to approximately 250 nm; the top CD ($I_{4a}$) can range from approximately 5 nm to approximately 200 nm, and the bottom CD ($I_{4b}$) can range from approximately 10 nm to approximately 250 nm; the top CD ($I_{5a}$) can range from approximately 5 nm to approximately 200 nm, and the bottom CD ($I_{5b}$) can range from approximately 10 nm to approximately 250 nm; the top CD ($I_{6a}$) can range from approximately 5 nm to approximately 200 nm, and the bottom CD ($I_{6b}$) can range from approximately 10 nm to approximately 250 nm; the top CD ($I_{7a}$) can range from approximately 5 nm to approximately 200 nm, and the bottom CD ($I_{7b}$) can range from approximately 10 nm to approximately 250 nm; the top CD ($I_{8a}$) can range from approximately 5 nm to approximately 200 nm, and the bottom CD ($I_{8b}$) can range from approximately 10 nm to approximately 250 nm; and the top CD ($I_{9a}$) can range from approximately 5 nm to approximately 500 nm, and the bottom CD ($I_{9b}$) can range from approximately 10 nm to approximately 550 nm.

Still referring to FIG. 5A, the first SWA ($\theta_{0a}$) can range from approximately 80 degrees to approximately 99 degrees, and the second SWA ($\theta_{0b}$) can range from approximately 88 degrees to approximately 92 degrees; the first SWA ($\theta_{1a}$) can range from approximately 85 degrees to approximately 95 degrees, and the second SWA ($\theta_{1b}$) can range from approximately 85 degrees to approximately 95 degrees; the first SWA ($\theta_{2a}$) can range from approximately 85 degrees to approximately 95 degrees, and the second SWA ($\theta_{2b}$) can range from approximately 85 degrees to approximately 95 degrees; the first SWA ($\theta_{3a}$) can range from approximately 85 degrees to approximately 95 degrees, and the second SWA ($\theta_{3b}$) can range from approximately 85 degrees to approximately 95 degrees; the first SWA ($\theta_{4a}$) can range from approximately 85 degrees to approximately 95 degrees, and the second SWA ($\theta_{4b}$) can range from approximately 85 degrees to approximately 95 degrees; the first SWA ($\theta_{5a}$) can range from approximately 85 degrees to approximately 95 degrees, and the second SWA ($\theta_{5b}$) can range from approximately 85 degrees to approximately 95 degrees; the first SWA ($\theta_{6a}$) can range from approximately 85 degrees to approximately 95 degrees, and the second SWA ($\theta_{6b}$) can range from approximately 85 degrees to approximately 95 degrees; the first SWA ($\theta_{7a}$) can range from approximately 85 degrees to approximately 95 degrees, and the second SWA ($\theta_{7b}$) can range from approximately 85 degrees to approximately 95 degrees; the first SWA ($\theta_{8a}$) can range from approximately 85 degrees to approximately 95 degrees, and the second SWA ($\theta_{8b}$) can range from approximately 85 degrees to approximately 95 degrees; and the first SWA ($\theta_{9a}$) can range from approximately 80 degrees to approximately 99 degrees, and the second SWA ($\theta_{9b}$) can range from approximately 80 degrees to approximately 99 degrees.

FIG. 5B illustrates a third exemplary patterned substrate comprising a third developed M-PST pattern in accordance with embodiments of the invention. When one or more substrates are processed using the third M-PST masking pattern (501, FIG. 5A), one or more patterned substrates (510, FIG. 5B) can be created. The patterned substrate (510, FIG. 5B) can include one or more previously created layers (511, FIG. 5B), one or more BARC layers (515, FIG. 5B), and one or more patterned (developed) layers (520, FIG. 3B) that can include a side view pattern (521, FIG. 3B) and a top view pattern (525, FIG. 5B). The BARC layers (515, FIG. 5B) can include photoresist material, anti-reflective coating (ARC) material, or bottom anti-reflective coating (BARC) material, or any combination thereof.

The previously created layers (511, FIG. 5B) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof.

The patterned (developed) layers (520, FIG. 5B) can be oriented relative to the X-axis and can include:

1f) a first isolated space feature ($S_{50}$, FIG. 5B) that can be located at the leftmost position of the first M-PST masking pattern (521, FIG. 5B);

2f) a first isolated structure feature ($F_{50}$, FIG. 5B) that can be located on the right-hand side of the first isolated space feature ($S_{50}$, FIG. 5B);

3f) a second isolated space feature ($S_{51}$, FIG. 5B) that can be located on the right-hand side of the first isolated structure feature ($F_{50}$, FIG. 5B);

4f) a first dense structure feature ($F_{51}$, FIG. 5B) that can be located on the right-hand side of the second isolated space feature ($S_{51}$, FIG. 5B);

5f) a first dense space feature ($S_{52}$, FIG. 5B) that can be located on the right-hand side of the first dense structure feature ($F_{51}$, FIG. 5B);

6f) a second dense structure feature ($F_{52}$, FIG. 5B) that can be located on the right-hand side of the first dense space feature ($S_{52}$, FIG. 5B);

7f) a second dense space feature ($S_{53}$, FIG. 5B) that can be located on the right-hand side of the second dense structure feature ($F_{52}$, FIG. 5B);

8f) a third dense structure feature ($F_{53}$, FIG. 5B) that can be located on the right-hand side of the second dense space feature ($S_{53}$, FIG. 5B);

9f) a third dense space feature ($S_{54}$, FIG. 5B) that can be located on the right-hand side of the third dense structure feature ($F_{53}$, FIG. 5B);

10f) a fourth dense structure feature ($F_{54}$, FIG. 5B) that can be located on the right-hand side of the third dense space feature ($S_{54}$, FIG. 5B);

11f) a fourth dense space feature ($S_{55}$, FIG. 5B) that can be located on the right-hand side of the fourth dense structure feature ($F_{54}$, FIG. 5B);

12f) a fifth dense structure feature ($F_{55}$, FIG. 5B) that can be located on the right-hand side of the fourth dense space feature ($S_{55}$, FIG. 5B);

13f) a fifth dense space feature ($S_{56}$, FIG. 5B) that can be located on the right-hand side of the fifth dense structure feature ($F_{55}$, FIG. 5B);

14f) a sixth dense structure feature ($F_{56}$, FIG. 5B) that can be located on the right-hand side of the fifth dense space feature ($S_{56}$, FIG. 5B);

15f) a sixth dense space feature ($S_{57}$, FIG. 5B) that can be located on the right-hand side of the sixth dense structure feature ($F_{56}$, FIG. 5B);

16f) a seventh dense structure feature ($F_{57}$, FIG. 5B) that can be located on the right-hand side of the sixth dense space feature ($S_{57}$, FIG. 5B);

17f) a seventh dense space feature ($S_{58}$, FIG. 5B) that can be located on the right-hand side of the seventh dense structure feature ($F_{57}$, FIG. 5B);

18f) an eighth dense structure feature ($F_{58}$, FIG. 5B) that can be located on the right-hand side of the seventh dense space feature ($S_{58}$, FIG. 5B);

19f) a third isolated space feature ($S_{59}$, FIG. 5B) that can be located on the right-hand side of the eighth dense structure feature ($F_{58}$, FIG. 5B);

20f) a second isolated structure feature ($F_{59}$, FIG. 5B) that can be located on the right-hand side of the fifth isolated space feature ($S_{59}$, FIG. 5B); and 21f) a fourth isolated space feature ($S_{59a}$, FIG. 5B) that can be located on the right-hand side of the second isolated structure feature ($F_{59}$, FIG. 5B).

The first isolated space feature ($S_{50}$, FIG. 5B) can have a top CD ($x_{0a}$) and a bottom CD ($x_{0b}$); the second isolated space feature ($S_{51}$, FIG. 5B) can have a top CD ($x_{1a}$) and a bottom CD ($x_{1b}$); the first dense space feature ($S_{52}$, FIG. 5B) can have a top CD ($x_{2a}$) and a bottom CD ($x_{2b}$); the second dense space feature ($S_{53}$, FIG. 5B) can have a top CD ($x_{3a}$) and a bottom CD ($x_{3b}$); the third dense space feature ($S_{54}$, FIG. 5B) can have a top CD ($x_{4a}$) and a bottom CD ($x_{4b}$); the fourth dense space feature ($S_{55}$, FIG. 5B) can have a top CD ($x_{5a}$) and a bottom CD ($x_{5b}$); the fifth dense space feature ($S_{56}$, FIG. 5B) can have a top CD ($x_{6a}$) and a bottom CD ($x_{6b}$); the sixth dense space feature ($S_{57}$, FIG. 5B) can have a top CD ($x_{7a}$) and a bottom CD ($x_{7b}$); the seventh dense space feature ($S_{58}$, FIG. 5B) can have a top CD ($x_{8a}$) and a bottom CD ($x_{8b}$); the third isolated space feature ($S_{59}$, FIG. 5B) can have a top CD ($x_{9a}$) and a bottom CD ($x_{9b}$); and the fourth isolated space feature ($S_{59a}$, FIG. 5B) can have a top CD ($x_{10a}$) and a bottom CD ($x_{10b}$).

The top CD ($x_{0a}$) can range from approximately 10 nm to approximately 400 nm, and the bottom CD ($x_{0b}$) can range from approximately 5 nm to approximately 400 nm; the top CD ($x_{1a}$) can range from approximately 10 nm to approximately 200 nm, and the bottom CD ($x_{1b}$) can range from approximately 5 nm to approximately 200 nm; the top CD ($x_{2a}$) can range from approximately 10 nm to approximately 200 nm, and the bottom CD ($x_{2b}$) can range from approximately 5 nm to approximately 200 nm; the top CD ($x_{3a}$) can range from approximately 10 nm to approximately 200 nm, and the bottom CD ($x_{3b}$) can range from approximately 5 nm to approximately 200 nm; the top CD ($x_{4a}$) can range from approximately 10 nm to approximately 200 nm, and the bottom CD ($x_{4b}$) can range from approximately 5 nm to approximately 200 nm; the top CD ($x_{5a}$) can range from approximately 10 nm to approximately 200 nm, and the bottom CD ($x_{5b}$) can range from approximately 5 nm to approximately 200 nm; the top CD ($x_{6a}$) can range from approximately 10 nm to approximately 200 nm, and the bottom CD ($x_{6b}$) can range from approximately 5 nm to approximately 200 nm; the top CD ($x_{7a}$) can range from approximately 10 nm to approximately 200 nm, and the bottom CD ($x_{7b}$) can range from approximately 5 nm to approximately 200 nm; the top CD ($x_{8a}$) can range from approximately 10 nm to approximately 200 nm, and the bottom CD ($x_{8b}$) can range from approximately 5 nm to approximately 200 nm; the top CD ($x_{9a}$) can range from approximately 10 nm to approximately 400 nm, and the bottom CD ($x_{9b}$) can range from approximately 5 nm to approximately 400 nm; and the top CD ($x_{10a}$) can range from approximately 10 nm to approximately 400 nm, and the bottom CD ($x_{10b}$) can range from approximately 5 nm to approximately 400 nm.

The first isolated structure feature ($F_{50}$, FIG. 5B) can have a top CD ($w_{0a}$), a bottom CD ($w_{0b}$), a first SWA ($\alpha_{0a}$), and a second SWA ($\alpha_{0b}$); the first dense structure feature ($F_{51}$, FIG. 5B) can have a top CD ($w_{1a}$), a bottom CD ($w_{1b}$), a first SWA ($\alpha_{1a}$), and a second SWA ($\alpha_{1b}$); the second dense structure feature ($F_{52}$, FIG. 5B) can have a top CD ($w_{2a}$), a bottom CD ($w_{2b}$), a first SWA ($\alpha_{2a}$), and a second SWA ($\alpha_{2b}$); the third dense structure feature ($F_{53}$, FIG. 5B) can have a top CD ($w_{3a}$), a bottom CD ($w_{3b}$), a first SWA ($\alpha_{3a}$) and a second SWA ($\alpha_{3b}$); the fourth dense structure feature ($F_{54}$, FIG. 5B) can have a top CD ($w_{4a}$), a bottom CD ($w_{4b}$), a first SWA ($\alpha_{4a}$) and a second SWA ($\alpha_{4b}$); the fifth dense structure feature ($F_{55}$, FIG. 5B) can have a top CD ($w_{5a}$), a bottom CD ($w_{5b}$), a first SWA ($\alpha_{5a}$), and a second SWA ($\alpha_{5b}$); the sixth dense structure feature ($F_{56}$, FIG. 5B) can have a top CD ($w_{6a}$), a bottom CD ($w_{6b}$), a first SWA ($\alpha_{6a}$), and a second SWA ($\alpha_{6b}$); the seventh dense structure feature ($F_{57}$, FIG. 5B) can have a top CD ($w_{7a}$), a bottom CD ($w_{7b}$), a first SWA ($\alpha_{7a}$) and a second SWA ($\alpha_{7b}$); the eighth dense structure feature ($F_{58}$, FIG. 5B) can have a top CD ($w_{8a}$), a bottom CD ($w_{8b}$), a first SWA ($\alpha_{8a}$), and a second SWA ($\alpha_{8b}$); and the second isolated structure feature ($F_{59}$, FIG. 5B) can have a top CD ($w_{9a}$), a bottom CD ($w_{9b}$), a first SWA ($\alpha_{9a}$) and a second SWA ($\alpha_{9b}$);

The top CD ($w_{0a}$) can range from approximately 5 nm to approximately 500 nm, and the bottom CD ($w_{0b}$) can range from approximately 10 nm to approximately 550 nm; the top CD ($w_{1a}$) can range from approximately 5 nm to approximately 200 nm, and the bottom CD ($w_{1b}$) can range from approximately 10 nm to approximately 250 nm; the top CD ($w_{2a}$) can range from approximately 5 nm to approximately 200 nm, and the bottom CD ($w_{2b}$) can range from approximately 10 nm to approximately 250 nm; the top CD ($w_{3a}$) can range from approximately 5 nm to approximately 200 nm, and the bottom CD ($w_{3b}$) can range from approximately 10 nm to approximately 250 nm; the top CD ($w_{4a}$) can range from approximately 5 nm to approximately 200 nm, and the bottom CD ($w_{4b}$) can range from approximately 10 nm to approximately 250 nm; the top CD ($w_{5a}$) can range from approximately 5 nm to approximately 200 nm, and the bottom CD ($w_{5b}$) can range from approximately 10 nm to approximately 250 nm; the top CD ($w_{6a}$) can range from approximately 5 nm to approximately 200 nm, and the bottom CD ($w_{6b}$) can range from approximately 10 nm to approximately 250 nm; the top CD ($w_{7a}$) can range from approximately 5 nm to approximately 200 nm, and the bottom CD ($w_{7b}$) can range from approximately 10 nm to approximately 250 nm; the top CD ($w_{8a}$) can range from approximately 5 nm to approximately 200 nm, and the bottom CD ($w_{8b}$) can range from approximately 10 nm to approximately 250 nm; and the top CD ($w_{9a}$) can range from approximately 5 nm to approximately 500 nm, and the bottom CD ($w_{9b}$) can range from approximately 10 nm to approximately 550 nm.

Still referring to FIG. 5B, the first SWA ($\alpha_{0a}$) can range from approximately 80 degrees to approximately 99 degrees, and the second SWA ($\alpha_{0b}$) can range from approximately 88 degrees to approximately 92 degrees; the first SWA ($\alpha_{1a}$) can range from approximately 85 degrees to approximately 95 degrees, and the second SWA ($\alpha_{1b}$) can range from approximately 85 degrees to approximately 95 degrees; the first SWA ($\alpha_{2a}$) can range from approximately 85 degrees to approximately 95 degrees, and the second SWA ($\alpha_{2b}$) can range from approximately 85 degrees to approximately 95 degrees; the first SWA ($\alpha_{3a}$) can range from approximately 85 degrees to approximately 95 degrees, and the second SWA ($\alpha_{3b}$) can range from approximately 85 degrees to approximately 95 degrees; the first SWA ($\alpha_{4a}$) can range from approximately 85 degrees to approximately 95 degrees, and the second SWA ($\alpha_{4b}$) can range from approximately 85 degrees to approximately 95 degrees; the first SWA ($\alpha_{5a}$) can range from approximately 85 degrees to approximately 95 degrees, and the second SWA ($\alpha_{5b}$) can range from approximately 85 degrees to approximately 95 degrees; the first SWA ($\alpha_{6a}$) can range from approximately 85 degrees to approximately 95 degrees, and the second SWA ($\alpha_{6b}$) can range from approximately 85 degrees to approximately 95 degrees; the first SWA ($\alpha_{7a}$) can range from approximately 85 degrees to approximately 95 degrees, and the second SWA ($\alpha_{7b}$) can range from approximately 85 degrees to approximately 95 degrees; the first SWA ($\alpha_{8a}$) can range from approximately 85 degrees to approximately 95 degrees, and the second SWA ($\alpha_{8b}$) can range from approximately 85 degrees to approximately 95 degrees; and the first SWA ($\alpha_{9a}$) can range from approximately 80 degrees to approximately 99 degrees, and the second SWA ($\alpha_{9b}$) can range from approximately 80 degrees to approximately 99 degrees.

The thickness ($t_{50}$) of the first isolated structure feature ($F_{50}$) can range from approximately 10 nm to approximately 150 nm; the thickness ($t_{51}$) of the first dense structure feature ($F_{51}$) can range from approximately 10 nm to approximately 150 nm; the thickness ($t_{52}$) of the second dense structure feature ($F_{52}$) can range from approximately 10 nm to approximately 150 nm; the thickness ($t_{53}$) of the third dense structure feature ($F_{53}$) can range from approximately 10 nm to approximately 150 nm; the thickness ($t_{54}$) of the fourth dense structure feature ($F_{54}$) can range from approximately 10 nm to approximately 150 nm; the thickness ($t_{55}$) of the fifth dense structure feature ($F_{55}$) can range from approximately 10 nm to approximately 150 nm; the thickness ($t_{56}$) of the sixth dense structure feature ($F_{56}$) can range from approximately 10 nm to approximately 150 nm; the thickness ($t_{57}$) of the seventh dense structure feature ($F_{57}$) can range from approximately 10 nm to approximately 150 nm; the thickness ($t_{58}$) of the eighth dense structure feature ($F_{58}$) can range from approximately 10 nm to approximately 150 nm; and the thickness ($t_{59}$) of the second isolated structure feature ($F_{59}$) can range from approximately 10 nm to approximately 150 nm.

FIG. 6A illustrates a third exemplary M-PST masking pattern in a fourth reticle/mask in accordance with embodiments of the invention. The fourth mask/reticle 600 can have a fourth M-PST pattern (601, FIG. 6A) integrated therein that can be illustrated using a plurality of opaque (dark) regions ($O_{60}$-$O_{70}$) and a plurality of transparent (light) regions ($T_{60}$-$T_{71}$) that can be used to create an exposure image. A top view pattern 602 for the fourth mask/reticle 600 is also shown in FIG. 6A. In addition, the fourth mask/reticle 600 may include one or more layout patterns (not shown) that can be used to create device structures, and one or more periodic patterns (not shown) that can be used to create periodic measurement structures. In alternate embodiments, the fourth mask/reticle 600 may include one or more target patterns (not shown) that can be used during alignment procedures in S-P, D-P, and D-E procedures.

The fourth exemplary M-PST masking pattern (601, FIG. 6A) can be oriented relative to the X-axis and can include:

1g) a first isolated transparent region ($T_{60}$, FIG. 6A) that can be located at the leftmost position of the fourth M-PST masking pattern (601, FIG. 6A);

2g) a first dense opaque region ($O_{60}$, FIG. 6A) that can be located on the right-hand side of the first isolated transparent region ($T_{60}$, FIG. 6A);

3g) a first dense transparent region ($T_{61}$, FIG. 6A) that can be located on the right-hand side of the first dense opaque region ($O_{60}$, FIG. 6A);

4g) a second dense opaque region ($O_{61}$, FIG. 6A) that can be located on the right-hand side of the first dense transparent region ($T_{61}$, FIG. 6A);

5g) a second dense transparent region ($T_{62}$, FIG. 6A) that can be located on the right-hand side of the second dense opaque region ($O_{61}$, FIG. 6A);

6g) a third dense opaque region ($O_{62}$, FIG. 6A) that can be located on the right-hand side of the second dense transparent region ($T_{62}$, FIG. 6A);

7g) a second isolated transparent region ($T_{63}$, FIG. 6A) that can be located on the right-hand side of the third dense opaque region ($O_{62}$, FIG. 6A);

8g) a fourth dense opaque region ($O_{63}$, FIG. 6A) that can be located on the right-hand side of the second isolated transparent region ($T_{63}$, FIG. 6A);

9g) a third isolated transparent region ($T_{64}$, FIG. 6A) that can be located on the right-hand side of the fourth dense opaque region ($O_{63}$, FIG. 6A);

10g) a fifth dense opaque region ($O_{64}$, FIG. 6A) that can be located on the right-hand side of the third isolated transparent region ($T_{64}$, FIG. 6A);

11g) a third dense transparent region ($T_{65}$, FIG. 6A) that can be located on the right-hand side of the fifth dense opaque region ($O_{64}$, FIG. 6A);

12g) a first isolated opaque region ($O_{65}$, FIG. 6A) that can be located on the right-hand side of the third dense transparent region ($T_{65}$, FIG. 6A);

13g) a fourth dense transparent region ($T_{66}$, FIG. 6A) that can be located on the right-hand side of the first isolated opaque region ($O_{65}$, FIG. 6A);

14g) a sixth dense opaque region ($O_{66}$, FIG. 6A) that can be located on the right-hand side of the fourth dense transparent region ($T_{66}$, FIG. 6A);

15g) a fourth isolated transparent region ($T_{67}$, FIG. 6A) that can be located on the right-hand side of the sixth dense opaque region ($O_{66}$, FIG. 6A);

16g) a seventh dense opaque region ($O_{67}$, FIG. 6A) that can be located on the right-hand side of the fourth isolated transparent region ($T_{67}$, FIG. 6A);

17g) a fifth isolated transparent region ($T_{68}$, FIG. 6A) that can be located on the right-hand side of the seventh dense opaque region ($O_{67}$, FIG. 6A);

18g) an eighth dense opaque region ($O_{68}$, FIG. 6A) that can be located on the right-hand side of the fifth isolated transparent region ($T_{68}$, FIG. 6A);

19g) a fifth dense transparent region ($T_{69}$, FIG. 6A) that can be located on the right-hand side of the eighth dense opaque region ($O_{68}$, FIG. 6A);

20g) a ninth dense opaque region ($O_{69}$, FIG. 6A) that can be located on the right-hand side of the fifth dense transparent region ($T_{69}$, FIG. 6A);

21g) a sixth dense transparent region ($T_{70}$, FIG. 6A) that can be located on the right-hand side of the ninth dense isolated opaque region ($O_{69}$, FIG. 6A);

22g) a tenth dense opaque region ($O_{70}$, FIG. 6A) that can be located on the right-hand side of the sixth dense transparent region ($T_{70}$, FIG. 6A); and 23g) a sixth isolated transparent region ($T_{71}$, FIG. 6A) that can be located on the right-hand side of the tenth dense isolated opaque region ($O_{70}$, FIG. 6A).

The first isolated transparent region ($T_{60}$, FIG. 6A) can have a top CD ($x_{0a}$) and a bottom CD ($x_{0b}$); the first dense transparent region ($T_{61}$, FIG. 6A) can have a top CD ($x_{1a}$) and a bottom CD ($x_{1b}$); the second dense transparent region ($T_{62}$, FIG. 6A) can have a top CD ($x_{2a}$) and a bottom CD ($x_{2b}$); the second isolated transparent region ($T_{63}$, FIG. 6A) can have a top CD ($x_{3a}$) and a bottom CD ($x_{3b}$); the third isolated transparent region ($T_{64}$, FIG. 6A) can have a top CD ($x_{4a}$) and a bottom CD ($x_{4b}$); the third dense transparent region ($T_{65}$, FIG. 6A) can have a top CD ($x_{5a}$) and a bottom CD ($x_{5b}$); the fourth dense transparent region ($T_{66}$, FIG. 6A) can have a top CD ($x_{6a}$) and a bottom CD ($x_{6b}$); the fourth isolated transparent region ($T_{67}$, FIG. 6A) can have a top CD ($x_{7a}$) and a bottom CD ($x_{7b}$); the fifth isolated transparent region ($T_{68}$, FIG. 6A) can have a top CD ($x_{8a}$) and a bottom CD ($x_{8b}$); the fifth dense transparent region ($T_{69}$, FIG. 6A) can have a top CD ($x_{9a}$) and a bottom CD ($x_{9b}$); the sixth dense transparent region ($T_{70}$, FIG. 6A) can have a top CD ($x_{10a}$) and a bottom CD ($x_{10b}$); and the sixth isolated transparent region ($T_{71}$, FIG. 6A) can have a top CD ($x_{11a}$) and a bottom CD ($x_{11b}$).

The top CD ($x_{0a}$) can range from approximately 10 nm to approximately 400 nm, and the bottom CD ($x_{0b}$) can range from approximately 5 nm to approximately 400 nm; the top CD ($x_{1a}$) can range from approximately 10 nm to approximately 200 nm, and the bottom CD ($x_{1b}$) can range from approximately 5 nm to approximately 200 nm; the top CD ($x_{2a}$) can range from approximately 10 nm to approximately 200 nm, and the bottom CD ($x_{2b}$) can range from approximately 5 nm to approximately 200 nm; the top CD ($x_{3a}$) can range from approximately 10 nm to approximately 400 nm, and the bottom CD ($x_{3b}$) can range from approximately 5 nm to approximately 400 nm; the top CD ($x_{4a}$) can range from approximately 10 nm to approximately 400 nm, and the bottom CD ($x_{4b}$) can range from approximately 5 nm to approximately 400 nm; the top CD ($x_{5a}$) can range from approximately 10 nm to approximately 200 nm, and the bottom CD ($x_{5b}$) can range from approximately 5 nm to approximately 200 nm; the top CD ($x_{6a}$) can range from approximately 10 nm to approximately 200 nm, and the bottom CD ($x_{6b}$) can range from approximately 5 nm to approximately 200 nm; the top CD ($x_{7a}$) can range from approximately 10 nm to approximately 400 nm, and the bottom CD ($x_{7b}$) can range from approximately 5 nm to approximately 400 nm; the top CD ($x_{8a}$) can range from approximately 10 nm to approximately 400 nm, and the bottom CD ($x_{8b}$) can range from approximately 5 nm to approximately 400 nm; the top CD ($x_{9a}$) can range from approximately 10 nm to approximately 200 nm, and the bottom CD ($x_{9b}$) can range from approximately 5 nm to approximately 200 nm; the top CD ($x_{10a}$) can range from approximately 10 nm to approximately 200 nm, and the bottom CD ($x_{10b}$) can range from approximately 5 nm to approximately 200 nm; and the top CD ($x_{11a}$) can range from approximately 10 nm to approximately 400 nm, and the bottom CD ($x_{11b}$) can range from approximately 5 nm to approximately 400 nm.

The first dense opaque region ($O_{60}$, FIG. 6A) can have a top CD ($I_{0a}$), a bottom CD ($I_{0b}$) a first SWA ($\theta_{0a}$), and a second SWA ($\theta_{0b}$); the second dense opaque region ($O_{61}$, FIG. 6A) can have a top CD ($I_{1a}$), a bottom CD ($I_{1b}$), a first SWA ($\theta_{1a}$), and a second SWA ($\theta_{1b}$); the third dense opaque region ($O_{62}$, FIG. 6A) can have a top CD ($I_{2a}$), a bottom CD ($I_{2b}$), a first SWA ($\theta_{2a}$), and a second SWA ($\theta_{2b}$); the fourth dense opaque region ($O_{63}$, FIG. 6A) can have a top CD ($I_{3a}$), a bottom CD ($I_{3b}$), a first SWA ($\theta_{3a}$), and a second SWA ($\theta_{3b}$); the fifth dense opaque region ($O_{64}$, FIG. 6A) can have a top CD ($I_{4a}$), a bottom CD ($I_{4b}$), a first SWA ($\theta_{4a}$), and a second SWA ($\theta_{4b}$); the first isolated opaque region ($O_{65}$, FIG. 6A) can have a top CD ($I_{5a}$), a bottom CD ($I_{5b}$), a first SWA ($\theta_{5a}$), and a second SWA ($\theta_{5b}$); the sixth dense opaque region ($O_{66}$, FIG. 6A) can have a top CD ($I_{6a}$), a bottom CD ($I_{6b}$), a first SWA ($\theta_{6a}$), and a second SWA ($\theta_{6b}$); the seventh dense opaque region ($O_{67}$, FIG. 6A) can have a top CD ($I_{7a}$), a bottom CD ($I_{7b}$), a first SWA ($\theta_{7a}$), and a second SWA ($\theta_{7b}$); the eighth dense opaque region ($O_{68}$, FIG. 6A) can have a top CD ($I_{8a}$), a bottom CD ($I_{8b}$), a first SWA ($\theta_{8a}$), and a second SWA ($\theta_{8b}$); the ninth dense opaque region ($O_{69}$, FIG. 6A) can have a top CD ($I_{9a}$), a bottom CD ($I_{9b}$), a first SWA ($\theta_{9a}$), and a second SWA ($\theta_{9b}$); and the tenth dense opaque region ($O_{70}$, FIG. 6A) can have a top CD ($I_{10a}$), a bottom CD ($I_{10b}$), a first SWA ($\theta_{10a}$), and a second SWA ($\theta_{10b}$).

The top CD ($I_{0a}$) can range from approximately 5 nm to approximately 200 nm, and the bottom CD ($I_{0b}$) can range from approximately 10 nm to approximately 250 nm; the top CD ($I_{1a}$) can range from approximately 5 nm to approximately 200 nm, and the bottom CD ($I_{1b}$) can range from approximately 10 nm to approximately 250 nm; the top CD ($I_{2a}$) can range from approximately 5 nm to approximately 200 nm, and the bottom CD ($I_{2b}$) can range from approximately 10 nm to approximately 250 nm; the top CD ($I_{3a}$) can range from approximately 5 nm to approximately 200 nm, and the bottom CD ($I_{3b}$) can range from approximately 10 nm to approximately 250 nm; the top CD ($I_{4a}$) can range from approximately 5 nm to approximately 200 nm, and the bottom CD ($I_{4b}$) can range from approximately 10 nm to approximately 250 nm; the top CD ($I_{5a}$) can range from approximately 50 nm to approximately 1000 nm, and the bottom CD ($I_{5b}$) can range from approximately 50 nm to approximately 1100 nm; the top CD ($I_{6a}$) can range from approximately 5 nm to approximately 200 nm, and the bottom CD ($I_{6b}$) can range from approximately 10 nm to approximately 250 nm; the top CD ($I_{7a}$) can range from approximately 5 nm to approximately 200 nm, and the bottom CD ($I_{7b}$) can range from approximately 10 nm to approximately 250 nm; the top CD ($I_{8a}$) can range from approximately 5 nm to approximately 200 nm, and the bottom CD ($I_{8b}$) can range from approximately 10 nm to approximately 250 nm; the top CD ($I_{9a}$) can range from approximately 5 nm to approximately 200 nm, and the bottom CD ($I_{9b}$) can range from approximately 10 nm to approximately 250 nm; and the top CD ($I_{10a}$) can range from approximately 10 nm to approximately 200 nm, and the bottom CD ($I_{10b}$) can range from approximately 10 nm to approximately 250 nm.

Still referring to FIG. 6A, the first SWA ($\theta_{0a}$) can range from approximately 80 degrees to approximately 99 degrees, and the second SWA ($\theta_{0b}$) can range from approximately 88 degrees to approximately 92 degrees; the first SWA ($\theta_{1a}$) can range from approximately 85 degrees to approximately 95 degrees, and the second SWA ($\theta_{1b}$) can range from approximately 85 degrees to approximately 95 degrees; the first SWA ($\theta_{2a}$) can range from approximately 85 degrees to approximately 95 degrees, and the second SWA ($\theta_{2b}$) can range from approximately 85 degrees to approximately 95 degrees; the first SWA ($\theta_{3a}$) can range from approximately 85 degrees to approximately 95 degrees, and the second SWA ($\theta_{3b}$) can range from approximately 85 degrees to approximately 95 degrees; the first SWA ($\theta_{4a}$) can range from approximately 85 degrees to approximately 95 degrees, and the second SWA ($\theta_{4b}$) can range from approximately 85 degrees to approximately 95 degrees; the first SWA ($\theta_{5a}$) can range from approximately 85 degrees to approximately 95 degrees, and the second SWA ($\theta_{5b}$) can range from approximately 85 degrees to approximately 95 degrees; the first SWA ($\theta_{6a}$) can range from approximately 85 degrees to approximately 95 degrees, and the second SWA ($\theta_{6b}$) can range from approximately 85 degrees to approximately 95 degrees; the first SWA ($\theta_{7a}$) can range from approximately 85 degrees to approximately 95 degrees, and the second SWA ($\theta_{7b}$) can range from approximately 85 degrees to approximately 95 degrees; the first SWA ($\theta_{8a}$) can range from approximately 85 degrees to approximately 95 degrees, and the second SWA ($\theta_{8b}$) can range from approximately 85 degrees to approximately 95 degrees; and the first SWA ($\theta_{9a}$) can range from approximately 80 degrees to approximately 99 degrees, the second SWA ($\theta_{9b}$) can range from approximately 80 degrees to approximately 99 degrees; and the first SWA ($\theta_{10a}$) can range from approximately 80 degrees to approximately 99 degrees, and the second SWA ($\theta_{10b}$) can range from approximately 80 degrees to approximately 99 degrees.

FIG. 6B illustrates a fourth exemplary patterned substrate comprising a fourth developed M-PST pattern in accordance with embodiments of the invention. When one or more substrates are processed using the fourth M-PST masking pattern (601, FIG. 6B), one or more patterned substrates (610, FIG. 6B) can be created. The patterned substrate (610, FIG. 6B) can include one or more previously created layers (611, FIG. 6B), one or more BARC layers (615, FIG. 6B), and one or more patterned (developed) layers (620, FIG. 6B) that can include a side view pattern (621, FIG. 6B) and a top view pattern (625, FIG. 6B). The BARC layers (615, FIG. 6B) can include photoresist material, anti-reflective coating (ARC) material, or bottom anti-reflective coating (BARC) material, or any combination thereof.

The previously created layers (611, FIG. 3B) can include semiconductor material, low-k dielectric material, ultra-low-k dielectric material, ceramic material, glass material, metallic material, resist material, filler material, doped material, un-doped material, stressed material, oxygen-containing material, nitrogen-containing material, anti-reflective coating (ARC) material, or bottom anti-reflective coating (BARC) material, or any combination thereof.

The patterned (developed) layers (620, FIG. 6B) can be oriented relative to the X-axis and can include:

1h) a first isolated space feature ($S_{60}$, FIG. 6B) that can be located at the leftmost position of the fourth M-PST masking pattern (601, FIG. 6B);

2h) a first dense structure feature ($F_{60}$, FIG. 6B) that can be located on the right-hand side of the first isolated space feature ($S_{60}$, FIG. 6B);

3h) a first dense space feature ($S_{61}$, FIG. 6B) that can be located on the right-hand side of the first dense structure feature ($F_{60}$, FIG. 6B);

4h) a second dense structure feature ($F_{61}$, FIG. 6B) that can be located on the right-hand side of the first dense space feature ($S_{61}$, FIG. 6B);

5h) a second dense space feature ($S_{62}$, FIG. 6B) that can be located on the right-hand side of the second dense structure feature ($F_{61}$, FIG. 6B);

6h) a third dense structure feature ($F_{62}$, FIG. 6B) that can be located on the right-hand side of the second dense space feature ($S_{62}$, FIG. 6B);

7h) a second isolated space feature ($S_{63}$, FIG. 6B) that can be located on the right-hand side of the third dense structure feature ($F_{62}$, FIG. 6B);

8h) a fourth dense structure feature ($F_{63}$, FIG. 6B) that can be located on the right-hand side of the second isolated space feature ($S_{63}$, FIG. 6B);

9h) a third isolated space feature ($S_{64}$, FIG. 6B) that can be located on the right-hand side of the fourth dense structure feature ($F_{63}$, FIG. 6B);

10h) a fifth dense structure feature ($F_{64}$, FIG. 6B) that can be located on the right-hand side of the third isolated space feature ($S_{64}$, FIG. 6B);

11h) a third dense space feature ($S_{65}$, FIG. 6B) that can be located on the right-hand side of the fifth dense structure feature ($F_{64}$, FIG. 6B);

12h) a first isolated structure feature ($F_{65}$, FIG. 6B) that can be located on the right-hand side of the third dense space feature ($S_{65}$, FIG. 6B);

13h) a fourth dense space feature ($S_{66}$, FIG. 6B) that can be located on the right-hand side of the first isolated structure feature ($F_{65}$, FIG. 6B);

14h) a sixth dense structure feature ($F_{66}$, FIG. 6B) that can be located on the right-hand side of the fourth dense space feature ($S_{66}$, FIG. 6B);

15h) a fourth isolated space feature ($S_{67}$, FIG. 6B) that can be located on the right-hand side of the sixth dense structure feature ($F_{66}$, FIG. 6B);

16h) a seventh dense structure feature ($F_{67}$, FIG. 6B) that can be located on the right-hand side of the fourth isolated space feature ($S_{67}$, FIG. 6B);

17h) a fifth isolated space feature ($S_{68}$, FIG. 6B) that can be located on the right-hand side of the seventh dense structure feature ($F_{67}$, FIG. 6B);

18h) an eighth dense structure feature ($F_{68}$, FIG. 6B) that can be located on the right-hand side of the fifth isolated space feature ($S_{68}$, FIG. 6B);

19h) a fifth dense space feature ($S_{69}$, FIG. 6B) that can be located on the right-hand side of the eighth dense structure feature ($F_{68}$, FIG. 6B);

20h) a ninth dense structure feature ($F_{69}$, FIG. 6B) that can be located on the right-hand side of the fifth dense space feature ($S_{69}$, FIG. 6B);

21h) a sixth dense space feature ($S_{70}$, FIG. 6B) that can be located on the right-hand side of the ninth dense isolated structure feature ($F_{69}$, FIG. 6B);

22h) a tenth dense structure feature ($F_{70}$, FIG. 6B) that can be located on the right-hand side of the sixth dense space feature ($S_{70}$, FIG. 6B); and 23h) a sixth isolated space feature ($S_{71}$, FIG. 6B) that can be located on the right-hand side of the tenth dense isolated structure feature ($F_{70}$, FIG. 6B).

The first isolated space feature ($S_{60}$, FIG. 6B) can have a top CD ($x_{0a}$) and a bottom CD ($x_{0b}$); the first dense space feature ($S_{61}$, FIG. 6B) can have a top CD ($x_{1a}$) and a bottom CD ($x_{1b}$); the second dense space feature ($S_{62}$, FIG. 6B) can have a top CD ($x_{2a}$) and a bottom CD ($x_{2b}$); the second isolated space feature ($S_{63}$, FIG. 6B) can have a top CD ($x_{3a}$) and a bottom CD ($x_{3b}$); the third isolated space feature ($S_{64}$, FIG. 6B) can have a top CD ($x_{4a}$) and a bottom CD ($x_{4b}$); the third dense space feature ($S_{65}$, FIG. 6B) can have a top CD ($x_{5a}$) and a bottom CD ($x_{5b}$); the fourth dense space feature ($S_{66}$, FIG. 6B) can have a top CD ($x_{6B}$) and a bottom CD ($x_{6b}$); the fourth isolated space feature ($S_{67}$, FIG. 6B) can have a top CD ($x_{7a}$) and a bottom CD ($x_{7b}$); the fifth isolated space feature ($S_{68}$, FIG. 6B) can have a top CD ($x_{8a}$) and a bottom CD ($x_{8b}$); the fifth dense space feature ($S_{69}$, FIG. 6B) can have a top CD ($x_{9a}$) and a bottom CD ($x_{9b}$); the sixth dense space feature ($S_{70}$, FIG. 6B) can have a top CD ($x_{10a}$) and a bottom CD ($x_{10b}$); and the sixth isolated space feature ($S_{71}$, FIG. 6B) can have a top CD ($x_{11a}$) and a bottom CD ($x_{11b}$).

The top CD ($x_{0a}$) can range from approximately 10 nm to approximately 400 nm, and the bottom CD ($x_{0b}$) can range from approximately 5 nm to approximately 400 nm; the top CD ($x_{1a}$) can range from approximately 10 nm to approximately 200 nm, and the bottom CD ($x_{1b}$) can range from approximately 5 nm to approximately 200 nm; the top CD ($x_{2a}$) can range from approximately 10 nm to approximately 200 nm, and the bottom CD ($x_{2b}$) can range from approximately 5 nm to approximately 200 nm; the top CD ($x_{3a}$) can range from approximately 10 nm to approximately 400 nm, and the bottom CD ($x_{3b}$) can range from approximately 5 nm to approximately 400 nm; the top CD ($x_{4a}$) can range from approximately 10 nm to approximately 400 nm, and the bottom CD ($x_{4b}$) can range from approximately 5 nm to approximately 400 nm; the top CD ($x_{5a}$) can range from approximately 10 nm to approximately 200 nm, and the bottom CD ($x_{5b}$) can range from approximately 5 nm to approximately 200 nm; the top CD ($x_{6a}$) can range from approximately 10 nm to approximately 200 nm, and the bottom CD ($x_{6b}$) can range from approximately 5 nm to approximately 200 nm; the top CD ($x_{7a}$) can range from approximately 10 nm to approximately 400 nm, and the bottom CD ($x_{7b}$) can range from approximately 5 nm to approximately 400 nm; the top CD ($x_{8a}$) can range from approximately 10 nm to approximately 400 nm, and the bottom CD ($x_{8b}$) can range from approximately 5 nm to approximately 400 nm; the top CD ($x_{9a}$) can range from approximately 10 nm to approximately 200 nm, and the bottom CD ($x_{9b}$) can range from approximately 5 nm to approximately 200 nm; the top CD ($x_{10a}$) can range from approximately 10 nm to approximately 200 nm, and the bottom CD ($x_{10b}$) can range from approximately 5 nm to approximately 200 nm; and the top CD ($x_{11a}$) can range from approximately 10 nm to approximately 400 nm, and the bottom CD ($x_{11b}$) can range from approximately 5 nm to approximately 400 nm.

The first dense structure feature ($F_{60}$, FIG. 6B) can have a top CD ($w_{0a}$), a bottom CD ($w_{0b}$), a first SWA ($\alpha_{0a}$), and a second SWA ($\alpha_{0b}$); the second dense structure feature ($F_{61}$, FIG. 6B) can have a top CD ($w_{1a}$), a bottom CD ($w_{1b}$), a first SWA ($\alpha_{1a}$), and a second SWA ($\alpha_{1b}$); the third dense structure feature ($F_{62}$, FIG. 6B) can have a top CD ($w_{2a}$), a bottom CD ($w_{2b}$), a first SWA ($\alpha_{2a}$), and a second SWA ($\alpha_{2b}$); the fourth dense structure feature ($F_{63}$, FIG. 6B) can have a top CD ($w_{3a}$), a bottom CD ($w_{3b}$), a first SWA ($\alpha_{3a}$) and a second SWA ($\alpha_{3b}$); the fifth dense structure feature ($F_{64}$, FIG. 6B) can have a top CD ($w_{4a}$), a bottom CD ($w_{4b}$), a first SWA ($\alpha_{4a}$) and a second SWA ($\alpha_{4b}$); the first isolated structure feature ($F_{65}$, FIG. 6B) can have a top CD ($w_{5a}$), a bottom CD ($w_{5b}$), a first SWA ($\alpha_{5a}$), and a second SWA ($\alpha_{5b}$); the sixth dense structure feature ($F_{66}$, FIG. 6B) can have a top CD ($w_{6a}$), a bottom CD ($w_{6b}$), a first SWA ($\alpha_{6a}$), and a second SWA ($\alpha_{6b}$); the seventh dense structure feature ($F_{67}$, FIG. 6B) can have a top CD ($w_{7a}$), a bottom CD ($w_{7b}$), a first SWA ($\alpha_{7a}$) and a second SWA ($\alpha_{7b}$); the eighth dense structure feature ($F_{68}$, FIG. 6B) can have a top CD ($w_{8a}$), a bottom CD ($w_{8b}$), a first SWA ($\alpha_{8a}$), and a second SWA ($\alpha_{8b}$); the ninth dense structure feature ($F_{69}$, FIG. 6B) can have a top CD ($w_{9a}$), a bottom CD ($w_{9b}$), a first SWA ($\alpha_{9a}$) and a second SWA ($\alpha_{9b}$); and the tenth dense structure feature ($F_{70}$, FIG. 6B) can have a top CD ($w_{10a}$), a bottom CD ($w_{10b}$), a first SWA ($\alpha_{10a}$), and a second SWA ($\alpha_{10b}$).

The top CD ($w_{0a}$) can range from approximately 5 nm to approximately 200 nm, and the bottom CD ($w_{0b}$) can range from approximately 10 nm to approximately 250 nm; the top CD ($w_{1a}$) can range from approximately 5 nm to approximately 200 nm, and the bottom CD ($w_{1b}$) can range from approximately 10 nm to approximately 250 nm; the top CD ($w_{2a}$) can range from approximately 5 nm to approximately 200 nm, and the bottom CD ($w_{2b}$) can range from approximately 10 nm to approximately 250 nm; the top CD ($w_{3a}$) can range from approximately 5 nm to approximately 200 nm, and the bottom CD ($w_{3b}$) can range from approximately 10 nm to approximately 250 nm; the top CD ($w_{4a}$) can range from approximately 5 nm to approximately 200 nm, and the bottom CD ($w_{4b}$) can range from approximately 10 nm to approximately 250 nm; the top CD ($w_{5a}$) can range from approximately 50 nm to approximately 1000 nm, and the bottom CD ($w_{5b}$) can range from approximately 50 nm to approximately 1100 nm; the top CD ($w_{6a}$) can range from approximately 5 nm to approximately 200 nm, and the bottom CD ($w_{6b}$) can range from approximately 10 nm to approximately 250 nm; the top CD ($w_{7a}$) can range from approximately 5 nm to approximately 200 nm, and the bottom CD ($w_{7b}$) can range from approximately 10 nm to approximately 250 nm; the top CD ($w_{8a}$) can range from approximately 5 nm to approximately 200 nm, and the bottom CD ($w_{8b}$) can range from approximately 10 nm to approximately 250 nm; the top CD ($w_{9a}$) can range from approximately 5 nm to approximately 200 nm, and the bottom CD ($w_{9b}$) can range from approximately 10 nm to approximately 250 nm; and the top CD ($w_{10a}$) can range from approximately 5 nm to approximately 200 nm, and the bottom CD ($w_{10b}$) can range from approximately 10 nm to approximately 250 nm.

Still referring to FIG. 6B, the first SWA ($\alpha_{0a}$) can range from approximately 80 degrees to approximately 99 degrees, and the second SWA ($\alpha_{0b}$) can range from approximately 88 degrees to approximately 92 degrees; the first SWA ($\alpha_{1a}$) can range from approximately 85 degrees to approximately 95 degrees, and the second SWA ($\alpha_{1b}$) can range from approximately 85 degrees to approximately 95 degrees; the first SWA ($\alpha_{2a}$) can range from approximately 85 degrees to approximately 95 degrees, and the second SWA ($\alpha_{2b}$) can range from approximately 85 degrees to approximately 95 degrees; the first SWA ($\alpha_{3a}$) can range from approximately 85 degrees to approximately 95 degrees, and the second SWA ($\alpha_{3b}$) can range from approximately 85 degrees to approximately 95 degrees; the first SWA ($\alpha_{4a}$) can range from approximately 85 degrees to approximately 95 degrees, and the second SWA ($\alpha_{4b}$) can range from approximately 85 degrees to approximately 95 degrees; the first SWA ($\alpha_{5a}$) can range from approximately 85 degrees to approximately 95 degrees, and the second SWA ($\alpha_{5b}$) can range from approximately 85 degrees to approximately 95 degrees; the first SWA ($\alpha_{6a}$) can range from approximately 85 degrees to approximately 95 degrees, and the second SWA ($\alpha_{6b}$) can range from approximately 85 degrees to approximately 95 degrees; the first SWA ($\alpha_{7a}$) can range from approximately 85 degrees to approximately 95 degrees, and the second SWA ($\alpha_{7b}$) can range from approximately 85 degrees to approximately 95 degrees; the first SWA ($\alpha_{8a}$) can range from approximately 85 degrees to approximately 95 degrees, and the second SWA ($\alpha_{8b}$) can range from approximately 85 degrees to approximately 95 degrees; and the first SWA ($\alpha_{9a}$) can range from approximately 80 degrees to approximately 99 degrees, the second SWA ($\alpha_{9b}$) can range from approximately 80 degrees to approximately 99 degrees; and the first SWA ($\alpha_{10a}$) can range from approximately 80 degrees to approximately 99 degrees, and the second SWA ($\alpha_{10b}$) can range from approximately 80 degrees to approximately 99 degrees.

The thickness ($t_{60}$) of the first dense structure feature ($F_{60}$) can range from approximately 10 nm to approximately 150 nm; the thickness ($t_{61}$) of the second dense structure feature ($F_{61}$) can range from approximately 10 nm to approximately 150 nm; the thickness ($t_{62}$) of the third dense structure feature ($F_{62}$) can range from approximately 10 nm to approximately 150 nm; the thickness ($t_{63}$) of the fourth dense structure feature ($F_{63}$) can range from approximately 10 nm to approximately 150 nm; the thickness ($t_{64}$) of the fourth dense structure feature ($F_{64}$) can range from approximately 10 nm to approximately 150 nm; the thickness ($t_{65}$) of the first isolated structure feature ($F_{65}$) can range from approximately 10 nm to approximately 150 nm; the thickness ($t_{66}$) of the sixth dense structure feature ($F_{66}$) can range from approximately 10 nm to approximately 150 nm; the thickness ($t_{67}$) of the seventh dense structure feature ($F_{67}$) can range from approximately 10 nm to approximately 150 nm; the thickness ($t_{68}$) of the eighth dense structure feature ($F_{68}$) can range from approximately 10 nm to approximately 150 nm; and the thickness ($t_{69}$) of the ninth dense structure feature ($F_{69}$) can range from approximately 10 nm to approximately 150 nm;

and the thickness ($t_{70}$) of the tenth dense structure feature ($F_{70}$) can range from approximately 10 nm to approximately 150 nm.

FIG. 7 illustrates an exemplary model in accordance with embodiments of the invention. In the illustrated embodiment, a neural network model 700 is shown that comprises three sets of input parameters (710, 720, and 730), a plurality of hidden nodes 740, and a plurality of output parameters 760. Alternatively, a different type of model may be used, a different number of input parameters may be used, a different number of hidden nodes may be used, and a different number of output parameters may be used. In addition, hidden nodes may be present in multiple layers and/or multiple rows.

In some embodiments, the first set of input parameters 710 can be associated with a first group of the features ($F_{30}$-$F_{39}$) in the first M-PST pattern 321 shown in FIG. 3B, the second set of input parameters 720 can be associated with a second group of the features ($F_{30}$-$F_{39}$) shown in FIG. 3B, and the third set of input parameters 730 can be associated with a third group of the features ($F_{30}$-$F_{39}$) shown in FIG. 3B. In addition, the first set of input parameters 710 can include a first input parameter 711, a second input parameter 712, and a third input parameter 713.

In some examples, the first set of input parameters 710 can be associated with a first one of the features ($F_0$-$F_9$) shown in FIG. 3B, the second set of input parameters 720 can be associated with a second one of the features ($F_0$-$F_9$), and the third set of input parameters 730 can be associated with a third one of the features ($F_0$-$F_9$). In addition, the first input parameters (711, 721, and 731) can be associated with top CD data, the second input parameters (712, 722, and 732) can be associated with bottom CD data, and the third input parameter (713, 723, and 733) can be associated with thickness data. The data can include minimum values, maximum values, difference values, average values, 1-sigma values, or 3-sigma values, or any combination thereof. Alternatively, the input parameters (710, 720, and 730) may include SWA data, substrate thickness data, BARC thickness data, uniformity data, variation data, photoresist data, exposure data, developing data, or scanner data, or any combination thereof.

In other embodiments, the sets of input parameters (710, 720, and 730) can be associated with the features ($F_0$-$F_7$) in the second M-PST pattern 421 shown in FIG. 4B, or can be associated with the features ($F_0$-$F_9$) in the third M-PST pattern 521 shown in FIG. 5B, or can be associated with the features ($F_0$-$F_{10}$) in the fourth M-PST pattern 621 shown in FIG. 6B.

In some embodiments, there can be four hidden nodes (741, 742, 743, and 744) configured as shown in FIG. 7. Alternatively, a different number of hidden nodes may be used that can be configured differently. In some models, hidden nodes may not be required. In addition, there can be three output parameters (761, 762, and 763) configured as shown in FIG. 7, and the output parameters can include exposure focus data, exposure dose data, and PEB temperature data. Alternatively, a different number of output parameters may be used that can be configured differently.

Figure 8:
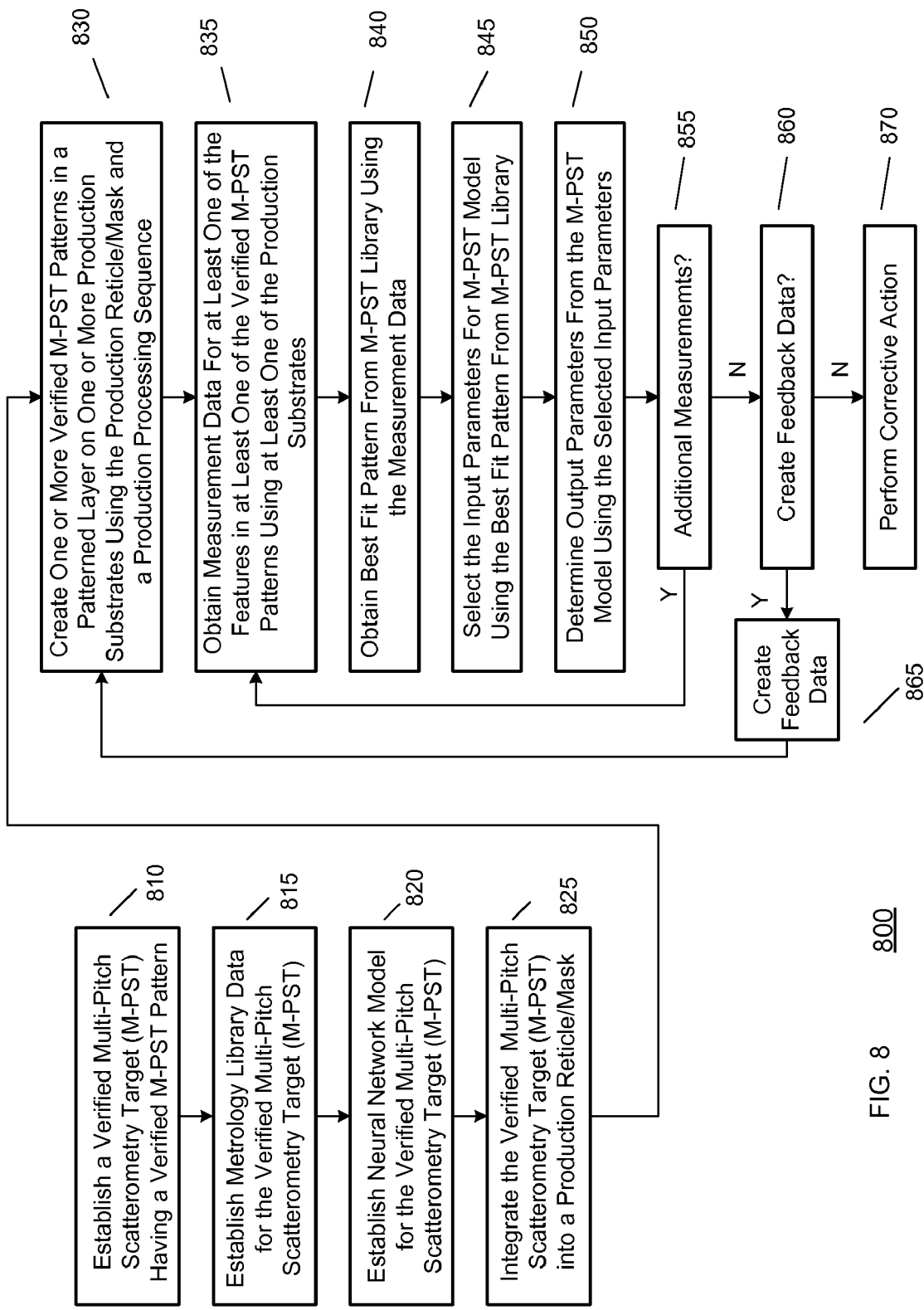
FIG. 8 shows an exemplary flow diagram of a procedure for processing a substrate in accordance with embodiments of the invention.

FIG. 8 shows an exemplary flow diagram of a procedure for processing a substrate in accordance with embodiments of the invention. In the illustrated embodiment, an exemplary procedure 800 is shown for creating one or more verified M-PST patterns in one or more patterned layers on one or more production substrates, obtaining measured data for one or more of the verified M-PST patterns, and using the measured data to determine focus data, exposure dose data, and/or PEB temperature data.

In 810, a verified Multi-Pitch Scatterometry Target (M-PST) having a verified M-PST pattern therein can be established. The verified M-PST can be established using procedure 200 shown in FIG. 2. Alternatively, a verified M-PST may be obtained from a library or a database.

In 815, metrology library data can be established for the verified M-PST. In some embodiments, the metrology library data can include historical data that was created during the M-PST verification process. In other embodiments, one or more verified processing sequences can be performed using verified processing chambers and/or modules to create additional verified metrology library data in real-time In 820, one or more neural network models can be established for the verified M-PST. In some embodiments, one or more neural network models can be established using historical data that was created during the M-PST verification process. In other embodiments, one or more verified simulations can be performed to create verified metrology models in real-time.

In 825, a production reticle/mask having a verified multi-pitch scatterometry target (M-PST) integrated therein can be can be created and can be provided to a scanner subsystem, and the M-PST pattern can be aligned in a first direction. Exemplary M-PST mask/reticles (300, 400, 500, and 600) can be patterned as shown in FIG. 3A, FIG. 4A, FIG. 5A, and FIG. 6A.

In 830, the production reticle/mask can be used during one or more verified lithography-related processing sequences to create one or more verified M-PST patterns in patterned layers on the production substrates. The verified lithography-related processing sequences can include verified exposure procedures and verified developing procedures. In some embodiments, the patterned layer can include a verified developed M-PST pattern, and the verified developed M-PST pattern can include a plurality of verified structure features and a plurality of verified space features. For example, each verified space feature can be located next to at least one verified structure feature. The verified structure features can include at least one verified isolated structure feature and at least one verified dense structure feature, and the verified space features can include at least one verified isolated space feature and at least one verified dense space feature. Exemplary verified developed M-PST patterns are shown in FIG. 3B, FIG. 4B, FIG. 5B, and FIG. 6B.

For example, one or more of the production substrates can be received by a transfer subsystem (170, FIG. 1) that can be coupled to a scanner subsystem (120, FIG. 1) and a lithography subsystem (110, FIG. 1). Alternatively, another subsystem may receive one or more of the production substrates. One or more of the controllers (114, 124, 134, 144, 154, 164, and 190) can be used to receive, determine, and/or send real-time and/or historical data associated with one or more of the production substrates. For example, the real-time and/or historical data can include M-PST related data such as profile data, diffraction signal data, CD data, SWA data, photoresist data, BARC data, wavelength data, intensity data, focus data, exposure dose data, and temperature data.

In 835, measurement data can be obtained for the verified M-PST patterns using a metrology tool and an M-PST-related profile library. When one or more of the verified M-PST patterns (321, FIG. 3B), (421, FIG. 4B), (521, FIG. 5B), and (621, FIG. 6B) have been created, the verified M-PST patterns (321, FIG. 3B), (421, FIG. 4B), (521, FIG. 5B), and (621, FIG. 6B) can be measured using an optical metrology device. The optical device can perform measurement procedures at one or more wavelengths using one or more optical sources. For example, the optical metrology device and the analysis software can be obtained from Timbre Technologies Inc, a TEL company. In addition, the metrology tools can include metrology tools from Nanometrics Inc. Alternatively, the metrology tools may include metrology tools from ASML Inc or KLA Inc.

In one example, measurement data can be obtained from one or more of the verified structure features and/or one or more of the verified space features in the verified developed M-PST patterns shown in FIG. 3B. When FIG. 3B is used to illustrate verified developed features ($F_{30}$-$F_{39}$) and verified developed spaces ($S_{30}$-$S_{39a}$) in the verified developed M-PST patterns (321, 325), the verified developed features ($F_{30}$-$F_{39}$) can include one or more verified top CDs ($w_{0a}$-$w_{9a}$), one or more verified bottom CDs ($w_{0b}$-$w_{9b}$), one or more verified thicknesses ($t_{0b}$-$t_{9b}$), one or more verified first sidewall angles ($\alpha_{0a}$-$\alpha_{9a}$), and one or more verified second sidewall angles ($\alpha_{0b}$-$\alpha_{9b}$). The verified developed spaces ($S_{30}$-$S_{39a}$) can include one or more verified top widths ($d_{0a}$-$d_{10a}$) and one or more verified bottom widths ($d_{0b}$-$d_{10b}$). In addition, the verified top CDs ($w_{0a}$-$w_{9a}$) can vary from approximately 50 nm to approximately 300 nm; the verified bottom CDs ($w_{0b}$-$w_{9b}$) can vary from approximately 50 nm to approximately 300 nm; the verified thicknesses ($t_{30}$-$t_{39}$) can vary from approximately 10 nm to approximately 200 nm; the verified first sidewall angles ($\alpha_{0a}$-$\alpha_{9a}$) can vary from approximately 80 degrees to approximately 100 degrees; the verified second sidewall angles ($\alpha_{0b}$-$\alpha_{9b}$) can vary from approximately 80 degrees to approximately 100 degrees; the verified top widths ($d_{0a}$-$d_{10a}$) can vary from approximately 50 nm to approximately 300 nm; and the verified bottom widths ($d_{0b}$-$d_{10b}$) can vary from approximately 50 nm to approximately 300 nm.

In second example, measurement data can be obtained from one or more of the verified structure features and/or one or more of the verified space features in the verified developed M-PST patterns shown in FIG. 4B. When FIG. 4B is used to illustrate verified developed features ($F_{40}$-$F_{47}$) and verified developed spaces ($S_{40}$-$S_{48}$) in the verified developed M-PST patterns (421, 425), the verified developed features ($F_{40}$-$F_{47}$) can include one or more verified top CDs ($w_{0a}$-$w_{7a}$), one or more verified bottom CDs ($w_{0b}$-$w_{7b}$), one or more verified thicknesses ($t_{40}$-$t_{7b}$), one or more verified first sidewall angles ($\alpha_{0a}$-$\alpha_{7a}$), and one or more verified second sidewall angles ($\alpha_{0b}$-$\alpha_{7b}$). The verified developed spaces ($S_{40}$-$S_{48}$) can include one or more verified top widths ($d_{0a}$-$d_{7a}$) and one or more verified bottom widths ($d_{0b}$-$d_{7b}$). In addition, the verified top CDs ($w_{0a}$-$w_{7a}$) can vary from approximately 50 nm to approximately 300 nm; the verified bottom CDs ($w_{0b}$-$w_{7b}$) can vary from approximately 50 nm to approximately 300 nm; the verified thicknesses ($t_{40}$-$t_{47}$) can vary from approximately 10 nm to approximately 200 nm; the verified first sidewall angles ($\alpha_{0a}$-$\alpha_{7a}$) can vary from approximately 80 degrees to approximately 100 degrees; the verified second sidewall angles ($\alpha_{0b}$-$\alpha_{7b}$) can vary from approximately 80 degrees to approximately 100 degrees; the verified top widths ($d_{0a}$-$d_{8a}$) can vary from approximately 50 nm to approximately 300 nm; and the verified bottom widths ($d_{0b}$-$d_{8b}$) can vary from approximately 50 nm to approximately 300 nm.

In third example, measurement data can be obtained from one or more of the verified structure features and/or one or more of the verified space features in the verified developed M-PST patterns shown in FIG. 5B. When FIG. 5B is used to illustrate verified developed features ($F_{50}$-$F_{59}$) and verified developed spaces ($S_{50}$-$S_{59a}$) in the verified developed M-PST patterns (521, 525), the verified developed features ($F_{50}$-$F_{59}$) can include one or more verified top CDs ($w_{0a}$-$w_{9a}$), one or more verified bottom CDs ($w_{0b}$-$w_{9b}$), one or more verified thicknesses ($t_{50}$-$t_{59}$), one or more verified first sidewall angles ($\alpha_{0a}$-$\alpha_{9a}$), and one or more verified second sidewall angles ($\alpha_{0b}$-$\alpha_{9b}$). The verified developed spaces ($S_{50}$-$S_{59a}$) can include one or more verified top widths ($d_{0a}$-$d_{10a}$), or one or more verified bottom widths ($d_{0b}$-$d_{10b}$). In addition, the verified top CDs ($w_{0a}$-$w_{9a}$) can vary from approximately 50 nm to approximately 300 nm; the verified bottom CDs ($w_{0b}$-$w_{9b}$) can vary from approximately 50 nm to approximately 300 nm; the verified thicknesses ($t_{50}$-$t_{59}$) can vary from approximately 10 nm to approximately 200 nm; the verified first sidewall angles ($\alpha_{0a}$-$\alpha_{9a}$) can vary from approximately 80 degrees to approximately 100 degrees; the verified second sidewall angles ($\alpha_{0b}$-$\alpha_{9b}$) can vary from approximately 80 degrees to approximately 100 degrees; the verified top widths ($d_{0a}$-$d_{10a}$) can vary from approximately 50 nm to approximately 300 nm; and the verified bottom widths ($d_{0b}$-$d_{10b}$) can vary from approximately 50 nm to approximately 300 nm.

In fourth example, measurement data can be obtained from one or more of the verified structure features and/or one or more of the verified space features in the verified developed M-PST patterns shown in FIG. 6B. When FIG. 6B is used to illustrate verified developed features ($F_{60}$-$F_{70}$) and verified developed spaces ($S_{60}$-$S_{71}$) in the verified developed M-PST patterns (621, 625), the verified developed features ($F_{60}$-$F_{70}$) can include one or more verified top CDs ($w_{0a}$-$w_{10a}$), one or more verified bottom CDs ($w_{0b}$-$w_{10b}$), one or more verified thicknesses ($t_{60}$-$t_{70}$), one or more verified first sidewall angles ($\alpha_{0a}$-$\alpha_{10a}$), and one or more verified second sidewall angles ($\alpha_{0b}$-$\alpha_{10b}$). The verified developed spaces ($S_{60}$-$S_{71}$) can include one or more verified top widths ($d_{0a}$-$d_{10a}$) and one or more verified bottom widths ($d_{0b}$-$d_{10b}$). In addition, the verified top CDs ($w_{0a}$-$w_{10a}$) can vary from approximately 50 nm to approximately 300 nm; the verified bottom CDs ($w_{0b}$-$w_{10b}$) can vary from approximately 50 nm to approximately 300 nm; the verified thicknesses ($t_{60}$-$t_{70}$) can vary from approximately 10 nm to approximately 200 nm; the verified first sidewall angles ($\alpha_{0a}$-$\alpha_{10a}$) can vary from approximately 80 degrees to approximately 100 degrees; the verified second sidewall angles ($\alpha_{0b}$-$\alpha_{10b}$) can vary from approximately 80 degrees to approximately 100 degrees; the verified top widths ($d_{0a}$-$d_{11a}$) can vary from approximately 50 nm to approximately 300 nm; and the verified bottom widths ($d_{0b}$-$d_{11b}$) can vary from approximately 50 nm to approximately 300 nm.

In some embodiments, the measurement data can include diffraction signal data from an optical metrology tool, and the wavelengths associated with the diffraction signal data can vary from approximately 100 nm to approximately 900 nm. Alternatively, the measurement data may include reflection data, transmission data, and/or refraction data.

In 840, a best-fit M-PST pattern can be obtained from the M-PST library using the measurement data. When the measurement data includes measured diffraction signal data and the M-PST library data includes verified diffraction signal data, the best match between the measured diffraction signal data and the verified diffraction signal data can be used to identify the best-fit M-PST pattern. For example, the M-PST library can include a plurality of verified M-PST patterns and the verified diffraction signal data associated with the verified M-PST patterns.

In 845, the input parameters for the previously established neural network model can be selected from the best-fit M-PST pattern. The selected input parameters can include CDs, thicknesses, and/or SWAs for pre-determined features and/or spaces in the best-fit M-PST pattern.

In 850, output parameters from the model can be determined using the selected input parameters. For example, the output parameters can include exposure dose data, exposure focus data, and PEB temperature data. In some embodiments, steps 840, 845, and 850 can be performed using the PAS software associated with the optical metrology tool.

In 855, a query can be performed to determine if additional measurements are required. Procedure 800 can branch to 835 when additional measurements are required, and procedure 800 can branch to 860 when additional measurements are not required.

In 860, a query can be performed to determine if feedback data can be created. Procedure 800 can branch to 865 when feedback data can be created, and procedure 800 can branch to 870 when feedback data cannot be created.

In 865, feedback data can be created. For example, the feedback data can be used to make real-time changes to the scanner subsystem, and/or the lithography subsystem that are used to perform the production processing sequence. In addition, the feedback data can be used to make real-time changes to the exposure procedures, the developing procedures, and/or the thermal procedures, or any combination thereof. In other embodiments, the output data can be sent to a host computer and/or used to populate SPC charts. After feedback data is created, procedure 800 can branch to step 830 and continue as shown in FIG. 8.

In 870, one or more corrective actions can be performed. In some examples, corrective actions can include stopping the processing, pausing the processing, re-evaluating one or more of the substrates, re-measuring one or more of the substrates, re-inspecting one or more of the substrates, re-working one or more of the substrates, storing one or more of the substrates, cleaning one or more of the substrates, delaying one or more of the substrates, or stripping one or more of the substrates, or any combination thereof.

Corrective actions can include calculating new and/or updated data, models, maps, M-PST patterns, and/or M-PST procedures. In addition, corrective actions can include increasing the number of required measurement sites by one or more the confidence data is greater than the first confidence threshold; and decreasing the number of required measurement sites by one or more the confidence data is not greater than the first confidence threshold.

In some examples, one or more of the developed M-PST patterns (321, FIG. 3B), (421, FIG. 4B), (521, FIG. 5B), and (621, FIG. 6B) can be created in one or more scribe lines in a first direction on the substrate. Alternatively, one or more of the developed M-PST patterns (321, FIG. 3B), (421, FIG. 4B), (521, FIG. 5B), and (621, FIG. 6B) can also be created in one or more scribe lines in a second direction on the substrate. In other examples, one or more of the developed M-PST patterns (321, FIG. 3B), (421, FIG. 4B), (521, FIG. 5B), and (621, FIG. 6B) can be created in one or more evaluation areas of the substrate.

During some processing sequences, one or more of the developed substrates can be transferred to the inspection subsystem 150, and/or the measurement subsystem 160 and evaluation data can be obtained. In various embodiments, evaluation data can be obtained from one or more of the M-PST patterns at one or more locations in one or more developed masking layers on one or more substrates. During some M-PST related procedures, one or more verification substrates can be transferred to the inspection subsystem 150, and/or the measurement subsystem 160 and evaluation data can be obtained for the on or more of the verification substrates after the substrate has been developed. For example, diffraction signal data can be obtained from the developed M-PST patterns.

In various examples, input/response inversion techniques can be used for the de-convolution of the output parameters from a set of input parameters. The inversion techniques can include neural networks, analytical inversions, library/regression inversion, model inversion, and the input parameters can include top CD, bottom CD, SWA, photoresist thickness, masking material, pitch, location, site, period.

When risk and/or confidence data are being determined for M-PST-related models, maps, patterns, data, and/or procedures, the exposure focus variation data, the exposure dose variation data, and/or the post exposure bake (PEB) temperature variation data can be compared to M-PST related limits such as the exposure focus variation limits, the exposure dose variation limits, and/or the post exposure bake (PEB) temperature variation limits. For example, first risk and/or confidence data can be determined by comparing the exposure focus variation data to the exposure focus variation limits, second risk and/or confidence data can be determined by comparing the exposure dose variation data to the exposure dose variation limits, third risk and/or confidence data can be determined by comparing the PEB temperature variation data to the PEB temperature variation limits, and total risk and/or confidence data can be determined using the first risk and/or confidence data, the second risk and/or confidence data, and the third risk and/or confidence data.

In other cases, when risk and/or confidence data are being determined for M-PST-related models, maps, patterns, data, and/or procedures, the exposure focus accuracy data, the exposure dose accuracy data, and/or the post exposure bake (PEB) temperature accuracy data can be compared to M-PST related limits such as the exposure focus accuracy limits, the exposure dose accuracy limits, and/or the post exposure bake (PEB) temperature accuracy limits. For example, first risk and/or confidence data can be determined by comparing the exposure focus accuracy data to the exposure focus accuracy limits, second risk and/or confidence data can be determined by comparing the exposure dose accuracy data to the exposure dose accuracy limits, third risk and/or confidence data can be determined by comparing the PEB temperature accuracy data to the PEB temperature accuracy limits, and total risk and/or confidence data can be determined using the first risk and/or confidence data, the second risk and/or confidence data, and the third risk and/or confidence data.

In still other cases, when risk and/or confidence data are being determined for M-PST-related models, maps, patterns, data, and/or procedures, the exposure focus precision data, the exposure dose precision data, and/or the post exposure bake (PEB) temperature precision data can be compared to M-PST related limits such as the exposure focus precision limits, the exposure dose precision limits, and/or the post exposure bake (PEB) temperature precision limits. For example, first risk and/or confidence data can be determined by comparing the exposure focus precision data to the exposure focus precision limits, second risk and/or confidence data can be determined by comparing the exposure dose precision data to the exposure dose precision limits, third risk and/or confidence data can be determined by comparing the PEB temperature precision data to the PEB temperature precision limits, and total risk and/or confidence data can be determined using the first risk and/or confidence data, the second risk and/or confidence data, and the third risk and/or confidence data.

When exposure focus data is required, the exposure focus data can be determined using one or more models, and a first set of space features and/or structure features from one or more of the developed M-PST patterns (321, FIG. 3B), (421, FIG. 4B), (521, FIG. 5B), and (621, FIG. 6B). For example, exposure focus data can be calculated using one or more neural network models and the top CD data, the bottom CD data, the SWA data, the masking thickness data, the masking material data, the pitch data, the location data, the site data, and/or the period data associated with a first set of space features and/or structure features in one or more of the developed M-PST patterns (321, FIG. 3B), (421, FIG. 4B), (521, FIG. 5B), and (621, FIG. 6B). Alternatively, the exposure focus data can be determined using one or more neural network models, and a first set of transparent regions and/or opaque regions from one or more of the M-PST masking patterns (301, FIG. 3A), (401, FIG. 4A), (501, FIG. 5A), and (601, FIG. 6A). For example, exposure focus data can be calculated using one or more neural network models and the top CD data, the bottom CD data, the SWA data, the mask thickness data, the mask material data, the pitch data, the location data, the site data, and/or the period data associated with a first set of transparent regions and/or opaque regions in one or more of the M-PST masking patterns (301, FIG. 3A), (401, FIG. 4A), (501, FIG. 5A), and (601, FIG. 6A).

When exposure dose data is required, the exposure dose data can be determined using one or more neural network models, and a second set of space features and/or structure features from one or more of the developed M-PST patterns (321, FIG. 3B), (421, FIG. 4B), (521, FIG. 5B), and (621, FIG. 6B). For example, exposure dose data can be calculated using one or more neural network models and the top CD data, the bottom CD data, the SWA data, the masking thickness data, the masking material data, the pitch data, the location data, the site data, and/or the period data associated with a second set of space features and/or structure features in one or more of the developed M-PST patterns (321, FIG. 3B), (421, FIG. 4B), (521, FIG. 5B), and (621, FIG. 6B). Alternatively, the exposure focus data can be determined using one or more neural network models, and a second set of transparent regions and/or opaque regions from one or more of the M-PST masking patterns (301, FIG. 3A), (401, FIG. 4A), (501, FIG. 5A), and (601, FIG. 6A). For example, exposure focus data can be calculated using one or more neural network models and the top CD data, the bottom CD data, the SWA data, the mask thickness data, the mask material data, the pitch data, the location data, the site data, and/or the period data associated with a second set of transparent regions and/or opaque regions in one or more of the M-PST masking patterns (301, FIG. 3A), (401, FIG. 4A), (501, FIG. 5A), and (601, FIG. 6A).

When PEB temperature data is required, the PEB temperature data can determined using one or more neural network models and a third set of space features and/or structure features from one or more of the developed M-PST patterns (321, FIG. 3B), (421, FIG. 4B), (521, FIG. 5B), and (621, FIG. 6B). For example, PEB temperature data can be calculated using one or more neural network models and the top CD data, the bottom CD data, the SWA data, the masking thickness data, the masking material data, the pitch data, the location data, the site data, and/or the period data associated with a third set of space features and/or structure features in one or more of the developed M-PST patterns (321, FIG. 3B), (421, FIG. 4B), (521, FIG. 5B), and (621, FIG. 6B). Alternatively, the PEB temperature data can be determined using one or more neural network models, and a third set of transparent regions and/or opaque regions from one or more of the M-PST masking patterns (301, FIG. 3A), (401, FIG. 4A), (501, FIG. 5A), and (601, FIG. 6A). For example, exposure focus data can be calculated using one or more neural network models and the top CD data, the bottom CD data, the SWA data, the mask thickness data, the mask material data, the pitch data, the location data, the site data, and/or the period data associated with the third set of transparent regions and/or opaque regions in one or more of the M-PST masking patterns (301, FIG. 3A), (401, FIG. 4A), (501, FIG. 5A), and (601, FIG. 6A).

In some examples, individual and/or total exposure dose variation values for the M-PST procedure can be compared to individual and/or total exposure dose variation limits. The processing of a set of substrates can continue, if one or more of the exposure dose variation limits are met, or corrective actions can be applied if one or more of the exposure dose variation limits are not met. Corrective actions can include establishing new exposure dose variation values for one or more additional sites and/or substrates, comparing the new exposure dose variation values to new exposure dose variation limits; and either continuing the M-PST procedure, if one or more of the new exposure dose variation limits are met, or stopping the M-PST procedure, if one or more of the new exposure dose variation limits are not met.

In other examples, individual and/or total exposure focus variation values for the M-PST procedure can be compared to individual and/or total exposure focus variation limits. The processing of a set of substrates can continue, if one or more of the exposure focus variation limits are met, or corrective actions can be applied if one or more of the exposure focus variation limits are not met. Corrective actions can include establishing new exposure focus variation values for one or more additional sites and/or substrates, comparing the new exposure focus variation values to new exposure focus variation limits; and either continuing the M-PST procedure, if one or more of the new exposure focus variation limits are met, or stopping the M-PST procedure, if one or more of the new exposure focus variation limits are not met.

In still other examples, individual and/or total PEB temperature variation values for the M-PST procedure can be compared to individual and/or total PEB temperature variation limits. The processing of a set of substrates can continue, if one or more of the PEB temperature variation limits are met, or corrective actions can be applied if one or more of the PEB temperature variation limits are not met. Corrective actions can include establishing new PEB temperature variation values for one or more additional sites and/or substrates, comparing the new PEB temperature variation values to new PEB temperature variation limits; and either continuing the M-PST procedure, if one or more of the new PEB temperature variation limits are met, or stopping the M-PST procedure, if one or more of the new PEB temperature variation limits are not met.

One or more of the developed M-PST patterns (321, FIG. 3B), (421, FIG. 4B), (521, FIG. 5B), and (621, FIG. 6B) can be created using different developer chemistries. The develop data can include chemistry data, spinner data, dispense data, thermal data, and other processing data. For example, the unexposed regions can be insoluble in the aqueous alkaline solutions used as developers, and the exposed regions can be soluble in aqueous alkaline solutions used as the developers. In addition, the developers for some positive masking materials can include aqueous solutions of inorganic alkalis, amines, alcoholamines, quaternary ammonium salts, or cyclic amines, or any combination thereof. Furthermore, an alcohol, or a surfactant may be added to the developing solution as required. In alternate embodiments, organic developers may be used.

After a verified M-PST procedure is performed, one or more reference "golden" M-PST patterns can be produced at one or more sites on each of the reference "golden" M-PST substrates. When a first reference "golden" M-PST substrate is created, a first site can be selected from the number of required sites on the first reference "golden" M-PST substrate, and the first site can have a first reference "golden" M-PST pattern associated therewith that was created using the verified M-PST procedure. First M-PST pattern verification/reference data can be obtained from the first site on the first substrate, and additional M-PST pattern verification/reference data can be obtained from additional sites on the first substrate or on additional substrates. The M-PST pattern verification/reference data can include M-PST pattern-related measurement, evaluation, and/or inspection data. In addition, simulated and/or predicted data can be established for one or more M-PST patterns and/or structures at one or more sites on one or more substrates. Additional M-PST pattern verification/reference data can be obtained from additional sites on the first substrate or on additional substrates. In addition, simulated and/or predicted data can be established for one or more M-PST patterns, features, and/or structures at one or more sites on one or more substrates.

The M-PST data can include profile data for the M-PST and optical data associated with the profile data, and the library data can include image data for the M-PST and optical data associated with the image data. The library data can include data for single layer M-PSTs, multi-layer M-PSTs, partially-developed M-PSTs, protected M-PSTs, damaged M-PST, trimmed M-PSTs, filled M-PSTs, semi-filled M-PSTs. In addition, the library data can include data for M-PSTs associated with capacitor structures, gate structures, gate electrode structures, gate stack structures, transistor structures, FinFET structures, Complementary Metal-Oxide Semiconductor (CMOS) structures, pFET structures, nFET structures, photoresist structures, periodic structures, alignment structures, trench structures, via structures, array structures, grating structures, or any combination thereof. Furthermore, the library data can include modeling data, historical data, or real-time data or any combination thereof may be used.

In addition, when judgment and/or intervention rules are associated with M-PST procedures, they can be executed. Intervention and/or judgment rule evaluation procedures and/or limits can be performed based on historical procedures, on the customer's experience, or process knowledge, or obtained from a host computer. M-PST related rules can be used in FDC procedures to determine how to respond to alarm conditions, error conditions, fault conditions, and/or warning conditions. The M-PST related FDC procedures can prioritize and/or classify faults, predict system performance, predict preventative maintenance schedules, decrease maintenance downtime, and extend the service life of consumable parts in the system.

Before, during, and/or after an M-PST procedure is performed, simulation, modeling and/or prediction data can be created and/or modified. The new simulation and/or prediction data can be used in real time to update the calculations, models, and/or M-PST procedures For example, prediction models can include process chemistry models, chamber models, EM models, SPC charts, PLS models, PCA models, FDC models, and Multivariate Analysis (MVA) models.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method of processing a substrate comprising:
creating a first mask having a first multi-pitch scatterometry target (M-PST) masking pattern therein, the first M-PST masking pattern being aligned in a first direction;
creating a first patterned layer on a patterned substrate using the first mask, a first exposure procedure, and a first developing procedure, wherein the first patterned layer includes a first developed M-PST pattern, the first developed M-PST pattern comprising a plurality of structure features and a plurality of space features, each space feature being located next to at least one structure feature, wherein the structure features include at least one isolated structure feature and at least one dense structure feature, the space features including at least one isolated space feature and at least one dense space feature;
calculating a plurality of output parameters using a neural network model and a plurality of input parameters, wherein at least one of the input parameters is determined using diffraction signal data from one or more of the structure features and one or more of the space features in the first developed M-PST pattern;
determining confidence data using the neural network model, one or more of the output parameters, and/or one or more of the input parameters;
comparing the confidence data to a first confidence threshold;
identifying the first developed M-PST pattern as a verified pattern when the confidence data is greater than the first confidence threshold; and
performing one or more corrective actions when the confidence data is not greater than the first confidence threshold.

2. The method of claim 1, wherein the first developed M-PST pattern is oriented relative to an X-axis and comprises a first isolated space feature ($S_{30}$) located at a leftmost position of the first developed M-PST pattern, a first isolated structure feature ($F_{30}$) is located on the right-hand side of the first isolated space feature ($S_{30}$), a second isolated space feature ($S_{31}$) is located on the right-hand side of the first isolated structure feature ($F_{30}$), a first dense structure feature ($F_{31}$) is located on the right-hand side of the second isolated space feature ($S_{31}$), a third isolated space feature ($S_{32}$) is located on the right-hand side of the first dense structure feature ($F_{31}$), a second dense structure feature ($F_{32}$) is located on the right-hand side of the third isolated space feature ($S_{32}$), a first dense space feature ($S_{33}$) is located on the right-hand side of the second dense structure feature ($F_{32}$), a third dense structure feature ($F_{33}$) is located on the right-hand side of the first dense space feature ($S_{33}$), a second dense space feature ($S_{34}$) is located on the right-hand side of the third dense structure feature ($F_{33}$), a fourth dense structure feature ($F_{34}$) is located on the right-hand side of the second dense space feature ($S_{34}$), a third dense space feature ($S_{35}$) is located on the right-hand side of the fourth dense structure feature ($F_{34}$), a fifth dense structure feature ($F_{35}$) is located on the right-hand side of the third dense space feature ($S_{35}$), a fourth dense space feature ($S_{36}$) is located on the right-hand side of the fifth dense structure feature ($F_{35}$), a sixth dense structure feature ($F_{36}$) is located on the right-hand side of the fourth dense space feature ($S_{36}$), a fifth dense space feature ($S_{37}$) is located on the right-hand side of the sixth dense structure feature ($F_{36}$), a seventh dense structure feature ($F_{37}$) is located on the right-hand side of the fifth dense space feature ($S_{37}$), a fourth isolated space feature ($S_{38}$) is located on the right-hand side of the seventh dense structure feature ($F_{37}$), an eighth dense structure feature ($F_{38}$) is located on the right-hand side of the fourth isolated space feature ($S_{38}$), a fifth isolated space feature ($S_{39}$) is located on the right-hand side of the eighth dense structure feature ($F_{38}$), a second isolated structure feature ($F_{39}$) is located on the right-hand side of the fifth isolated space feature ($S_{39}$), and a sixth isolated space feature ($S_{39a}$) is located on the right-hand side of the second isolated structure feature ($F_{39}$).

3. The method of claim 2, wherein the first isolated space feature ($S_{30}$) comprises a top critical dimension (CD) ($d_{0a}$) and a bottom CD ($d_{0b}$); the second isolated space feature ($S_{31}$) comprises a top CD ($d_{1a}$) and a bottom CD ($d_{1b}$); the third isolated space feature ($S_{32}$) comprises a top CD ($d_{2a}$) and a bottom CD ($d_{2b}$); the first dense space feature ($S_{33}$) comprises a top CD ($d_{3a}$) and a bottom CD ($d_{3b}$); the second dense space feature ($S_{34}$) comprises a top CD ($d_{4a}$) and a bottom CD ($d_{4b}$); the third dense space feature ($S_{35}$) comprises a top CD ($d_{5a}$) and a bottom CD ($d_{5b}$); the fourth dense space feature ($S_{36}$) comprises a top CD ($d_{6a}$) and a bottom CD ($d_{6b}$); the fifth dense space feature ($S_{37}$) comprises a top CD ($d_{7a}$) and a bottom CD ($d_{7b}$); the fourth isolated space feature ($S_{38}$) comprises a top CD ($d_{8a}$) and a bottom CD ($d_{8b}$); the fifth isolated space feature ($S_{39}$) comprises a top CD ($d_{9a}$) and a bottom CD ($d_{9b}$); and the sixth isolated space feature ($S_{39a}$) comprises a top CD ($d_{10a}$) and a bottom CD ($d_{10b}$); and the first isolated structure feature ($F_{30}$) comprising a top CD ($w_{0a}$), a bottom CD ($w_{0b}$), a first sidewall angle (SWA) ($\alpha_{0a}$), and a second SWA ($\alpha_{0b}$); the first dense structure feature ($F_{31}$) comprising a top CD ($w_{1a}$), a bottom CD ($w_{1b}$), a first SWA ($\alpha_{1a}$), and a second SWA ($\alpha_{1b}$); the second dense structure feature ($F_{32}$) comprising a top CD ($\alpha_{2a}$), a bottom CD ($w_{2b}$), a first SWA ($\alpha_{2a}$), and a second SWA ($\alpha_{2b}$); the third dense structure feature ($F_{33}$) comprising a top CD ($w_{3a}$), a bottom CD ($w_{3b}$), a first SWA ($\alpha_{3a}$), and a second SWA ($\alpha_{3b}$); the fourth dense structure feature ($F_{34}$) comprising a top CD ($w_{4a}$), a bottom CD ($w_{4b}$), a first SWA ($\alpha_{4a}$), and a second SWA ($\alpha_{4b}$); the fifth dense structure feature ($F_{35}$) comprising a top CD ($w_{5a}$), a bottom CD ($w_{5b}$), a first SWA ($\alpha_{5a}$), and a second SWA ($\alpha_{5b}$); the sixth dense structure feature ($F_{36}$) comprising a top CD ($w_{6a}$), a bottom CD ($w_{6b}$), a first SWA ($\alpha_{6a}$), and a second SWA ($\alpha_{6b}$); the seventh dense structure feature ($F_{37}$) comprising a top CD ($w_{7a}$), a bottom CD ($w_{7b}$), a first SWA ($\alpha_{7a}$), and a second SWA ($\alpha_{7b}$); the eighth dense structure feature ($F_{38}$) comprising a top CD ($w_{8a}$), a bottom CD ($w_{8b}$), a first SWA ($\alpha_{8a}$), and a second SWA ($\alpha_{8b}$); and the second isolated structure feature ($F_{39}$) comprising a top CD ($w_{9a}$), a bottom CD ($w_{9b}$), a first SWA ($\alpha_{9a}$), and a second SWA ($\alpha_{9b}$).

4. The method of claim 3, wherein the top CD ($w_{0a}$) ranges from 5 nm to 500 nm, and the bottom CD ($w_{0b}$) ranges from 10 nm to 500 nm; the top CD ($w_{1a}$) ranges from 5 nm to 200 nm, and the bottom CD ($w_{1b}$) ranges from 10 nm to 200 nm; the top CD ($w_{2a}$) ranges from 5 nm to 200 nm, and the bottom CD ($w_{2b}$) ranges from 10 nm to 200 nm; the top CD ($w_{3a}$) ranges from 5 nm to 200 nm, and the bottom CD ($w_{3b}$) ranges from 10 nm to 200 nm; the top CD ($w_{4a}$) ranges from 5 nm to 200 nm, and the bottom CD ($w_{4b}$) ranges from 10 nm to 200 nm; the top CD ($w_{5a}$) ranges from 5 nm to 200 nm, and the bottom CD ($w_{5b}$) ranges from 10 nm to 200 nm; the top CD ($w_{6a}$) ranges from 5 nm to 200 nm, and the bottom CD ($w_{6b}$) ranges from 10 nm to 200 nm; the top CD ($w_{7a}$) ranges from 5 nm to 200 nm, and the bottom CD ($w_{7b}$) ranges from 10 nm to 200 nm; the top CD ($w_{8a}$) ranges from 5 nm to 200 nm, and the bottom CD ($w_{8b}$) ranges from 10 nm to 200 nm; and the top CD ($w_{9a}$) ranges from 5 nm to 500 nm, and the bottom CD ($w_{9b}$) ranges from 10 nm to 500 nm, the first SWA ($\alpha_{0a}$) ranging from 80 degrees to 99 degrees, and the second SWA ($\alpha_{0b}$) ranging from 88 degrees to 92 degrees; the first SWA ($\alpha_{1a}$) ranging from 85 degrees to 95 degrees, and the second SWA ($\alpha_{1b}$) ranging from 85 degrees to 95 degrees; the first SWA ($\alpha_{ta}$) ranging from 85 degrees to 95 degrees, and the second SWA ($\alpha_{2b}$) ranging from 85 degrees to 95 degrees; the first SWA ($\alpha_{3a}$) ranging from 85 degrees to 95 degrees, and the second SWA ($\alpha_{4a}$) ranging from 85 degrees to 95 degrees; the first SWA ($\alpha_{4a}$) ranging from 85 degrees to 95 degrees, and the second SWA ($\alpha_{4b}$) ranging from 85 degrees to 95 degrees; the first SWA ($\alpha_{5a}$) ranging from 85 degrees to 95 degrees, and the second SWA ($\alpha_{5b}$) ranging from 85 degrees to 95 degrees; the first SWA ($\alpha_{6a}$) ranging from 85 degrees to 95 degrees, and the second SWA ($\alpha_{6b}$) ranging from 85 degrees to 95 degrees; the first SWA ($\alpha_{7a}$) ranging from 85 degrees to 95 degrees, and the second SWA ($\alpha_{7b}$) ranging from 85 degrees to 95 degrees; the first SWA ($\alpha_{8a}$) ranging from 85 degrees to 95 degrees, and the second SWA ($\alpha_{8b}$) ranging from 85 degrees to 95 degrees; and the first SWA ($\alpha_{9a}$) ranging from 80 degrees to 99 degrees, and the second SWA ($\alpha_{9b}$) ranging from 80 degrees to 99 degrees.

5. The method of claim 2, wherein a thickness ($t_{30}$) of the first isolated structure feature ($F_{30}$) ranges from 10 nm to 150 nm; a thickness ($t_{31}$) of the first dense structure feature ($F_{31}$) ranges from 10 nm to 150 nm; a thickness ($t_{32}$) of the second dense structure feature ($F_{32}$) ranges from 10 nm to 150 nm; a thickness ($t_{33}$) of the third dense structure feature ($F_{33}$) ranges from 10 nm to 150 nm; a thickness ($t_{34}$) of the fourth dense structure feature ($F_{34}$) ranges from 10 nm to 150 nm; a thickness ($t_{35}$) of the fifth dense structure feature ($F_{35}$) ranges from 10 nm to 150 nm; a thickness ($t_{36}$) of the sixth dense structure feature ($F_{36}$) ranges from 10 nm to 150 nm; a thickness ($t_{37}$) of the seventh dense structure feature ($F_{37}$) ranges from 10 nm to 150 nm; a thickness ($t_{38}$) of the eighth dense structure feature ($F_{38}$) ranges from 10 nm to 150 nm; and a thickness ($t_{39}$) of the second isolated structure feature ($F_{39}$) ranges from 10 nm to 150 nm.

6. The method of claim 2, wherein the neural network model comprises a neural network having at least three sets of input parameters, a plurality of hidden nodes, and at least three output parameters, wherein a first set of input parameters are associated with a first group of features ($F_{30}$-$F_{39}$) in the first developed M-PST pattern, a second set of input parameters are associated with a second group of features ($F_{30}$-$F_{39}$), and a third set of input parameters are associated with a third group of features ($F_{30}$-$F_{39}$), wherein the first set of input parameters comprise top critical dimension (CD) data, bottom CD data, and thickness data for at least one of the first group of features ($F_{30}$-$F_{39}$), the second set of input parameters comprise top CD data, bottom CD data, and thickness data for at least one of the second group of features ($F_{30}$-$F_{39}$), and the third set of input parameters comprise top CD data, bottom CD data, and thickness data for at least one of the third group of features ($F_{30}$-$F_{39}$), and wherein the output parameters comprise exposure focus data, exposure dose data, Post Exposure Bake temperature data, exposure dose variation data, exposure focus variation data, or post exposure bake (PEB) temperature variation data, or any combination thereof.

7. The method of claim 1, wherein the first developed M-PST pattern is oriented relative to an X-axis and comprises a first isolated space feature ($S_{40}$) located at a leftmost position of the second M-PST masking pattern, wherein a first dense structure feature ($F_{40}$) is located on the right-hand side of the first isolated space feature ($S_{40}$), a first dense space feature ($S_{41}$) is located on the right-hand side of the first dense structure feature ($F_{40}$), a second dense structure feature ($F_{41}$) is located on the right-hand side of the first dense space feature ($S_{41}$), a second isolated space feature ($S_{42}$) is located on the right-hand side of the second dense structure feature ($F_{41}$), a third dense structure feature ($F_{42}$) is located on the right-hand side of the second isolated space feature ($S_{42}$), a third isolated space feature ($S_{43}$) is located on the right-hand side of the third dense structure feature ($F_{42}$), a first isolated structure feature ($F_{43}$) is located on the right-hand side of the third isolated space feature ($S_{43}$), a fourth isolated space feature ($S_{44}$) is located on the right-hand side of the first isolated structure feature ($F_{43}$), a second isolated structure feature ($F_{44}$) is located on the right-hand side of the fourth isolated space feature ($S_{44}$), a fifth isolated space feature ($S_{45}$) is located on the right-hand side of the second isolated structure feature ($F_{44}$), a fourth dense structure feature ($F_{45}$) is located on the right-hand side of the fifth isolated space feature ($S_{45}$), a sixth isolated space feature ($S_{46}$) is located on the right-hand side of the fourth dense structure feature ($F_{45}$), a fifth dense structure feature ($F_{46}$) is located on the right-hand side of the sixth isolated space feature ($S_{46}$), a second dense space feature ($S_{47}$) is located on the right-hand side of the fifth dense structure feature ($F_{46}$), a sixth dense structure feature ($F_{47}$) is located on the right-hand side of the second dense space feature ($S_{47}$), and a seventh isolated space feature ($S_{48}$) is located on the right-hand side of the sixth dense structure feature ($F_{47}$).

8. The method of claim 7, wherein the first isolated space feature ($S_{40}$) comprises a top critical dimension (CD) ($d_{0a}$) and a bottom CD ($d_{0b}$); the first dense space feature ($S_{41}$) comprises a top CD ($d_{1a}$) and a bottom CD ($d_{1b}$); the second isolated space feature ($S_{42}$) comprises a top CD ($d_{2a}$) and a bottom CD ($d_{2b}$); the third isolated space feature ($S_{43}$) comprises a top CD ($d_{3a}$) and a bottom CD ($d_{3b}$); the fourth isolated space feature ($S_{44}$) comprises a top CD ($d_{4a}$) and a bottom CD ($d_{4b}$); the fifth isolated space feature ($S_{45}$) comprises a top CD ($d_{5a}$) and a bottom CD ($d_{5b}$); the sixth isolated space feature ($S_{46}$) comprises a top CD ($d_{6a}$) and a bottom CD ($d_{6b}$); the second dense space feature ($S_{47}$) comprises a top CD ($d_{7a}$) and a bottom CD ($d_{7b}$); and the seventh isolated space feature ($S_{48}$) comprises a top CD ($d_{8a}$) and a bottom CD ($d_{8b}$); and the first dense structure feature ($F_{40}$) comprising a top CD ($w_{0a}$), a bottom CD ($w_{0b}$), a first sidewall angle (SWA) ($\alpha_{0a}$), and a second SWA ($\alpha_{0b}$); the second dense structure feature ($F_{41}$) comprising a top CD ($w_{1a}$), a bottom CD ($w_{1b}$), a first SWA ($\alpha_{1a}$), and a second SWA ($\alpha_{1b}$); the third dense structure feature ($F_{42}$) comprising a top CD ($w_{2a}$), a bottom CD ($w_{2b}$), a first SWA ($\alpha_{2a}$), and a second SWA ($\alpha_{2b}$); the first isolated structure feature ($F_{43}$) comprising a top CD ($w_{3a}$), a bottom CD ($w_{3b}$), a first SWA ($\alpha_{3a}$), and a second SWA ($\alpha_{3b}$); the second isolated structure feature ($F_{44}$) comprising a top CD ($w_{4a}$), a bottom CD ($w_{4b}$), a first SWA ($\alpha_{4a}$), and a second SWA ($\alpha_{4b}$); the fourth dense structure feature ($F_{45}$) comprising a top CD ($w_{5a}$), a bottom CD ($w_{5b}$), a first SWA ($\alpha_{5a}$), and a second SWA ($\alpha_{5b}$); the fifth dense structure feature ($F_{46}$) comprising a top CD ($w_{6a}$), a bottom CD ($w_{6b}$), a first SWA ($\alpha_{6a}$), and a second SWA ($\alpha_{6b}$); and the sixth dense structure feature ($F_{47}$) comprising a top CD ($w_{7a}$), a bottom CD ($w_{7b}$), a first SWA ($\alpha_{7a}$), and a second SWA ($\alpha_{7b}$).

9. The method of claim 8, wherein the top CD ($d_{0a}$) can range from 10 nm to 400 nm, and the bottom CD ($d_{0b}$) can range from 5 nm to 400 nm; the top CD ($d_{1a}$) ranges from 10 nm to 100 nm, and the bottom CD ($d_1b$) ranges from 5 nm to 100 nm; the top CD ($d_{2a}$) ranges from 10 nm to 400 nm, and the bottom CD ($d_{2b}$) ranges from 5 nm to 400 nm; the top CD ($d_{3a}$) ranges from 10 nm to 400 nm, and the bottom CD ($d_{ab}$) ranges from 5 nm to 400 nm; the top CD ($d_{4a}$) ranges from 10 nm to 100 nm, and the bottom CD ($d_{4b}$) ranges from 10 nm to 400 nm; the top CD ($d_{5a}$) ranges from 10 nm to 400 nm, and the bottom CD ($d_{5b}$) ranges from 5 nm to 400 nm; the top CD ($d_{6a}$) ranges from 10 nm to 100 nm, and the bottom CD ($d_{6b}$) ranges from 10 nm to 400 nm; the top CD ($d_{7a}$) ranges from 10 nm to 100 nm, and the bottom CD ($d_{7b}$) ranges from 5 nm to 400 nm; and the top CD ($d_{8a}$) ranges from 10 nm to 400 nm, and the bottom CD ($d_{8b}$) ranges from 5 nm to 400 nm; and the first SWA ($\alpha_{0a}$) ranging from 80 degrees to 99 degrees, and the second SWA ($\alpha_{0b}$) ranging from 88 degrees to 92 degrees; the first SWA ($\alpha_{1a}$) ranging from 85 degrees to 95 degrees, and the second SWA ($\alpha_{1b}$) ranging from 85 degrees to 95 degrees; the first SWA ($\alpha_{2a}$) ranging from 85 degrees to 95 degrees, and the second SWA ($\alpha_{2b}$) ranging from 85 degrees to 95 degrees; the first SWA ($\alpha_{3a}$) ranging from 85 degrees to 95 degrees, and the second SWA ($\alpha_{3b}$) ranging from 85 degrees to 95 degrees; the first SWA ($\alpha_{4a}$) ranging from 85 degrees to 95 degrees, and the second SWA ($\alpha_{0b}$) ranging from 85 degrees to 95 degrees; the first SWA ($\alpha_{5a}$) ranging from 85 degrees to 95 degrees, and the second SWA ($\alpha_{5b}$) ranging from 85 degrees to 95 degrees; the first SWA ($\alpha_{ha}$) ranging from 85 degrees to 95 degrees, and the second SWA ($\alpha_{6b}$) ranging from 85 degrees to 95 degrees; the first SWA ($\alpha_{7a}$) ranging from 85 degrees to 95 degrees, and the second SWA ($\alpha_{7b}$) ranging from 85 degrees to 95 degrees.

10. The method of claim 7, wherein a thickness ($t_{40}$) of the first dense structure feature ($F_{40}$) ranges from 10 nm to 150 nm; a thickness ($t_{41}$) of the second dense structure feature ($F_{41}$) ranges from 10 nm to 150 nm; a thickness ($t_{42}$) of the third dense structure feature ($F_{42}$) ranges from 10 nm to 150 nm; a thickness ($t_{43}$) of the first isolated structure feature ($F_{43}$) ranges from 10 nm to 150 nm; a thickness ($t_{44}$) of the second isolated structure feature ($F_{44}$) ranges from 10 nm to 150 nm; a thickness ($t_{45}$) of the fourth dense structure feature ($F_{45}$) ranges from 10 nm to 150 nm; a thickness ($t_{46}$) of the fifth dense structure feature ($F_{46}$) ranges from 10 nm to 150 nm; and a thickness ($t_{47}$) of the sixth dense structure feature ($F_{47}$) ranges from 10 nm to 150 nm.

11. The method of claim 7, wherein the neural network model comprises a neural network having at least three sets of input parameters, a plurality of hidden nodes, and at least three output parameters, wherein a first set of input parameters are associated with a first group of features ($F_{40}$-$F_{47}$) in the first developed M-PST pattern, a second set of input parameters are associated with a second group of features ($F_{40}$-$F_{47}$), and a third set of input parameters can be associated with a third group of features ($F_{40}$-$F_{47}$), the first set of input parameters comprising top CD data, bottom CD data, and thickness data for at least one of the first group of features ($F_{40}$-$F_{47}$), the second set of input parameters comprising top CD data, bottom CD data, and thickness data for at least one of the second group of features ($F_{40}$-$F_{47}$), and the third set of input parameters comprising top CD data, bottom CD data, and thickness data for at least one of the third group of features ($F_{40}$-$F_{47}$), wherein the output parameters comprise exposure focus data, exposure dose data, Post Exposure Bake temperature data, exposure dose variation data, exposure focus variation data, or post exposure bake (PEB) temperature variation data, or any combination thereof.

12. The method of claim 1, wherein the first developed M-PST pattern is oriented relative to an X-axis and comprises: a first isolated space feature ($S_{50}$) being located at a leftmost position of the first M-PST masking pattern, a first isolated structure feature ($F_{50}$) being located on the right-hand side of the first isolated space feature ($S_{50}$), a second isolated space feature ($S_{51}$) being located on the right-hand side of the first isolated structure feature ($F_{50}$), a first dense structure feature ($F_{51}$) being located on the right-hand side of the second isolated space feature ($S_{51}$), a first dense space feature ($S_{52}$) being located on the right-hand side of the first dense structure feature ($F_{51}$), a second dense structure feature ($F_{52}$) being located on the right-hand side of the first dense space feature ($S_{52}$), a second dense space feature ($S_{53}$) being located on the right-hand side of the second dense structure feature ($F_{52}$), a third dense structure feature ($F_{53}$) being located on the right-hand side of the second dense space feature ($S_{53}$), a third dense space feature ($S_{54}$) being located on the right-hand side of the third dense structure feature ($F_{53}$), a fourth dense structure feature ($F_{54}$) being located on the right-hand side of the third dense space feature ($S_{54}$), a fourth dense space feature ($S_{55}$) being located on the right-hand side of the fourth dense structure feature ($F_{54}$), a fifth dense structure feature ($F_{55}$) being located on the right-hand side of the fourth dense space feature ($S_{55}$), a fifth dense space feature ($S_{56}$) being located on the right-hand side of the fifth dense structure feature ($F_{55}$), a sixth dense structure feature ($F_{56}$) being located on the right-hand side of the fifth dense space feature ($S_{56}$), a sixth dense space feature ($S_{57}$) being located on the right-hand side of the sixth dense structure feature ($F_{56}$), a seventh dense structure feature ($F_{57}$) being located on the right-hand side of the sixth dense space feature ($S_{57}$), a seventh dense space feature ($S_{58}$) being located on the right-hand side of the seventh dense structure feature ($F_{57}$), an eighth dense structure feature ($F_{58}$) being located on the right-hand side of the seventh dense space feature ($S_{58}$), a third isolated space feature ($S_{59}$) being located on the right-hand side of the eighth dense structure feature ($F_{58}$), a second isolated structure feature ($F_{59}$) being located on the right-hand side of the third isolated space feature ($S_{59}$), and a fourth isolated space feature ($S_{59a}$) being located on the right-hand side of the second isolated structure feature ($F_{59}$).

13. The method of claim 12, wherein the first isolated space feature ($S_{50}$) comprises a top critical dimension (CD) ($x_{0a}$) and a bottom CD ($x_{0b}$); the second isolated space feature ($S_{51}$) comprises a top CD ($x_{1a}$) and a bottom CD ($x_{1b}$); the first dense space feature ($S_{52}$) comprises a top CD ($x_{2a}$) and a bottom CD ($x_{2b}$); the second dense space feature ($S_{53}$) comprises a top CD ($x_{3a}$) and a bottom CD ($x_{3b}$); the third dense space feature ($S_{54}$) comprises a top CD ($x_{4a}$) and a bottom CD ($x_{4b}$); the fourth dense space feature ($S_{55}$) comprises a top CD ($x_{5a}$) and a bottom CD ($x_{5b}$); the fifth dense space feature ($S_{56}$) comprises a top CD ($x_{6a}$) and a bottom CD ($x_{6b}$); the sixth dense space feature ($S_{57}$) comprises a top CD ($x_{7a}$) and a bottom CD ($x_{7b}$); the seventh dense space feature ($S_{58}$) comprises a top CD ($x_{8a}$) and a bottom CD ($x_{8b}$); the third isolated space feature ($S_{59}$) comprises a top CD ($x_{9a}$) and a bottom CD ($x_{9b}$); and the fourth isolated space feature ($S_{59a}$) comprises a top CD ($x_{10a}$) and a bottom CD ($x_{10b}$), and wherein the first isolated structure feature ($F_{50}$) comprises a top CD ($w_{0a}$), a bottom CD ($w_{0b}$), a first sidewall angle (SWA) ($\alpha_{0a}$), and a second SWA ($\alpha_{0b}$); the first dense structure feature ($F_{51}$) comprises a top CD ($w_{1a}$), a bottom CD ($w_{1b}$), a first SWA ($\alpha_{1a}$), and a second SWA ($\alpha_{1b}$); the second dense structure feature ($F_{52}$) comprises a top CD ($w_{2a}$), a bottom CD ($w_{2b}$), a first SWA ($\alpha_{2a}$), and a second SWA ($\alpha_{2b}$); the third dense structure feature ($F_{53}$) comprises a top CD ($w_{3a}$), a bottom CD ($w_{3b}$), a first SWA ($\alpha_{3a}$), and a second SWA ($\alpha_{3b}$); the fourth dense structure feature ($F_{54}$) comprises a top CD ($w_{4a}$), a bottom CD ($w_{4b}$), a first SWA ($\alpha_{4a}$), and a second SWA ($\alpha_{4b}$); the fifth dense structure feature ($F_{55}$) comprises a top CD ($w_{5a}$), a bottom CD ($w_{5b}$), a first SWA ($\alpha_{5a}$), and a second SWA ($\alpha_{5b}$); the sixth dense structure feature ($F_{56}$) comprises a top CD ($w_{6a}$), a bottom CD ($w_{6b}$), a first SWA ($\alpha_{6a}$), and a second SWA ($\alpha_{6b}$); the seventh dense structure feature ($F_{57}$) comprises a top CD ($w_{7a}$), a bottom CD ($w_{7b}$), a first SWA ($\alpha_{7a}$), and a second SWA ($\alpha_{7b}$); the eighth dense structure feature ($F_{58}$) comprises a top CD ($w_{8a}$), a bottom CD ($w_{8b}$), a first SWA ($\alpha_{8a}$), and a second SWA ($\alpha_{8b}$); and the second isolated structure feature ($F_{59}$) comprises a top CD ($w_{9a}$), a bottom CD ($w_{9b}$), a first SWA ($\alpha_{9a}$), and a second SWA ($\alpha_{9b}$).

14. The method of claim 13, wherein the top CD ($w_{0a}$) ranges from 5 nm to 500 nm, and the bottom CD ($w_{0b}$) ranges from 10 nm to 550 nm; the top CD ($w_{1a}$) ranges from 5 nm to 200 nm, and the bottom CD ($w_{1b}$) ranges from 10 nm to 250 nm; the top CD ($w_{2a}$) ranges from 5 nm to 200 nm, and the bottom CD ($w_{2b}$) ranges from 10 nm to 250 nm; the top CD ($w_{3a}$) ranges from 5 nm to 200 nm, and the bottom CD ($w_{3b}$) ranges from 10 nm to 250 nm; the top CD ($w_{4a}$) ranges from 5 nm to 200 nm, and the bottom CD ($w_{5b}$) ranges from 10 nm to 250 nm; the top CD ($w_{5a}$) ranges from 5 nm to 200 nm, and the bottom CD ($w_{5b}$) ranges from 10 nm to 250 nm; the top CD ($w_{6a}$) ranges from 5 nm to 200 nm, and the bottom CD ($w_{6b}$) ranges from 10 nm to 250 nm; the top CD ($w_{7a}$) ranges from 5 nm to 200 nm, and the bottom CD ($w_{7b}$) ranges from 10 nm to 250 nm; the top CD ($w_{8a}$) ranges from 5 nm to 200 nm, and the bottom CD ($w_{8b}$) ranges from 10 nm to 250 nm; and the top CD ($w_{9a}$) ranges from 5 nm to 500 nm, and the bottom CD ($w_{9b}$) ranges from 10 nm to 550 nm; and the first SWA ($\alpha_{0a}$) ranging from 80 degrees to 99 degrees, and the second SWA ($\alpha_{0b}$) ranging from 88 degrees to 92 degrees; the first SWA ($\alpha_{1a}$) ranging from 85 degrees to 95 degrees, and the second SWA ($\alpha_{1b}$) ranging from 85 degrees to 95 degrees; the first SWA ($\alpha_{1a}$) ranging from 85 degrees to 95 degrees, and the second SWA ($\alpha_{2b}$) ranging from 85 degrees to 95 degrees; the first SWA ($\alpha_{3a}$) ranging from 85 degrees to 95 degrees, and the second SWA ($\alpha_{3b}$) ranging from 85 degrees to 95 degrees; the first SWA ($\alpha_{4a}$) ranging from 85 degrees to 95 degrees, and the second SWA ($\alpha_{4b}$) ranging from 85 degrees to 95 degrees; the first SWA ($\alpha_{5a}$) ranging from 85 degrees to 95 degrees, and the second SWA ($\alpha_{5b}$) ranging from 85 degrees to 95 degrees; the first SWA ($\alpha_{6a}$) ranging from 85 degrees to 95 degrees, and the second SWA ($\alpha_{6b}$) ranging from 85 degrees to 95 degrees; the first SWA ($\alpha_{7a}$) ranging from 85 degrees to 95 degrees, and the second SWA ($\alpha_{7b}$) ranging from 85 degrees to 95 degrees; the first SWA ($\alpha_{8a}$) ranging from 85 degrees to 95 degrees, and the second SWA ($\alpha_{8b}$) ranging from 85 degrees to 95 degrees; and the first SWA ($\alpha_{9a}$) ranging from 80 degrees to 99 degrees, and the second SWA ($\alpha_{9b}$) ranging from 80 degrees to 99 degrees.

15. The method of claim 12, wherein a thickness ($t_{50}$) of the first isolated structure feature ($F_{50}$) ranges from 10 nm to 150 nm; a thickness ($t_{51}$) of the first dense structure feature ($F_{51}$) ranges from 10 nm to 150 nm; a thickness ($t_{52}$) of the second dense structure feature ($F_{52}$) ranges from 10 nm to 150 nm; a thickness ($t_{53}$) of the third dense structure feature ($F_{53}$) ranges from 10 nm to 150 nm; a thickness ($t_{54}$) of the fourth dense structure feature ($F_{54}$) ranges from 10 nm to 150 nm; a thickness ($t_{55}$) of the fifth dense structure feature ($F_{55}$) ranges from 10 nm to 150 nm; a thickness ($t_{56}$) of the sixth dense structure feature ($F_{56}$) ranges from 10 nm to 150 nm; a thickness ($t_{57}$) of the seventh dense structure feature ($F_{57}$) ranges from 10 nm to 150 nm; a thickness ($t_{58}$) of the eighth dense structure feature ($F_{58}$) ranges from 10 nm to 150 nm; and a thickness ($t_{59}$) of the second isolated structure feature ($F_{59}$) ranges from 10 nm to 150 nm.

16. The method of claim 12, wherein the neural network model comprises a neural network having at least three sets of input parameters, a plurality of hidden nodes, and at least three output parameters, wherein a first set of input parameters are associated with a first group of features ($F_{50}$-$F_{59}$) in the first developed M-PST pattern, a second set of input parameters are associated with a second group of features ($F_{50}$-$F_{59}$), and a third set of input parameters can be associated with a third group of features ($F_{50}$-$F_{59}$), the first set of input parameters comprising top critical dimension (CD) data, bottom CD data, and thickness data for at least one of the first group of features ($F_{50}$-$F_{59}$), the second set of input parameters comprising top CD data, bottom CD data, and thickness data for at least one of the second group of features ($F_{50}$-$F_{59}$), and the third set of input parameters comprise top CD data, bottom CD data, and thickness data for at least one of the third group of features ($F_{50}$-$F_{59}$), wherein the output parameters comprise exposure focus data, exposure dose data, Post Exposure Bake temperature data, exposure dose variation data, exposure focus variation data, or post exposure bake (PEB) temperature variation data, or any combination thereof.

17. The method of claim 1, wherein the first developed M-PST pattern is oriented relative to an X-axis and comprises: a first isolated space feature ($S_{60}$) being located at a leftmost position of the first M-PST masking pattern, a first dense structure feature ($F_{60}$) being located on the right-hand side of the first isolated space feature ($S_{60}$), a first dense space feature ($S_{61}$) being located on the right-hand side of the first dense structure feature ($F_{60}$), a second dense structure feature ($F_{61}$) being located on the right-hand side of the first dense space feature ($S_{61}$), a second dense space feature ($S_{62}$) being located on the right-hand side of the second dense structure feature ($F_{61}$), a third dense structure feature ($F_{62}$) being located on the right-hand side of the second dense space feature ($S_{62}$), a second isolated space feature ($S_{63}$) being located on the right-hand side of the third dense structure feature ($F_{62}$), a fourth dense structure feature ($F_{63}$) being located on the right-hand side of the second isolated space feature ($S_{63}$), a third isolated space feature ($S_{64}$) being located on the right-hand side of the fourth dense structure feature ($F_{63}$), a fifth dense structure feature ($F_{64}$) being located on the right-hand side of the third isolated space feature ($S_{64}$), a third dense space feature ($S_{65}$) being located on the right-hand side of the fifth dense structure feature ($F_{64}$), a first isolated structure feature ($F_{65}$) being located on the right-hand side of the third dense space feature ($S_{65}$), a fourth dense space feature ($S_{66}$) being located on the right-hand side of the first isolated structure feature ($F_{65}$), a sixth dense structure feature ($F_{66}$) being located on the right-hand side of the fourth dense space feature ($S_{66}$), a fourth isolated space feature ($S_{67}$) being located on the right-hand side of the sixth dense structure feature ($F_{66}$), a seventh dense structure feature ($F_{67}$) being located on the right-hand side of the fourth isolated space feature ($S_{67}$), a fifth isolated space feature ($S_{68}$) being located on the right-hand side of the seventh dense structure feature ($F_{67}$), an eighth dense structure feature ($F_{68}$) being located on the right-hand side of the fifth isolated space feature ($S_{68}$), a fifth dense space feature ($S_{69}$) being located on the right-hand side of the eighth dense structure feature ($F_{68}$), a ninth dense structure feature ($F_{69}$) being located on the right-hand side of the fifth dense space feature ($S_{69}$), a sixth dense space feature ($S_{70}$) being located on the right-hand side of the ninth dense structure feature ($F_{69}$), a tenth dense structure feature ($F_{70}$) being located on the right-hand side of the sixth dense space feature ($S_{70}$), and a sixth isolated space feature ($S_{71}$) being located on the right-hand side of a tenth dense isolated structure feature ($F_{70}$).

18. The method of claim 17, wherein the first isolated space feature ($S_{60}$) comprises a top critical dimension (CD) ($x_{0a}$) and a bottom CD ($x_{0b}$); the first dense space feature ($S_{61}$) comprises a top CD ($x_{1a}$) and a bottom CD ($x_{1b}$); the second dense space feature ($S_{62}$) comprises a top CD ($x_{2a}$) and a bottom CD ($x_{2b}$); the second isolated space feature ($S_{63}$) comprises a top CD ($x_{3a}$) and a bottom CD ($x_{3b}$); the third isolated space feature ($S_{64}$) comprises a top CD ($x_{4a}$) and a bottom CD ($x_{4b}$); the third dense space feature ($S_{65}$) comprises a top CD ($x_{5a}$) and a bottom CD ($x_{5b}$); the fourth dense space feature ($S_{66}$) comprises a top CD ($x_{6a}$) and a bottom CD ($x_{6b}$); the fourth isolated space feature ($S_{67}$) comprises a top CD ($x_{7a}$) and a bottom CD ($x_{7b}$); the fifth isolated space feature ($S_{68}$) comprises a top CD ($x_{8a}$) and a bottom CD ($x_{8b}$); the fifth dense space feature ($S_{69}$) comprises a top CD ($x_{9a}$) and a bottom CD ($x_{9b}$); the sixth dense space feature ($S_{70}$) comprises a top CD ($x_{10a}$) and a bottom CD ($x_{10b}$); and the sixth isolated space feature ($S_{71}$) comprises a top CD ($x_{11a}$) and a bottom CD ($x_{11b}$); the first dense structure feature ($F_{60}$) comprising a top CD ($w_{0a}$), a bottom CD ($w_{0b}$), a first sidewall angle (SWA) ($\alpha_{0a}$), and a second SWA ($\alpha_{0b}$); the second dense structure feature ($F_{61}$) comprising a top CD ($w_{1a}$), a bottom CD ($w_{1b}$), a first SWA ($\alpha_{1a}$), and a second SWA ($\alpha_{1b}$); the third dense structure feature ($F_{62}$) comprising a top CD ($w_{2a}$), a bottom CD ($w_{2b}$), a first SWA ($\alpha_{2a}$), and a second SWA ($\alpha_{2b}$); the fourth dense structure feature ($F_{63}$) comprising a top CD ($w_{3a}$), a bottom CD ($w_{3b}$), a first SWA ($\alpha_{3a}$), and a second SWA ($\alpha_{3b}$); the fifth dense structure feature ($F_{64}$) comprising a top CD ($w_{4a}$), a bottom CD ($w_{4b}$), a first SWA ($\alpha_{4a}$), and a second SWA ($\alpha_{4b}$); the first isolated structure feature ($F_{65}$) comprising a top CD ($w_{5a}$), a bottom CD ($w_{5b}$), a first SWA ($\alpha_{5a}$), and a second SWA ($\alpha_{5b}$); the sixth dense structure feature ($F_{66}$) comprising a top CD ($w_{6a}$), a bottom CD ($w_{6b}$), a first SWA ($\alpha_{6a}$), and a second SWA ($\alpha_{6b}$); the seventh dense structure feature ($F_{67}$) comprising a top CD ($w_{7a}$), a bottom CD ($w_{7b}$), a first SWA ($\alpha_{7a}$), and a second SWA ($\alpha_{7b}$); the eighth dense structure feature ($F_{68}$) comprising a top CD ($w_{8a}$), a bottom CD ($w_{8b}$), a first SWA ($\alpha_{8a}$), and a second SWA ($\alpha_{8b}$); the ninth dense structure feature ($F_{69}$) comprising a top CD ($w_{9a}$), a bottom CD ($w_{9b}$), a first SWA ($\alpha_{9a}$), and a second SWA ($\alpha_{9b}$); and the tenth dense structure feature ($F_{70}$) comprising a top CD ($w_{10a}$), a bottom CD ($w_{10b}$), a first SWA ($\alpha_{10a}$), and a second SWA ($\alpha_{10b}$).

19. The method of claim 18, wherein the top CD ($w_{0a}$) ranges from 5 nm to 200 nm, and the bottom CD ($w_{0b}$) ranges from 10 nm to 250 nm; the top CD ($w_{1a}$) ranges from 5 nm to 200 nm, and the bottom CD ($w_{1b}$) ranges from 10 nm to 250 nm; the top CD ($w_{2a}$) ranges from 5 nm to 200 nm, and the bottom CD ($w_{2b}$) ranges from 10 nm to 250 nm; the top CD ($w_{3a}$) ranges from 5 nm to 200 nm, and the bottom CD ($w_{3b}$) ranges from 10 nm to 250 nm; the top CD ($w_{4a}$) ranges from 5 nm to 200 nm, and the bottom CD ($w_{4b}$) ranges from 10 nm to 250 nm; the top CD ($w_{5a}$) ranges from 50 nm to 1000 nm, and the bottom CD ($w_{5b}$) ranges from 50 nm to 1100 nm; the top CD ($w_{6a}$) ranges from 5 nm to 200 nm, and the bottom CD ($w_{6b}$) ranges from 10 nm to 250 nm; the top CD ($w_{7a}$) ranges from 5 nm to 200 nm, and the bottom CD ($w_{7b}$) ranges from 10 nm to 250 nm; the top CD ($w_{8a}$) ranges from 5 nm to 200 nm, and the bottom CD ($w_{8b}$) ranges from 10 nm to 250 nm; the top CD ($w_{9a}$) ranges from 5 nm to 200 nm, and the bottom CD ($w_{9b}$) ranges from 10 nm to 250 nm; and the top CD ($w_{10a}$) ranges from 5 nm to 200 nm, and the bottom CD ($w_{10b}$) ranges from 10 nm to 250 nm; and the first SWA ($m_{10b}$) ranging from 80 degrees to 99 degrees, and the second SWA ($\alpha_{0b}$) ranging from 88 degrees to 92 degrees; the first SWA ($\alpha_{1a}$) ranging from 85 degrees to 95 degrees, and the second SWA ($\alpha_{1b}$) ranging from 85 degrees to 95 degrees; the first SWA ($\alpha_{1a}$) ranging from 85 degrees to 95 degrees, and the second SWA ($\alpha_{2b}$) ranging from 85 degrees to 95 degrees; the first SWA ($\alpha_{3a}$) ranging from 85 degrees to 95 degrees, and the second SWA ($\alpha_{3b}$) ranging from 85 degrees to 95 degrees; the first SWA ($\alpha_{4a}$) ranging from 85 degrees to 95 degrees, and the second SWA ($\alpha_{0b}$) ranging from 85 degrees to 95 degrees; the first SWA ($\alpha_{5a}$) ranging from 85 degrees to 95 degrees, and the second SWA ($\alpha_{5b}$) ranging from 85 degrees to 95 degrees; the first SWA ($\alpha_{ha}$) ranging from 85 degrees to 95 degrees, and the second SWA ($\alpha_{6b}$) ranging from 85 degrees to 95 degrees; the first SWA ($\alpha_{7a}$) ranging from 85 degrees to 95 degrees, and the second SWA ($\alpha_{7b}$) ranging from 85 degrees to 95 degrees; the first SWA ($\alpha_{8a}$) ranging from 85 degrees to 95 degrees, and the second SWA ($\alpha_{8b}$) ranging from 85 degrees to 95 degrees; and the first SWA ($\alpha_{9a}$) ranging from 80 degrees to 99 degrees, the second SWA ($\alpha_{9b}$) ranging from 80 degrees to 99 degrees; and the first SWA ($\alpha_{1oa}$) ranging from 80 degrees to 99 degrees, and the second SWA ($\alpha_{uk}$) ranging from 80 degrees to 99 degrees.

20. The method of claim 17, wherein a thickness ($t_{60}$) of the first dense structure feature ($F_{60}$) ranges from 10 nm to 150 nm; a thickness ($t_{61}$) of the second dense structure feature ($F_{61}$) ranges from 10 nm to 150 nm; a thickness ($t_{62}$) of the third dense structure feature ($F_{62}$) ranges from 10 nm to 150 nm; a thickness ($t_{63}$) of the fourth dense structure feature ($F_{63}$) ranges from 10 nm to 150 nm; a thickness ($t_{64}$) of the fourth dense structure feature ($F_{64}$) ranges from 10 nm to 150 nm; a thickness ($t_{65}$) of the first isolated structure feature ($F_{65}$) ranges from 10 nm to 150 nm; a thickness ($t_{66}$) of the sixth dense structure feature ($F_{66}$) ranges from 10 nm to 150 nm; a thickness ($t_{67}$) of the seventh dense structure feature ($F_{67}$) ranges from 10 nm to 150 nm; a thickness ($t_{68}$) of the eighth dense structure feature ($F_{68}$) ranges from 10 nm to 150 nm; a thickness ($t_{69}$) of the ninth dense structure feature ($F_{69}$) ranges from 10 nm to 150 nm; and a thickness ($t_{70}$) of the tenth dense structure feature ($F_{70}$) ranges from 10 nm to 150 nm.

21. The method of claim 17, wherein the neural network model comprises a neural network having at least three sets of input parameters, a plurality of hidden nodes, and at least three output parameters, wherein a first set of input parameters are associated with a first group of features ($F_{60}$-$F_{70}$) in the first developed M-PST pattern, a second set of input parameters are associated with a second group of features ($F_{60}$-$F_{70}$), and a third set of input parameters can be associated with a third group of features ($F_{60}$-$F_{70}$), the first set of input parameters comprising top critical dimension (CD) data, bottom CD data, and thickness data for at least one of the first group of features ($F_{60}$-$F_{70}$), the second set of input parameters comprising top CD data, bottom CD data, and thickness data for at least one of the second group of features ($F_{60}$-$F_{70}$), and the third set of input parameters comprising top CD data, bottom CD data, and thickness data for at least one of the third group of features ($F_{60}$-$F_{70}$), wherein the output parameters comprise exposure focus data, exposure dose data, Post Exposure Bake temperature data, exposure dose variation data, exposure focus variation data, or post exposure bake (PEB) temperature variation data, or any combination thereof.

* * * * *